United States Patent
Osato et al.

(10) Patent No.: US 10,935,835 B2
(45) Date of Patent: Mar. 2, 2021

(54) OPTICALLY ANISOTROPIC LAMINATE, POLARIZING PLATE, AND IMAGE DISPLAY DEVICE

(71) Applicant: ZEON CORPORATION, Tokyo (JP)

(72) Inventors: Kazuhiro Osato, Tokyo (JP); Masashi Aimatsu, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 124 days.

(21) Appl. No.: 16/321,574

(22) PCT Filed: Aug. 2, 2017

(86) PCT No.: PCT/JP2017/028126
§ 371 (c)(1),
(2) Date: Jan. 29, 2019

(87) PCT Pub. No.: WO2018/030244
PCT Pub. Date: Feb. 15, 2018

(65) Prior Publication Data
US 2020/0012147 A1    Jan. 9, 2020

(30) Foreign Application Priority Data
Aug. 8, 2016 (JP) .............................. JP2016-155879

(51) Int. Cl.
*G02F 1/1335* (2006.01)
*G02F 1/1337* (2006.01)
(Continued)

(52) U.S. Cl.
CPC ...... *G02F 1/133528* (2013.01); *G02F 1/1339* (2013.01); *G02F 1/133711* (2013.01);
(Continued)

(58) Field of Classification Search
CPC ......... G02F 1/133528; G02F 1/133711; G02F 1/1339; G02F 2001/13706; G02F 1/1335;
(Continued)

(56) References Cited

U.S. PATENT DOCUMENTS 9,207,360 B2    12/2015    Sakamoto et al.
9,529,130 B2    12/2016    Hatanaka et al.
(Continued)

FOREIGN PATENT DOCUMENTS

JP    H09127885 A    5/1997
JP    2002321302 A    11/2002
(Continued)

OTHER PUBLICATIONS

Feb. 12, 2019, International Preliminary Report on Patentability issued in the International Patent Application No. PCT/JP2017/028126.
(Continued)

*Primary Examiner* — Anthony J Frost
(74) *Attorney, Agent, or Firm* — Kenja IP Law PC

(57) ABSTRACT

An optically anisotropic layered body including a first optically anisotropic layer and a second optically anisotropic layer, wherein each of refractive indices of the second optically anisotropic layer, in-plane retardations of the first optically anisotropic layer, thickness direction retardations of the second optically anisotropic layer, in-plane retardations of the optically anisotropic layered body, NZ factors of the optically anisotropic layered body, and thickness direction retardations Rth of the optically anisotropic layered body satisfies specific relationships.

11 Claims, 2 Drawing Sheets

(51) Int. Cl.
*G02F 1/1339* (2006.01)
*G02F 1/137* (2006.01)

(52) U.S. Cl.
CPC .... *B32B 2457/206* (2013.01); *C09K 2323/00* (2020.08); *C09K 2323/03* (2020.08); *C09K 2323/06* (2020.08); *G02F 2001/13706* (2013.01)

(58) Field of Classification Search
CPC ... G02F 1/13363; G02B 1/111; G02B 5/3083; G09F 9/30; H01L 51/50; H01L 27/32; H05B 33/02; C08F 220/30; C08F 5/30; Y10T 428/10; Y10T 428/1036
See application file for complete search history.

(56) References Cited

U.S. PATENT DOCUMENTS

| | | | |
|---|---|---|---|
| 9,541,691 B2 | 1/2017 | Hatanaka et al. | |
| 9,586,917 B2 | 3/2017 | Sakamoto et al. | |
| 9,726,798 B2 | 8/2017 | Takasago et al. | |
| 10,048,416 B2 | 8/2018 | Muramatsu et al. | |
| 2005/0151904 A1* | 7/2005 | Yang | G02F 1/13363 349/117 |
| 2009/0040435 A1* | 2/2009 | Takahashi | G02B 5/3083 349/96 |
| 2014/0142266 A1* | 5/2014 | Sakamoto | C08F 122/24 526/257 |
| 2014/0205822 A1* | 7/2014 | Wang | G02B 5/3083 428/216 |
| 2015/0168624 A1* | 6/2015 | Yaginuma | G02B 5/3016 359/489.07 |
| 2016/0145363 A1 | 5/2016 | Sakamoto et al. | |
| 2016/0280672 A1 | 9/2016 | Sakamoto et al. | |

FOREIGN PATENT DOCUMENTS

| | | |
|---|---|---|
| JP | 2014169722 A | 9/2014 |
| JP | 2015106114 A | 6/2015 |
| JP | 2015163935 A | 9/2015 |
| JP | 2015163936 A | 9/2015 |
| JP | 2015200861 A | 11/2015 |
| JP | 2016053709 A | 4/2016 |
| WO | 2012147904 A1 | 11/2012 |
| WO | 2014010325 A1 | 1/2014 |

OTHER PUBLICATIONS

Carsten Tschierske et al., "Definitionen von Grundbegriffen mit Bezug zu niedermolekularen und polymeren Flüssigkristallen", Angewandte Chemie, 2004, pp. 6340-6368, vol. 116, Issue 45.

* cited by examiner

OPTICALLY ANISOTROPIC LAMINATE, POLARIZING PLATE, AND IMAGE DISPLAY DEVICE

FIELD

The present invention relates to an optically anisotropic layered body, and a polarizing plate and an image display device that each include the optically anisotropic layered body.

BACKGROUND

An image display device such as an organic electroluminescent display device (hereinafter this may be referred to as an "organic EL display device" as appropriate) includes an optically anisotropic film as an optical film. For such an optical film, various studies have been made in prior art (see Patent Literatures 1 to 6).

CITATION LIST

Patent Literature

Patent Literature 1: Japanese Patent Application Laid-Open No. 2016-053709 A
Patent Literature 2: Japanese Patent Application Laid-Open No. 2015-106114 A
Patent Literature 3: Japanese Patent Application Laid-Open No. 2015-163935 A
Patent Literature 4: Japanese Patent Application Laid-Open No. 2015-163936 A
Patent Literature 5: Japanese Patent Application Laid-Open No. 2014-169722 A
Patent Literature 6: Japanese Patent Application Laid-Open No. 2015-200861 A

SUMMARY

Technical Problem

On a display surface of an image display device, a circularly polarizing plate may be provided. The term "circularly polarizing plate" herein includes not only a circularly polarizing plate in a narrow sense but also an elliptically polarizing plate. As the circularly polarizing plate, a film obtained by bonding a linear polarizer and an optical film having optical anisotropy is usually used. As a result of providing the circularly polarizing plate on the display surface of the image display device, reflection of external light on the display surface can be suppressed when the display surface is observed in a front direction. Therefore, the visibility of an image can be enhanced.

However, in a case of a general circularly polarizing plate in prior art provided on the display surface of the image display device, suppression of external light reflection on the display surface was not easily achieved when the display surface is observed in a tilt direction. Specifically, when the display surface is observed in a tilt direction, light reflected on the display surface is visually recognized, and the display surface appears to be colored.

The inventor of the present invention has tried to provide a positive C film in a circularly polarizing plate. The positive C film is a film in which refractive indexes nx, ny, and nz satisfy $nz > nx \geq ny$. It was expected that, when the display surface is observed in a tilt direction, the provision of the positive C film provided in the circularly polarizing plate would suppress reflection of external light on the display surface and coloring of the display surface would thereby be suppressed.

By the provision of the positive C film in the circularly polarizing plate, coloring of the display surface when the display surface is observed in a tilt direction was largely decreased. However, the inventor has further investigated, and found that even when the positive C film is provided in the circularly polarizing plate, light is slightly reflected on the display surface observed in a tilt direction, and the coloring of the display surface may be observed. In particular, the color difference $\Delta E^*ab$ between the chromaticity measured when the display surface is observed in a tilt direction and the chromaticity of a black display surface in which reflection does not occur is not sufficiently decreased.

The present invention has been made in view of the problems described above. An object of the present invention is to provide an optically anisotropic layered body and a polarizing plate that can achieve an image display device capable of suppressing reflection of external light and effectively suppressing coloring when the display surface is observed in a tilt direction; and an image display device capable of suppressing reflection of external light and effectively suppressing coloring when the display surface is observed in a tilt direction.

Solution to Problem

The inventor has intensively studied to solve the aforementioned problems. As a result, the inventor has found that, when optically anisotropic layering that includes a combination of a first optically anisotropic layer and a second optically anisotropic layer having specific refractive index anisotropy, has a specific retardation, and exhibits a specific NZ factor with reverse wavelength distribution is used, the aforementioned problems can be solved. Thus, the present invention has been completed.

Specifically, the present invention includes as follows.
<1> An optically anisotropic layered body comprising a first optically anisotropic layer and a second optically anisotropic layer, wherein
a refractive index nx2 in a direction which gives a maximum refractive index among in-plane directions of the second optically anisotropic layer, a refractive index ny2 in a direction, among the in-plane directions of the second optically anisotropic layer, perpendicular to the direction giving the nx2, and a thickness direction refractive index nz2 of the second optically anisotropic layer satisfy the formula (1),
an in-plane retardation Re1(450) of the first optically anisotropic layer at a wavelength of 450 nm, an in-plane retardation Re1(550) of the first optically anisotropic layer at a wavelength of 550 nm, and an in-plane retardation Re1(650) of the first optically anisotropic layer at a wavelength of 650 nm satisfy the formula (2),
a thickness direction retardation Rth2(450) of the second optically anisotropic layer at the wavelength of 450 nm, a thickness direction retardation Rth2(550) of the second optically anisotropic layer at the wavelength of 550 nm, and a thickness direction retardation Rth2(650) of the second optically anisotropic layer at the wavelength of 650 nm satisfy the formula (3),
an in-plane retardation Re0(550) of the optically anisotropic layered body at the wavelength of 550 nm satisfies the formula (4),
a ratio Nz(450)/Nz(650) of an NZ factor Nz(450) of the optically anisotropic layered body at the wavelength of 450 nm relative to an NZ factor Nz(650) of the optically anisotropic layered body at the wavelength of 650 nm satisfies the formula (5), and a thickness direction retardation Rth0(550) of the optically anisotropic layered body at the wavelength of 550 nm satisfies the formula (6):

$$nz2 > nx2 \geq ny2 \quad \text{Formula (1)},$$

$$Re1(450) < Re1(550) < Re1(650) \quad \text{Formula (2)},$$

$$Rth2(450) < Rth2(550) \leq Rth2(650) \quad \text{Formula (3)},$$

$$137 \text{ nm} < Re0(550) < 152 \text{ nm} \quad \text{Formula (4)},$$

$$0.75 < Nz(450)/Nz(650) \leq 0.845 \quad \text{Formula (5), and}$$

$$-2 \text{ nm} < Rth0(550) < 14 \text{ nm} \quad \text{Formula (6)}.$$

<2> An optically anisotropic layered body comprising a first optically anisotropic layer and a second optically anisotropic layer, wherein a refractive index nx2 in a direction which gives a maximum refractive index among in-plane directions of the second optically anisotropic layer, a refractive index ny2 in a direction, among the in-plane directions of the second optically anisotropic layer, perpendicular to the direction giving the nx2, and a thickness direction refractive index nz2 of the second optically anisotropic layer satisfy the formula (7), an in-plane retardation Re1(450) of the first optically anisotropic layer at a wavelength of 450 nm, an in-plane retardation Re1(550) of the first optically anisotropic layer at a wavelength of 550 nm, and an in-plane retardation Re1(650) of the first optically anisotropic layer at a wavelength of 650 nm satisfy the formula (8), a thickness direction retardation Rth2(450) of the second optically anisotropic layer at the wavelength of 450 nm, a thickness direction retardation Rth2(550) of the second optically anisotropic layer at the wavelength of 550 nm, and a thickness direction retardation Rth2(650) of the second optically anisotropic layer at the wavelength of 650 nm satisfy the formula (9), an in-plane retardation Re0(550) of the optically anisotropic layered body at the wavelength of 550 nm satisfies the formula (10), a ratio Nz(450)/Nz(650) of an NZ factor Nz(450) of the optically anisotropic layered body at the wavelength of 450 nm relative to an NZ factor Nz(650) of the optically anisotropic layered body at the wavelength of 650 nm satisfies the formula (11), and a thickness direction retardation Rth0(550) of the optically anisotropic layered body at the wavelength of 550 nm satisfies the formula (12):

$$nz2 > nx2 \geq ny2 \quad \text{Formula (7)},$$

$$Re1(450) < Re1(550) < Re1(650) \quad \text{Formula (8)},$$

$$Rth2(450) < Rth2(550) < Rth2(650) \quad \text{Formula (9)},$$

$$137 \text{ nm} < Re0(550) < 152 \text{ nm} \quad \text{Formula (10)},$$

$$0.845 < Nz(450)/Nz(650) \leq 0.915 \quad \text{Formula (11), and}$$

$$-9 \text{ nm} < Rth0(550) < 26 \text{ nm} \quad \text{Formula (12)}.$$

<3> An optically anisotropic layered body comprising a first optically anisotropic layer and a second optically anisotropic layer, wherein a refractive index nx2 in a direction which gives a maximum refractive index among in-plane directions of the second optically anisotropic layer, a refractive index ny2 in a direction, among the in-plane directions of the second optically anisotropic layer, perpendicular to the direction giving the nx2, and a thickness direction refractive index nz2 of the second optically anisotropic layer satisfy the formula (13), an in-plane retardation Re1(450) of the first optically anisotropic layer at a wavelength of 450 nm, an in-plane retardation Re1(550) of the first optically anisotropic layer at a wavelength of 550 nm, and an in-plane retardation Re1(650) of the first optically anisotropic layer at a wavelength of 650 nm satisfy the formula (14), a thickness direction retardation Rth2(450) of the second optically anisotropic layer at the wavelength of 450 nm, a thickness direction retardation Rth2(550) of the second optically anisotropic layer at the wavelength of 550 nm, and a thickness direction retardation Rth2(650) of the second optically anisotropic layer at the wavelength of 650 nm satisfy the formula (15), an in-plane retardation Re0(550) of the optically anisotropic layered body at the wavelength of 550 nm satisfies the formula (16), a ratio Nz(450)/Nz(650) of an NZ factor Nz(450) of the optically anisotropic layered body at the wavelength of 450 nm relative to an NZ factor Nz(650) of the optically anisotropic layered body at the wavelength of 650 nm satisfies the formula (17), and a thickness direction retardation Rth0(550) of the optically anisotropic layered body at the wavelength of 550 nm satisfies the formula (18):

$$nz2 > nx2 \geq ny2 \quad \text{Formula (13)},$$

$$Re1(450) < Re1(550) < Re1(650) \quad \text{Formula (14)},$$

$$Rth2(450) < Rth2(550) < Rth2(650) \quad \text{Formula (15)},$$

$$137 \text{ nm} < Re0(550) < 152 \text{ nm} \quad \text{Formula (16)},$$

$$0.915 < Nz(450)/Nz(650) \leq 0.97 \quad \text{Formula (17), and}$$

$$-11 \text{ nm} < Rth0(550) < 27 \text{ nm} \quad \text{Formula (18)}.$$

<4> The optically anisotropic layered body according to <2>, wherein the ratio Nz(450)/Nz(650) of the optically anisotropic layered body satisfies the formula (19), and the thickness direction retardation Rth0(550) of the optically anisotropic layered body at the wavelength of 550 nm satisfies the formula (20):

$$0.89 < Nz(450)/Nz(650) \leq 0.91 \quad \text{Formula (19), and}$$

$$4 \text{ nm} < Rth0(550) < 10 \text{ nm} \quad \text{Formula (20)}.$$

<5> The optically anisotropic layered body according to <3>, wherein the ratio Nz(450)/Nz(650) of the optically anisotropic layered body satisfies the formula (21), and the thickness direction retardation Rth0(550) of the optically anisotropic layered body at the wavelength of 550 nm satisfies the formula (22):

$0.94 < Nz(450)/Nz(650) \leq 0.96$     Formula (21), and $4 \text{ nm} < Rth0(550) < 12 \text{ nm}$     Formula (22).

<6> The optically anisotropic layered body according to any one of <1> to <5>, wherein the second optically anisotropic layer includes a polymer and a compound having a mesogen skeleton that may have a fixed orientation state, when a film of the polymer is formed by a coating method using a solution of the polymer, a refractive index nx(P) in a direction which gives a maximum refractive index among in-plane directions of the film, a refractive index ny(P) in a direction, among the in-plane directions of the film, perpendicular to the direction giving the nx(P), and a thickness direction refractive index nz(P) of the film satisfy nz(P)>nx(P)≥ny(P), the compound having the mesogen skeleton is a compound of at least one type selected from the group consisting of a first compound that exhibits liquid crystal properties, and exhibits an in-plane retardation with reverse wavelength distribution when the compound is homogeneously oriented; and a second compound that does not solely exhibit liquid crystal properties, a mixture exhibits liquid crystal properties, and the second compound exhibits an in-plane retardation with reverse wavelength distribution when the mixture is homogeneously oriented, the mixture being obtained by mixing, in an evaluator liquid crystal compound that exhibits an in-plane retardation with forward wavelength distribution when it is homogeneously oriented, the second compound at at least one of ratios in a range of 30 parts by weight to 70 parts by weight relative to 100 parts by weight of the total of the evaluator liquid crystal compound and the second compound, and the thickness direction retardation Rth2(450) of the second optically anisotropic layer at the wavelength of 450 nm, the thickness direction retardation Rth2(550) of the second optically anisotropic layer at the wavelength of 550 nm, and the thickness direction retardation Rth2(650) of the second optically anisotropic layer at the wavelength of 650 nm satisfy the formulas (23) and (24):

$0.50 < Rth2(450)/Rth2(550) < 1.00$     Formula (23), and $1.00 \leq Rth2(650)/Rth2(550) < 1.25$     Formula (24).

<7> The optically anisotropic layered body according to <6>, wherein the compound having the mesogen skeleton contains a main chain mesogen skeleton and a side chain mesogen skeleton bonded to the main chain mesogen skeleton in a molecule of the compound having the mesogen skeleton.

<8> The optically anisotropic layered body according to <6> or <7>, wherein the compound having the mesogen skeleton is represented by the following formula (I):

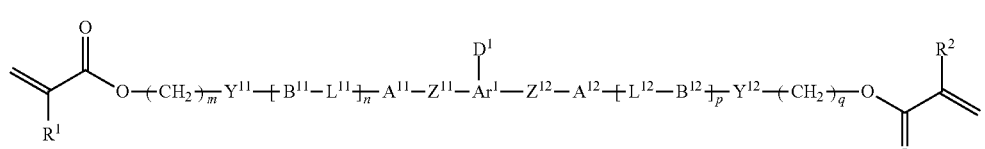

[In the formula (I),

Ar$^1$ represents a divalent aromatic hydrocarbon ring group having D$^1$ as a substituent, or a divalent aromatic heterocyclic ring group having D$^1$ as a substituent, D$^1$ represents an organic group of 1 to 20 carbon atoms having at least one aromatic ring selected from the group consisting of an aromatic hydrocarbon ring and an aromatic heterocyclic ring, Z$^{11}$ and Z$^{12}$ each independently represent —CO—O—, —O—CO—, —NR$^{31}$—CO—, or —CO—NR$^{32}$—, R$^{31}$ and R$^{32}$ each independently represent a hydrogen atom or an alkyl group of 1 to 6 carbon atoms, A$^{11}$, A$^{12}$, B$^{11}$, and B$^{12}$ each independently represent a cyclic aliphatic group optionally having a substituent, or an aromatic group optionally having a substituent, Y$^{11}$, Y$^{12}$, L$^{11}$, and L$^{12}$ each independently represent a single bond, —O—, —CO—, —CO—O—, —O—CO—, —NR$^{21}$—CO—, —CO—NR$^{22}$—, —O—CO—O—, —NR$^{23}$—CO—O—, —O—CO—NR$^{24}$—, or —NR$^{25}$—CO—NR$^{26}$—, and R$^{21}$ to R$^{26}$ each independently represent a hydrogen atom or an alkyl group of 1 to 6 carbon atoms, R$^1$ and R$^2$ each independently represent a hydrogen atom, a methyl group or a chlorine atom, m and q each independently represent an integer of 1 to 20, and n and p each independently represent 0 or 1].

<9> The optically anisotropic layered body according to <8>, wherein the Ar$^1$-D$^1$ is a group represented by the following formula (II):

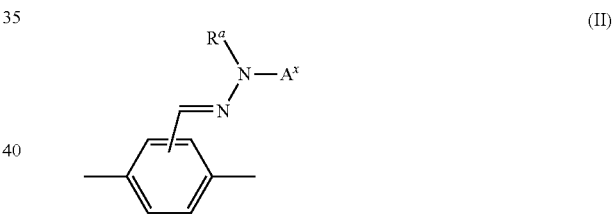

[In the formula (II),

A$^x$ represents an organic group of 2 to 20 carbon atoms having at least one aromatic ring selected from the group consisting of an aromatic hydrocarbon ring and an aromatic heterocyclic ring, and R$^a$ represents a hydrogen atom or an organic group of 1 to 20 carbon atoms optionally having a substituent].

<10> The optically anisotropic layered body according to <9>, wherein the A$^x$ is a group represented by the following formula (III):

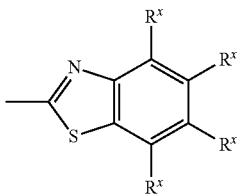

(III)

[In the formula (III), $R^X$ represents a hydrogen atom, a halogen atom, an alkyl group of 1 to 6 carbon atoms, a cyano group, a nitro group, a fluoroalkyl group of 1 to 6 carbon atoms, an alkoxy group of 1 to 6 carbon atoms, or —C(=O)—O—$R^b$, and $R^b$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms optionally having a substituent, a plurality of $R^X$'s may all be the same as or different from each other, and at least one C—$R^X$ constituting the ring may be replaced with a nitrogen atom].

<11> The optically anisotropic layered body according to <9> or <10>, wherein the $R^a$ is an alkyl group of 1 to 20 carbon atoms optionally having a substituent, an alkenyl group of 2 to 20 carbon atoms optionally having a substituent, an alkynyl group of 2 to 20 carbon atoms optionally having a substituent, or an aromatic group of 6 to 18 carbon atoms optionally having a substituent.

<12> The optically anisotropic layered body according to any one of <6> to <11>, wherein the polymer is at least one polymer selected from the group consisting of polyvinyl carbazole and esters of polyfumaric acid.

<13> The optically anisotropic layered body according to any one of <6> to <12>, wherein a ratio of the compound having the mesogen skeleton in a total solid content of the second optically anisotropic layer is 20% by weight to 60% by weight.

<14> A polarizing plate comprising a linear polarizer, and the optically anisotropic layered body according to any one of <1> to <13>.

<15> An image display device comprising the polarizing plate according to <14>, and an organic electroluminescent element, wherein the image display device includes the linear polarizer, the optically anisotropic layered body, and the organic electroluminescent element in this order.

Advantageous Effects of Invention

According to the present invention, there can be provided an optically anisotropic layered body and a polarizing plate that can achieve an image display device capable of suppressing reflection of external light and effectively suppressing coloring when the display surface is observed in a tilt direction; and an image display device capable of suppressing reflection of external light and effectively suppressing coloring when the display surface is observed in a tilt direction.

DESCRIPTION OF EMBODIMENTS

Figure 1:
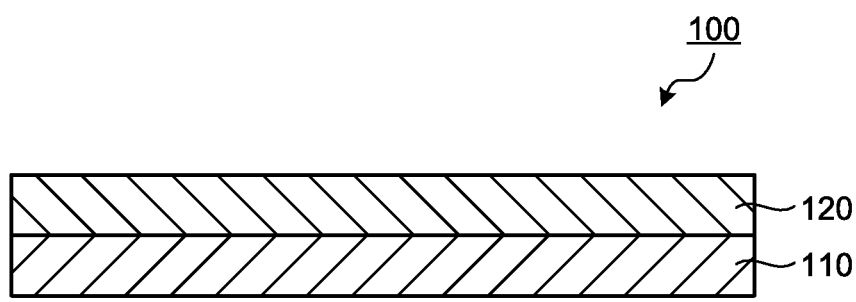
FIG. 1 is a cross-sectional view schematically illustrating a cross section of an optically anisotropic layered body as a first embodiment of the present invention.

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, a "long-length" film refers to a film with the length that is 5 times or more the width, and preferably a film with the length that is 10 times or more the width, and specifically refers to a film having a length that allows the film to be wound up into a rolled shape for storage or transportation. The upper limit of the length of the long-length film is not particularly limited, and is 100,000 times or less the width, for example.

In the following description, an in-plane retardation Re of a film is a value represented by Re=(nx−ny)×d, unless otherwise specified. A thickness direction retardation Rth of a film is a value represented by Rth={(nx+ny)/2−nz}, unless otherwise specified. An NZ factor of a film is a value represented by (nx−nz)/(nx−ny) and may be calculated by 0.5+Rth/Re, unless otherwise specified. Herein, nx represents a refractive index in a direction which gives the maximum refractive index among directions perpendicular to the thickness direction of the film (in-plane directions), ny represents a refractive index in a direction, among the above-mentioned in-plane directions of the film, orthogonal to the direction giving nx, nz represents a thickness direction refractive index of the film, and d represents the thickness of the film.

In the following description, the measurement wavelength of the refractive index is 550 nm, unless otherwise specified.

In the following description, a slow axis of a film represents a slow axis in a plane of the film, unless otherwise specified.

In the following description, an oblique direction of a long-length film is an in-plane direction of the film that is neither parallel nor perpendicular to the widthwise direction of the film, unless otherwise specified.

In the following description, a front direction of a certain surface means a normal direction of the surface, and specifically refers to a direction of a polar angle of 0° and an azimuth angle of 0° of the surface, unless otherwise specified.

In the following description, a tilt direction of a certain surface means a direction that is neither parallel nor perpendicular to the surface, and specifically refers to a direction in which the polar angle of the surface is in a range of greater than 0° and smaller than 90°, unless otherwise specified.

In the following description, a direction of an element being "parallel", "perpendicular", and "orthogonal" may allow an error within the range of not impairing the advantageous effects of the present invention, for example, within a range of ±5°, unless otherwise specified.

In the following description, "substrate", and "polarizing plate" include not only a rigid member but also a flexible member such as a resin film, unless otherwise specified.

In the following description, an angle formed by an optical axis (polarized light absorption axis, polarized light transmission axis, slow axis, etc.) of each layer in a member including a plurality of layers represents an angle when the film is observed in the thickness direction thereof, unless otherwise specified.

In the following description, a resin having a positive intrinsic birefringence value means a resin in which a refractive index in the stretched direction is larger than that in the direction orthogonal thereto, unless otherwise specified. A resin having a negative intrinsic birefringence value means a resin in which a refractive index in the stretched direction is smaller than that in the direction orthogonal thereto, unless otherwise specified. An intrinsic birefringence value may be calculated from a dielectric constant distribution.

[1. Summary of Optically Anisotropic Layered Body]

FIG. 1 is a cross-sectional view schematically illustrating a cross section of an optically anisotropic layered body 100 as a first embodiment of the present invention.

As illustrated in FIG. 1, the optically anisotropic layered body 100 includes a first optically anisotropic layer 110 and a second optically anisotropic layer 120. The optically anisotropic layered body 100, the first optically anisotropic layer 110, and the second optically anisotropic layer 120 satisfy a specific requirement relating to optical properties by any one of the following first to third combinations. The optically anisotropic layered body 100 may have an optional layer (not illustrated) if necessary.

[2. First Combination of Optical Properties]

In the first combination, a refractive index $nx2$ in a direction which gives the maximum refractive index among in-plane directions of the second optically anisotropic layer, a refractive index $ny2$ in a direction, among the in-plane directions of the second optically anisotropic layer, perpendicular to the direction giving the $nx2$, a thickness direction refractive index $nz2$ of the second optically anisotropic layer, an in-plane retardation $Re1(450)$ of the first optically anisotropic layer at a wavelength of 450 nm, an in-plane retardation $Re1(550)$ of the first optically anisotropic layer at a wavelength of 550 nm, an in-plane retardation $Re1(650)$ of the first optically anisotropic layer at a wavelength of 650 nm, a thickness direction retardation $Rth2(450)$ of the second optically anisotropic layer at the wavelength of 450 nm, a thickness direction retardation $Rth2(550)$ of the second optically anisotropic layer at the wavelength of 550 nm, a thickness direction retardation $Rth2(650)$ of the second optically anisotropic layer at the wavelength of 650 nm, an in-plane retardation $Re0(550)$ of the optically anisotropic layered body at the wavelength of 550 nm, an NZ factor $Nz(450)$ of the optically anisotropic layered body at the wavelength of 450 nm, an NZ factor $Nz(650)$ of the optically anisotropic layered body at the wavelength of 650 nm, and a thickness direction retardation $Rth0(550)$ of the optically anisotropic layered body at the wavelength of 550 nm satisfy the following formulas (1) to (6):

$$nz2 > nx2 \geq ny2 \quad \text{Formula (1)},$$

$$Re1(450) < Re1(550) < Re1(650) \quad \text{Formula (2)},$$

$$Rth2(450) < Rth2(550) \leq Rth2(650) \quad \text{Formula (3)},$$

$$137 \text{ nm} < Re0(550) < 152 \text{ nm} \quad \text{Formula (4)},$$

$$0.75 < Nz(450)/Nz(650) \leq 0.845 \quad \text{Formula (5), and}$$

$$-2 \text{ nm} < Rth0(550) < 14 \text{ nm} \quad \text{Formula (6)},$$

By providing a circularly polarizing plate obtained by combining an optically anisotropic layered body having optical properties satisfying the above-described formulas (1) to (6) with a linear polarizer in the image display device, when a display surface of the image display device is observed in a tilt direction, reflection of external light can be suppressed to effectively suppress coloring.

Regarding the formula (1), the relationship among the refractive indices $nx2$, $ny2$, and $nz2$ of the second optically anisotropic layer will be described in detail. The formula (1) indicates that the second optically anisotropic layer is a layer that can function as a positive C plate. In this case, it is preferable that the refractive index $nx2$ and the refractive index $ny2$ have the same value or are close to each other. Therefore, it is preferable that the refractive indices $nx2$, $ny2$, and $nz2$ of the second optically anisotropic layer satisfy the relationship of $nz2 > nx2 \approx ny2$. Specifically, the difference $nx2-ny2$ between the refractive index $nx2$ and the refractive index $ny2$ is preferably 0.00000 to 0.00100, more preferably 0.00000 to 0.00050, and particularly preferably 0.00000 to 0.00020. When the refractive index difference $nx2-ny2$ falls within the aforementioned range, it is possible to achieve a circularly polarizing plate that can effectively suppress coloring due to reflected light when the display surface is observed in a tilt direction.

Regarding the formula (2), the relationship among the in-plane retardation $Re1(450)$ of the first optically anisotropic layer at the wavelength of 450 nm, the in-plane retardation $Re1(550)$ of the first optically anisotropic layer at the wavelength of 550 nm, and the in-plane retardation $Re1(650)$ of the first optically anisotropic layer at the wavelength of 650 nm will be described in detail. The first optically anisotropic layer is a layer having refractive index anisotropy in a plane thereof and therefore has an in-plane retardation larger than 0 nm. As represented by the formula (2), the in-plane retardation of the first optically anisotropic layer exhibits reverse wavelength distribution. When the in-plane retardation of the first optically anisotropic layer exhibits reverse wavelength distribution, it is possible to uniformly convert the polarization state of light in a wide wavelength range that passes through the first optically anisotropic layer in a tilt direction. Therefore, since the circularly polarizing plate having the optically anisotropic layered body including such a first optically anisotropic layer can uniformly suppress the reflection of external light over a wide wavelength range, coloring of the display surface can be suppressed.

Regarding the formula (3), the relationship among the thickness direction retardation $Rth2(450)$ of the second optically anisotropic layer at the wavelength of 450 nm, the thickness direction retardation $Rth2(550)$ of the second optically anisotropic layer at the wavelength of 550 nm, and the thickness direction retardation $Rth2(650)$ of the second optically anisotropic layer at the wavelength of 650 nm will be described in detail. As represented by the formula (3), the thickness direction retardation of the second optically anisotropic layer exhibits reverse wavelength distribution. When the thickness direction retardation of the second optically anisotropic layer exhibits reverse wavelength distribution, it is possible to uniformly convert the polarization state of light in a wide wavelength range that passes through the second optically anisotropic layer in a tilt direction. Therefore, since the circularly polarizing plate having the optically anisotropic layered body including such a second optically anisotropic layer can uniformly suppress the reflection of external light over a wide wavelength range, coloring of the display surface can be suppressed.

In particular, it is preferable that the thickness direction retardations Rth2(450), Rth2(550), and Rth2(650) of the second optically anisotropic layer satisfy the following formulas (23) and (24).

$$0.50 < Rth2(450)/Rth2(550) < 1.00 \quad \text{Formula (23)}$$

$$1.00 \leq Rth2(650)/Rth2(550) < 1.25 \quad \text{Formula (24)}$$

In detail, the ratio Rth2(450)/Rth2(550) is preferably more than 0.50, more preferably more than 0.6, and particularly preferably more than 0.7, and is preferably less than 1.00. Rth2(650)/Rth2(550) is preferably 1.00 or more, and is preferably 1.25 or less, more preferably 1.22 or less, and particularly preferably 1.19 or less. This makes it possible to particularly effectively achieve suppression of reflection of external light and suppression of coloring of the display surface in a tilt direction of the display surface.

Regarding the formula (4), the in-plane retardation Re0 (550) of the optically anisotropic layered body at the wavelength of 550 nm will be described in detail. The in-plane retardation Re0(550) of the optically anisotropic layered body is usually more than 137 nm, preferably more than 138 nm, and more preferably more than 139 nm, and is usually less than 152 nm, preferably less than 151 nm, and more preferably less than 150 nm. When the in-plane retardation Re0(550) of the optically anisotropic layered body at the wavelength of 550 nm falls within such a range, a circularly polarizing plate can be obtained by combining the optically anisotropic layered body with a linear polarizer. With this circularly polarizing plate, reflection of external light and coloring of the display surface in a tilt direction of the display surface can be suppressed.

Regarding the formula (5), the ratio Nz(450)/Nz(650) of the NZ factor Nz(450) of the optically anisotropic layered body at the wavelength of 450 nm relative to the NZ factor Nz(650) of the optically anisotropic layered body at the wavelength of 650 nm will be described in detail. The ratio Nz(450)/Nz(650) of the NZ factor is usually more than 0.75, preferably more than 0.78, and more preferably more than 0.81, and is usually 0.845 or less. When the ratio Nz(450)/Nz(650) of the NZ factor of the optically anisotropic layered body falls within such a range, reflection of external light and coloring of the display surface in a tilt direction of the display surface can be suppressed by the circularly polarizing plate having the optically anisotropic layered body.

Regarding the formula (6), the thickness direction retardation Rth0(550) of the optically anisotropic layered body at the wavelength of 550 nm will be described in detail. The thickness direction retardation Rth0(550) of the optically anisotropic layered body is usually more than −2 nm, and preferably more than −1 nm, and is usually less than 14 nm, preferably less than 10 nm, and more preferably less than 5 nm. When the thickness direction retardation Rth0(550) of the optically anisotropic layered body at the wavelength of 550 nm falls within such a range, reflection of external light and coloring of the display surface in a tilt direction of the display surface can be suppressed by the circularly polarizing plate having the optically anisotropic layered body.

In the first combination of the optical properties, the in-plane retardation Re1(550) of the first optically anisotropic layer at the wavelength of 550 nm is preferably 137 nm or more, more preferably 138 nm or more, and particularly preferably 139 nm or more, and is preferably 152 nm or less, more preferably 151 nm or less, and particularly preferably 150 nm or less. When the in-plane retardation Re1(550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the first combination of the optical properties, the thickness direction retardation Rth1(550) of the first optically anisotropic layer at a wavelength of 550 nm is preferably 68.5 nm or more, more preferably 69 nm or more, and particularly preferably 69.5 nm or more, and is preferably 76 nm or less, more preferably 75.5 nm or less, and particularly preferably 75 nm or less. When the thickness direction retardation Rth1(550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the first combination of the optical properties, the in-plane retardation Re2(550) of the second optically anisotropic layer at the wavelength of 550 nm is preferably 0 nm to 10 nm, more preferably 0 nm to 5 nm, and particularly preferably 0 nm to 3 nm. When the in-plane retardation Re2(550) of the second optically anisotropic layer falls within the aforementioned range, suppression of reflection of external light and suppression of coloring of the display surface in a tilt direction of the display surface can be effectively achieved by the circularly polarizing plate having the optically anisotropic layered body including the second optically anisotropic layer.

In the first combination of the optical properties, the thickness direction retardation Rth2(550) of the second optically anisotropic layer at the wavelength of 550 nm is preferably −75 nm or more, more preferably −72 nm or more, and particularly preferably −69 nm or more, and is preferably −60 nm or less, more preferably −61 nm or less, and particularly preferably −62 nm or less. When the thickness direction retardation Rth2(550) of the second optically anisotropic layer falls within the aforementioned range, suppression of reflection of external light and suppression of coloring of the display surface in a tilt direction of the display surface can be effectively achieved by the circularly polarizing plate having the optically anisotropic layered body including the second optically anisotropic layer.

In the first combination of optical properties, the NZ factor Nz(550) of the optically anisotropic layered body at the wavelength of 550 nm is preferably 0.48 or more, more preferably 0.50 or more, and particularly preferably 0.52 or more, and is preferably 0.58 or less, and more preferably 0.57 or less. When the NZ factor Nz(550) of the optically anisotropic layered body falls within the aforementioned range, suppression of reflection of external light and suppression of coloring of the display surface in a tilt direction of the display surface can be effectively achieved by the circularly polarizing plate having the optically anisotropic layered body.

[3. Second Combination of Optical Properties]

In the second combination, the refractive index nx2 in a direction which gives the maximum refractive index among in-plane directions of the second optically anisotropic layer, the refractive index ny2 in a direction, among the in-plane directions of the second optically anisotropic layer, perpendicular to the direction giving the nx2, the thickness direction refractive index nz2 of the second optically anisotropic layer, the in-plane retardation Re1(450) of the first optically anisotropic layer at the wavelength of 450 nm, the in-plane retardation Re1(550) of the first optically anisotropic layer at the wavelength of 550 nm, the in-plane retardation Re1(650) of the first optically anisotropic layer at the wavelength of 650 nm, the thickness direction retardation Rth2(450) of the second optically anisotropic layer at the wavelength of 450 nm, the thickness direction retardation Rth2(550) of the second optically anisotropic layer at the wavelength of 550 nm, the thickness direction retardation Rth2(650) of the second optically anisotropic layer at the wavelength of 650 nm, the in-plane retardation Re0(550) of the optically anisotropic layered body at the wavelength of 550 nm, the NZ factor Nz(450) of the optically anisotropic layered body at the wavelength of 450 nm, the NZ factor Nz(650) of the optically anisotropic layered body at the wavelength of 650 nm, and the thickness direction retardation Rth0(550) of the optically anisotropic layered body at the wavelength of 550 nm satisfy the following formulas (7) to (12):

$$nz2 > nx2 \geq ny2 \qquad \text{Formula (7),}$$

$$Re1(450) < Re1(550) < Re1(650) \qquad \text{Formula (8),}$$

$$Rth2(450) < Rth2(550) < Rth2(650) \qquad \text{Formula (9),}$$

$$137\ nm < Re0(550) < 152\ nm \qquad \text{Formula (10),}$$

$$0.845 < Nz(450)/Nz(650) \geq 0.915 \qquad \text{Formula (11), and}$$

$$-9\ nm < Rth0(550) < 26\ nm \qquad \text{Formula (12).}$$

By providing a circularly polarizing plate obtained by combining an optically anisotropic layered body having optical properties satisfying the above-described formulas (7) to (12) with a linear polarizer in the image display device, when a display surface of the image display device is observed in a tilt direction, reflection of external light can be suppressed and coloring can be effectively suppressed.

Regarding the formula (7), the relationship among the refractive indices nx2, ny2, and nz2 of the second optically anisotropic layer will be described in detail. The formula (7) indicates that the second optically anisotropic layer is a layer that can function as a positive C plate. In this case, it is preferable that the refractive index nx2 and the refractive index ny2 have the same value or are close to each other. Therefore, it is preferable that the refractive indices nx2, ny2, and nz2 of the second optically anisotropic layer satisfy the relationship of nz2>nx2≈ny2. Specifically, it is preferable that the difference nx2−ny2 between the refractive index nx2 and the refractive index ny2 falls within the same range as that described in the aforementioned chapter [2. First Combination of Optical Properties]. When the refractive index difference nx2−ny2 falls within the aforementioned range, it is possible to achieve a circularly polarizing plate that can effectively suppress coloring due to reflected light when the display surface is observed in a tilt direction.

Regarding the formula (8), the relationship among the in-plane retardation Re1(450) of the first optically anisotropic layer at the wavelength of 450 nm, the in-plane retardation Re1(550) of the first optically anisotropic layer at the wavelength of 550 nm, and the in-plane retardation Re1(650) of the first optically anisotropic layer at the wavelength of 650 nm will be described in detail. The first optically anisotropic layer is a layer having refractive index anisotropy in a plane thereof and therefore has an in-plane retardation larger than 0 nm. As represented by the formula (8), the in-plane retardation of the first optically anisotropic layer exhibits reverse wavelength distribution. When the in-plane retardation of the first optically anisotropic layer exhibits reverse wavelength distribution, it is possible to uniformly convert the polarization state of light in a wide wavelength range that passes through the first optically anisotropic layer in a tilt direction. Therefore, since the circularly polarizing plate having the optically anisotropic layered body including such a first optically anisotropic layer can uniformly suppress the reflection of external light over a wide wavelength range, coloring of the display surface can be suppressed.

Regarding the formula (9), the relationship among the thickness direction retardation Rth2(450) of the second optically anisotropic layer at the wavelength of 450 nm, the thickness direction retardation Rth2(550) of the second optically anisotropic layer at the wavelength of 550 nm, and the thickness direction retardation Rth2(650) of the second optically anisotropic layer at the wavelength of 650 nm will be described in detail. As represented by the formula (9), the thickness direction retardation of the second optically anisotropic layer exhibits reverse wavelength distribution. When the thickness direction retardation of the second optically anisotropic layer exhibits reverse wavelength distribution, it is possible to uniformly convert the polarization state of light in a wide wavelength range that passes through the second optically anisotropic layer in a tilt direction. Therefore, since the circularly polarizing plate having the optically anisotropic layered body including such a second optically anisotropic layer can uniformly suppress the reflection of external light over a wide wavelength range, coloring of the display surface can be suppressed.

In particular, it is preferable that the thickness direction retardation ratios Rth2(450)/Rth2(550) and Rth2(650)/Rth2(550) of the second optically anisotropic layer fall within the same ranges as those described in the aforementioned chapter [2. First Combination of Optical Properties] (see the formula (23) and the formula (24)). This makes it possible to particularly effectively achieve suppression of reflection of external light and suppression of coloring of the display surface in a tilt direction of the display surface.

Regarding the formula (10), the in-plane retardation Re0(550) of the optically anisotropic layered body at the wavelength of 550 nm will be described in detail. The in-plane retardation Re0(550) of the optically anisotropic layered body is usually more than 137 nm, preferably more than 138 nm, and more preferably more than 139 nm, and is usually less than 152 nm, preferably less than 151 nm, and more preferably less than 150 nm. When the in-plane retardation Re0(550) of the optically anisotropic layered body at the wavelength of 550 nm falls within such a range, a circularly polarizing plate can be obtained by combining the optically anisotropic layered body with a linear polarizer. With this circularly polarizing plate, reflection of external light and coloring of the display surface in a tilt direction of the display surface can be suppressed.

Regarding the formula (11), the ratio Nz(450)/Nz(650) of the NZ factor Nz(450) of the optically anisotropic layered body at the wavelength of 450 nm relative to the NZ factor Nz(650) of the optically anisotropic layered body at the wavelength of 650 nm will be described in detail. It is preferable that the ratio Nz(450)/Nz(650) satisfies the following formula (19).

$$0.89 < Nz(450)/Nz(650) \leq 0.91 \qquad \text{Formula (19)}$$

More specifically, the ratio Nz(450)/Nz(650) of the NZ factor is usually more than 0.845, preferably more than 0.89, and more preferably more than 0.895, and is usually 0.915 or less, and preferably 0.91 or less. When the ratio Nz(450)/Nz(650) of the NZ factor of the optically anisotropic layered body falls within such a range, reflection of external light and coloring of the display surface in a tilt direction of the display surface can be suppressed by the circularly polarizing plate having the optically anisotropic layered body.

Regarding the formula (12), the thickness direction retardation Rth0(550) of the optically anisotropic layered body at the wavelength of 550 nm will be described in detail. It is preferable that the thickness direction retardation Rth0(550) of the optically anisotropic layered body satisfies the following formula (20).

$$4\ nm < Rth0(550) < 10\ nm \quad \text{Formula (20)}$$

More specifically, the thickness direction retardation Rth0(550) of the optically anisotropic layered body is usually more than −9 nm, preferably more than 4 nm, and more preferably more than 7 nm, and is usually less than 26 nm, and preferably less than 10 nm. When the thickness direction retardation Rth0(550) of the optically anisotropic layered body at the wavelength of 550 nm falls within such a range, reflection of external light and coloring of the display surface in a tilt direction of the display surface can be suppressed by the circularly polarizing plate having the optically anisotropic layered body.

In the second combination of the optical properties, it is preferable that the in-plane retardation Re1(550) of the first optically anisotropic layer at the wavelength of 550 nm falls within the same range as that described in the aforementioned chapter [2. First Combination of Optical Properties]. When the in-plane retardation Re1(550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the second combination of the optical properties, it is preferable that the thickness direction retardation Rth1(550) of the first optically anisotropic layer at the wavelength of 550 nm falls within the same range as that described in the aforementioned chapter [2. First Combination of Optical Properties]. When the thickness direction retardation Rth1(550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the second combination of the optical properties, it is preferable that the in-plane retardation Re2(550) of the second optically anisotropic layer at the wavelength of 550 nm falls within the same range as that described in the aforementioned chapter [2. First Combination of Optical Properties]. When the in-plane retardation Re2(550) of the second optically anisotropic layer falls within the aforementioned range, suppression of reflection of external light and suppression of coloring of the display surface in a tilt direction of the display surface can be effectively achieved by the circularly polarizing plate having the optically anisotropic layered body including the second optically anisotropic layer.

In the second combination of the optical properties, the thickness direction retardation Rth2(550) of the second optically anisotropic layer at a wavelength of 550 nm is preferably −79 nm or more, more preferably −76 nm or more, and particularly preferably −73 nm or more, and is preferably −45 nm or less, more preferably −50 nm or less, and particularly preferably −55 nm or less. When the thickness direction retardation Rth2(550) of the second optically anisotropic layer falls within the aforementioned range, suppression of reflection of external light and suppression of coloring of the display surface in a tilt direction of the display surface can be effectively achieved by the circularly polarizing plate having the optically anisotropic layered body including the second optically anisotropic layer.

In the second combination of optical properties, the NZ factor Nz(550) of the optically anisotropic layered body at the wavelength of 550 nm is preferably 0.44 or more, more preferably 0.48 or more, and particularly preferably 0.52 or more, and is preferably 0.68 or less, more preferably 0.64 or less, and particularly preferably 0.6 or less. When the NZ factor Nz(550) of the optically anisotropic layered body falls within the aforementioned range, suppression of reflection of external light and suppression of coloring of the display surface in a tilt direction of the display surface can be effectively achieved by the circularly polarizing plate having the optically anisotropic layered body.

[4. Third Combination of Optical Properties]

In the third combination, the refractive index $nx2$ in a direction which gives the maximum refractive index among in-plane directions of the second optically anisotropic layer, the refractive index $ny2$ in a direction, among the in-plane directions of the second optically anisotropic layer, perpendicular to the direction giving the $nx2$, the thickness direction refractive index $nz2$ of the second optically anisotropic layer, the in-plane retardation Re1(450) of the first optically anisotropic layer at the wavelength of 450 nm, the in-plane retardation Re1(550) of the first optically anisotropic layer at the wavelength of 550 nm, the in-plane retardation Re1(650) of the first optically anisotropic layer at the wavelength of 650 nm, the thickness direction retardation Rth2(450) of the second optically anisotropic layer at the wavelength of 450 nm, the thickness direction retardation Rth2(550) of the second optically anisotropic layer at the wavelength of 550 nm, the thickness direction retardation Rth2(650) of the second optically anisotropic layer at the wavelength of 650 nm, the in-plane retardation Re0(550) of the optically anisotropic layered body at the wavelength of 550 nm, the NZ factor Nz(450) of the optically anisotropic layered body at the wavelength of 450 nm, the NZ factor Nz(650) of the optically anisotropic layered body at the wavelength of 650 nm, and the thickness direction retardation Rth0(550) of the optically anisotropic layered body at the wavelength of 550 nm satisfy the following formulas (13) to (18):

$$nz2 > nx2 \geq ny2 \quad \text{Formula (13),}$$

$$Re1(450) < Re1(550) < Re1(650) \quad \text{Formula (14),}$$

$$Rth2(450) < Rth2(550) < Rth2(650) \quad \text{Formula (15),}$$

$$137\ nm < Re0(550) < 152\ nm \quad \text{Formula (16),}$$

$$0.915 < Nz(450)/Nz(650) \leq 0.97 \quad \text{Formula (17), and}$$

$$-11\ nm < Rth0(550) < 27\ nm \quad \text{Formula (18).}$$

By providing a circularly polarizing plate obtained by combining an optically anisotropic layered body having optical properties satisfying the above-described formulas

(13) to (18) with a linear polarizer in the image display device, when a display surface of the image display device is observed in a tilt direction, reflection of external light and coloring can be effectively suppressed.

Regarding the formula (13), the relationship among the refractive indices nx2, ny2, and nz2 of the second optically anisotropic layer will be described in detail. The formula (13) indicates that the second optically anisotropic layer is a layer that can function as a positive C plate. In this case, it is preferable that the refractive index nx2 and the refractive index ny2 have the same value or are close to each other. Therefore, it is preferable that the refractive indices nx2, ny2, and nz2 of the second optically anisotropic layer satisfy the relationship of nz2>nx2≈ny2. Specifically, it is preferable that the difference nx2−ny2 between the refractive index nx2 and the refractive index ny2 falls within the same range as that described in the aforementioned chapter [2. First Combination of Optical Properties]. When the refractive index difference nx2−ny2 falls within the aforementioned range, it is possible to achieve a circularly polarizing plate that can effectively suppress coloring due to reflected light when the display surface is observed in a tilt direction.

Regarding the formula (14), the relationship among the in-plane retardation Re1(450) of the first optically anisotropic layer at the wavelength of 450 nm, the in-plane retardation Re1(550) of the first optically anisotropic layer at the wavelength of 550 nm, and the in-plane retardation Re1(650) of the first optically anisotropic layer at the wavelength of 650 nm will be described in detail. The first optically anisotropic layer is a layer having refractive index anisotropy in a plane thereof and therefore has an in-plane retardation larger than 0 nm. As represented by the formula (14), the in-plane retardation of the first optically anisotropic layer exhibits reverse wavelength distribution. When the in-plane retardation of the first optically anisotropic layer exhibits reverse wavelength distribution, it is possible to uniformly convert the polarization state of light in a wide wavelength range that passes through the first optically anisotropic layer in a tilt direction. Therefore, since the circularly polarizing plate having the optically anisotropic layered body including such a first optically anisotropic layer can uniformly suppress the reflection of external light over a wide wavelength range, coloring of the display surface can be suppressed.

Regarding the formula (15), the relationship among the thickness direction retardation Rth2(450) of the second optically anisotropic layer at the wavelength of 450 nm, the thickness direction retardation Rth2(550) of the second optically anisotropic layer at the wavelength of 550 nm, and the thickness direction retardation Rth2(650) of the second optically anisotropic layer at the wavelength of 650 nm will be described in detail. As represented by the formula (15), the thickness direction retardation of the second optically anisotropic layer exhibits reverse wavelength distribution. When the thickness direction retardation of the second optically anisotropic layer exhibits reverse wavelength distribution, it is possible to uniformly convert the polarization state of light in a wide wavelength range that passes through the second optically anisotropic layer in a tilt direction. Therefore, since the circularly polarizing plate having the optically anisotropic layered body including such a second optically anisotropic layer can uniformly suppress the reflection of external light over a wide wavelength range, coloring of the display surface can be suppressed.

In particular, it is preferable that the thickness direction retardation ratios Rth2(450)/Rth2(550) and Rth2(650)/Rth2(550) of the second optically anisotropic layer fall within the same ranges as those described in the aforementioned chapter [2. First Combination of Optical Properties] (see the formula (23) and the formula (24)). This makes it possible to particularly effectively achieve suppression of reflection of external light and suppression of coloring of the display surface in a tilt direction of the display surface.

Regarding the formula (16), the in-plane retardation Re0(550) of the optically anisotropic layered body at the wavelength of 550 nm will be described in detail. The in-plane retardation Re0(550) of the optically anisotropic layered body is usually more than 137 nm, preferably more than 138 nm, and more preferably more than 139 nm, and is usually less than 152 nm, preferably less than 151 nm, and more preferably less than 150 nm. When the in-plane retardation Re0(550) of the optically anisotropic layered body at the wavelength of 550 nm falls within such a range, a circularly polarizing plate can be obtained by combining the optically anisotropic layered body with a linear polarizer. With this circularly polarizing plate, reflection of external light and coloring of the display surface in a tilt direction of the display surface can be suppressed.

Regarding the formula (17), the ratio Nz(450)/Nz(650) of the NZ factor Nz(450) of the optically anisotropic layered body at the wavelength of 450 nm relative to the NZ factor Nz(650) of the optically anisotropic layered body at the wavelength of 650 nm will be described in detail. It is preferable that the ratio Nz(450)/Nz(650) satisfies the following formula (21):

$$0.94 < Nz(450)/Nz(650) \leq 0.96 \qquad \text{Formula (21).}$$

More specifically, the ratio Nz(450)/Nz(650) of the NZ factor is usually more than 0.915, preferably more than 0.94, and more preferably more than 0.945, and is usually 0.97 or less, preferably 0.96 or less, and more preferably 0.955 or less. When the ratio Nz(450)/Nz(650) of the NZ factor of the optically anisotropic layered body falls within such a range, reflection of external light and coloring of the display surface in a tilt direction of the display surface can be suppressed by the circularly polarizing plate having the optically anisotropic layered body.

Regarding the formula (18), the thickness direction retardation Rth0(550) of the optically anisotropic layered body at the wavelength of 550 nm will be described in detail. It is preferable that the thickness direction retardation Rth0(550) of the optically anisotropic layered body satisfies the following formula (22):

$$4 \text{ nm} < Rth0(550) < 12 \text{ nm} \qquad \text{Formula (22).}$$

More specifically, the thickness direction retardation Rth0(550) of the optically anisotropic layered body is usually more than −11 nm, preferably more than 4 nm, and more preferably more than 5 nm, and is usually less than 27 nm, preferably less than 12 nm, and more preferably less than 11 nm. When the thickness direction retardation Rth0(550) of the optically anisotropic layered body at the wavelength of 550 nm falls within such a range, reflection of external light and coloring of the display surface in a tilt direction of the display surface can be suppressed by the circularly polarizing plate having the optically anisotropic layered body.

In the third combination of the optical properties, it is preferable that the in-plane retardation Re1(550) of the first optically anisotropic layer at the wavelength of 550 nm falls within the same range as that described in the aforementioned chapter [2. First Combination of Optical Properties]. When the in-plane retardation Re1(550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the third combination of the optical properties, it is preferable that the thickness direction retardation Rth1(550) of the first optically anisotropic layer at the wavelength of 550 nm falls within the same range as that described in the aforementioned chapter [2. First Combination of Optical Properties]. When the thickness direction retardation Rth1 (550) of the first optically anisotropic layer falls within the aforementioned range, suppression of reflection of external light and suppression of coloring of the display surface in a tilt direction of the display surface can be effectively achieved by the circularly polarizing plate having the optically anisotropic layered body including the first optically anisotropic layer.

In the third combination of the optical properties, it is preferable that the in-plane retardation Re2(550) of the second optically anisotropic layer at the wavelength of 550 nm falls within the same range as that described in the aforementioned chapter [2. First Combination of Optical Properties]. When the in-plane retardation Re2(550) of the second optically anisotropic layer falls within the aforementioned range, suppression of reflection of external light and suppression of coloring of the display surface in the tilt direction of the display surface can be effectively achieved by the circularly polarizing plate having the optically anisotropic layered body including the second optically anisotropic layer.

In the third combination of the optical properties, the thickness direction retardation Rth2(550) of the second optically anisotropic layer at the wavelength of 550 nm is preferably −83 nm or more, more preferably −80 nm or more, and particularly preferably −77 nm or more, and is preferably −45 nm or less, more preferably −50 nm or less, and particularly preferably −55 nm or less. When the thickness direction retardation Rth2(550) of the second optically anisotropic layer falls within the aforementioned range, suppression of reflection of external light and suppression of coloring of the display surface in a tilt direction of the display surface can be effectively achieved by the circularly polarizing plate having the optically anisotropic layered body including the second optically anisotropic layer.

In the third combination of optical properties, the NZ factor Nz(550) of the optically anisotropic layered body at the wavelength of 550 nm is preferably 0.43 or more, more preferably 0.47 or more, and particularly preferably 0.51 or more, and is preferably 0.69 or less, more preferably 0.65 or less, and particularly preferably 0.61 or less. When the NZ factor Nz(550) of the optically anisotropic layered body falls within the aforementioned range, suppression of reflection of external light and suppression of coloring of the display surface in a tilt direction of the display surface can be effectively achieved by the circularly polarizing plate having the optically anisotropic layered body.

[5. Structure of Second Optically Anisotropic Layer]

As the second optically anisotropic layer, a layer containing a specific polymer and a specific compound having a mesogen skeleton may be used. Hereinafter, the polymer contained in the second optically anisotropic layer may be referred to as a "positive C polymer" as appropriate. The compound having a mesogen skeleton contained in the second optically anisotropic layer may be referred to as a "mesogen compound" as appropriate hereinafter.

[5.1. Positive C Polymer]

The positive C polymer is a polymer whose refractive indices $nx(P)$, $ny(P)$, and $nz(P)$ satisfy $nz(P)>nx(P) \geq ny(P)$ when a film of the positive C polymer is formed by a coating method using a solution of the positive C polymer. Herein, $nx(P)$ represents a refractive index in a direction which gives the maximum refractive index among in-plane directions of the film, $ny(P)$ represents a refractive index in a direction, among the in-plane directions of the film, perpendicular to the direction giving the $nx(P)$, and $nz(P)$ represents a thickness direction refractive index of the film.

Whether or not a certain polymer corresponds to a positive C polymer may be confirmed by the following method.

First, a polymer as a sample is added to a solvent such as methyl ethyl ketone (MEK), 1,3-dioxolane, N-methylpyrrolidone (NMP), or the like so that the concentration of the polymer is 10% by weight to 20% by weight, and dissolved at room temperature to obtain a polymer solution.

The polymer solution is applied onto an unstretched film formed of a resin using an applicator to form a layer of the polymer solution. After that, the layer is dried in an oven at 85° C. for about 10 minutes to evaporate the solvent, thereby obtaining a polymer film having a thickness of about 10 µm.

Then, whether or not the refractive index $nx(P)$, the refractive index $ny(P)$, and the refractive index $nz(P)$ of the polymer film satisfy $nz(P)>nx(P) \geq ny(P)$ is evaluated. When they satisfy the criterion, it can be determined that the polymer as the sample corresponds to the positive C polymer.

In particular, it is preferable that the refractive index $nx(P)$ and the refractive index $ny(P)$ have the same value or are close to each other. Specifically, the difference $nx(P)-ny(P)$ between the refractive index $nx(P)$ and the refractive index $ny(P)$ is preferably 0.00000 to 0.00100, more preferably 0.00000 to 0.00050, and particularly preferably 0.00000 to 0.00020. When the refractive index difference $nx(P)-ny(P)$ falls within the aforementioned range, the second optically anisotropic layer can be easily obtained.

As the positive C polymer, any polymer having a refractive index satisfying the aforementioned formula $nz(P)>nx(P) \geq ny(P)$ may be used. Among these, as the positive C polymer, at least one polymer selected from the group consisting of polyvinyl carbazole and esters of polyfumaric acid is preferable. By using these polymers as positive C polymers, a second optically anisotropic layer having a large thickness direction retardation Rth can be easily obtained by coating.

Specific examples of the positive C polymers may include poly(9-vinylcarbazole); a copolymer of diisopropyl fumarate and 3-ethyl-3-oxetanylmethyl acrylate; and a copolymer of diisopropyl fumarate and a cinnamic acid ester.

As the positive C polymer, one type thereof may be solely used, and two or more types thereof may also be used in combination at any ratio.

The ratio of the positive C polymer in the total solid content of the second optically anisotropic layer is preferably 40% by weight or more, more preferably 45% by weight or more, and particularly preferably 50% by weight or more, and is preferably 80% by weight or less, more preferably 70% by weight or less, and particularly preferably 60% by weight or less. When the ratio of the positive C polymer is equal to or more than the lower limit value of the aforementioned range, the mesogen compound can be uniformly dispersed in the second optically anisotropic layer and mechanical strength of the second optically anisotropic layer can be increased. When the ratio is equal to or less than the upper limit value of the aforementioned range, the wavelength distribution of the thickness direction retardation of the second optically anisotropic layer can be easily made close to the reverse wavelength distribution. Herein, the solid content of a certain layer refers to a component that remains when the layer is dried.

[5.2. Mesogen Compound]

The mesogen compound is a compound having a mesogen skeleton. Herein, the mesogen skeleton means a molecular skeleton which essentially contributes to the generation of a liquid crystal (LC: liquid-crystalline) phase in a material having a low molecular weight or a high molecular weight by the anisotropy of its attractive force and repulsive interaction. The mesogen compound containing the mesogen skeleton itself does not necessarily have to have liquid crystal properties capable of causing a phase transition to a liquid crystal phase. Thus, the mesogen compound may be a liquid crystal compound capable of causing by itself a phase transition to a liquid crystal phase, or may be a non-liquid crystal compound that does not cause by itself a phase transition to a liquid crystal phase. Examples of the mesogen skeleton may include a rigid rod-shaped unit and a disc-shaped unit. For the mesogen skeleton, Pure Appl. Chem. 2001, Vol. 73 (No. 5), p. 888 and C. Tschierske, G. Pelzl, S. Diele, Angew. Chem. 2004, Vol. 116, pp. 6340-6368 may be referred to.

In the second optically anisotropic layer, the mesogen compound may have a fixed orientation state. For example, in the mesogen compound, the orientation state of the mesogen compound may be fixed by polymerization. Usually, the mesogen compound can be polymerized to become a polymer while maintaining the orientation state of the mesogen compound, and thereby the orientation state of the mesogen compound is fixed by the polymerization. Therefore, the term "mesogen compound having a fixed orientation state" encompasses polymers of mesogen compounds. Accordingly, when the mesogen compound is a liquid crystal compound having liquid crystal properties, the liquid crystal compound may exhibit a liquid crystal phase in the second optically anisotropic layer, or may not exhibit a liquid crystal phase by fixation of the orientation state.

As the specific mesogen compound, at least one compound selected from the group consisting of a liquid crystal compound with reverse wavelength distribution as a first compound and a mesogen compound with reverse wavelength distribution as a second compound is used.

Herein, the liquid crystal compound with reverse wavelength distribution means a compound that satisfies the following requirements (A1) and (A2).

(A1) The liquid crystal compound with reverse wavelength distribution exhibits liquid crystal properties.

(A2) The liquid crystal compound with reverse wavelength distribution exhibits an in-plane retardation with reverse wavelength distribution when the liquid crystal compound is homogeneously oriented.

The mesogen compound with reverse wavelength distribution means a compound satisfying the following requirements (A3) to (A5).

(A3) The mesogen compound with reverse wavelength distribution does not solely exhibit liquid crystal properties.

(A4) An evaluation mixture exhibits liquid crystal properties. Herein, the "evaluation mixture" is a mixture obtained by mixing, in an evaluator liquid crystal compound that exhibits an in-plane retardation with forward wavelength distribution when it is homogeneously oriented, the mesogen compound with reverse wavelength distribution at at least one of ratios in a range of 30 parts by weight to 70 parts by weight relative to 100 parts by weight of the total of the evaluator liquid crystal compound and the mesogen compound with reverse wavelength distribution.

(A5) When the evaluation mixture is homogeneously oriented, the mesogen compound with reverse wavelength distribution exhibits an in-plane retardation with reverse wavelength distribution.

Hereinafter, the liquid crystal compound with reverse wavelength distribution will be described.

When the liquid crystal compound with reverse wavelength distribution is homogeneously oriented, the liquid crystal compound with reverse wavelength distribution exhibits an in-plane retardation with reverse wavelength distribution. Herein, that the liquid crystal compound is homogeneously oriented means to form a layer containing the liquid crystal compound and to give orientation to a long-axis direction of the mesogen skeleton of molecule of the liquid crystal compound in the layer in one certain direction parallel to the plane of the layer. When the liquid crystal compound includes a plurality of types of mesogen skeletons having different orientation directions, the direction in which the longest type of the mesogens is oriented is the aforementioned orientation direction. Whether the liquid crystal compound is homogeneously oriented and the orientation direction thereof may be confirmed by measurement of slow axis direction and measurement of retardation distribution of each incidence angle in the slow axis direction using a phase difference meter typified by AxoScan (manufactured by Axometrics, Inc.).

That the in-plane retardation exhibits reverse wavelength distribution means that the in-plane retardations Re(450) and Re(550) at wavelengths of 450 nm and 550 nm, respectively, satisfy Re(450)/Re(550)<1.00.

Therefore, when a liquid crystal layer containing the liquid crystal compound with reverse wavelength distribution is formed and the long-axis direction of the mesogen skeleton of molecule of the liquid crystal compound in the liquid crystal layer is oriented in one certain direction parallel to the plane of the liquid crystal layer, the in-plane retardations Re(L450) and Re(L550) of the liquid crystal layer at wavelengths of 450 nm and 550 nm, respectively, usually satisfy Re(L450)/Re(L550)<1.00. Further, it is more preferable that the in-plane retardations Re(L450), Re(L550), and Re(L650) of the liquid crystal layer at wavelengths of 450 nm, 550 nm, and 650 nm satisfy Re(L450)<Re(L550)≤Re(L650) from the viewpoint of easily obtaining a desired second optically anisotropic layer.

As the liquid crystal compound with reverse wavelength distribution, for example, a compound having a main chain mesogen skeleton and a side chain mesogen skeleton bonded to the main chain mesogen skeleton in a molecule of the liquid crystal compound with reverse wavelength distribution may be used. While the liquid crystal compound with reverse wavelength distribution having the main chain mesogen skeleton and the side chain mesogen skeleton is oriented, the side chain mesogen skeleton may be oriented in a direction different from that of the main chain mesogen skeleton. In this case, birefringence is expressed as a difference between the refractive index corresponding to the main chain mesogen skeleton and the refractive index corresponding to the side chain mesogen skeleton. Consequently, when the liquid crystal compound with reverse wavelength distribution is homogeneously oriented, the liquid crystal compound with reverse wavelength distribution can exhibit an in-plane retardation with reverse wavelength distribution.

For example, the liquid crystal compound with reverse wavelength distribution, such as the aforementioned compound having the main chain mesogen skeleton and the side chain mesogen skeleton, usually has a specific steric structure that is different from the steric structure of a general liquid crystal compound with forward wavelength distribution. Herein, the "liquid crystal compound with forward wavelength distribution" refers to a liquid crystal compound that may exhibit an in-plane retardation with forward wavelength distribution when it is homogeneously oriented. The in-plane retardation with forward wavelength distribution refers to an in-plane retardation that becomes smaller as the measurement wavelength is longer. Since the liquid crystal compound with reverse wavelength distribution has such a specific steric shape, the second optically anisotropic layer can be easily obtained by the combination of the positive C polymer and the liquid crystal compound with reverse wavelength distribution.

Further, it is preferable that the liquid crystal compound with reverse wavelength distribution has polymerizability. It is therefore preferable that the liquid crystal compound with reverse wavelength distribution has a polymerizable group. When a liquid crystal compound with reverse wavelength distribution having a polymerizable group is used, the orientation state of the liquid crystal compound with reverse wavelength distribution can be easily fixed by polymerization. Therefore, a second optically anisotropic layer having stable optical properties can be easily obtained.

The CN point of the liquid crystal compound with reverse wavelength distribution is preferably 25° C. or higher, more preferably 45° C. or higher, and particularly preferably 60° C. or higher, and is preferably 120° C. or lower, more preferably 110° C. or lower, and particularly preferably 100° C. or lower. Herein, "CN point" refers to a crystal-nematic phase transition temperature. When a liquid crystal compound with reverse wavelength distribution having a CN point within the aforementioned range is used, the second optically anisotropic layer can be easily produced.

When the liquid crystal compound with reverse wavelength distribution is a monomer, the molecular weight thereof is preferably 300 or more, more preferably 700 or more, and particularly preferably 1,000 or more, and is preferably 2,000 or less, more preferably 1,700 or less, and particularly preferably 1,500 or less. When the liquid crystal compound with reverse wavelength distribution has the aforementioned molecular weight, the coating property of a coating liquid for forming the second optically anisotropic layer can be particularly improved.

As the liquid crystal compound with reverse wavelength distribution, one type thereof may be solely used, and two or more types thereof may also be used in combination at any ratio.

Examples of the liquid crystal compound with reverse wavelength distribution may include those described in Japanese Patent Application Laid-Open No. 2014-123134 A. Particularly preferable specific examples thereof may include a compound exhibiting liquid crystal properties among the compounds represented by the following formula (I). In the following description, the compound represented by the formula (I) may be appropriately referred to as a "compound (I)".

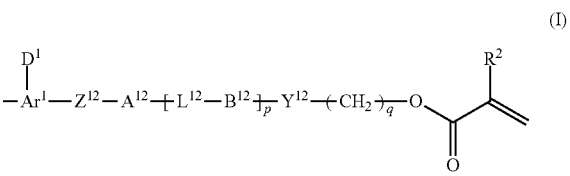

(I)

The compound (I) usually includes, as represented by the following formula, two mesogen skeletons that are a main chain mesogen skeleton 1a formed of a group of $-Y^{11}-[B^{11}-L^{11}]_n-A^{11}-Z^{11}-Ar^1-Z^{12}-A^{12}-[L^{12}-B^{12}]_p-Y^{12}$, and a side chain mesogen skeleton 1b formed of a group of $>Ar^1-D^1$. The main chain mesogen skeleton 1a and the side chain mesogen skeleton 1b cross each other. Although the main chain mesogen skeleton 1a and the side chain mesogen skeleton 1b may be collectively regarded as one mesogen skeleton, they are described in the present invention as distinctive two mesogen skeletons.

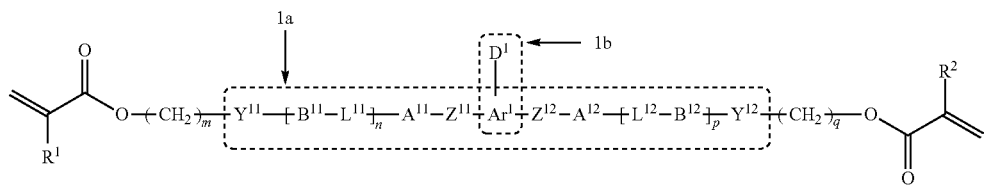

Suppose that the refractive index in the long axis direction of the main chain mesogen skeleton 1a is n1, and the refractive index in the long axis direction of the side chain mesogen skeleton 1b is n2. In this case, the absolute value of the refractive index n1 and the wavelength distribution usually depend on the molecular structure of the main chain mesogen skeleton 1a. The absolute value of the refractive index n2 and the wavelength distribution usually depend on the molecular structure of the side chain mesogen skeleton 1b. Herein, in the liquid crystal phase, the compound (I) usually performs a rotational movement with the long axis direction of the main chain mesogen skeleton 1a as the rotation axis, and thus the refractive indices n1 and n2 herein represent the refractive indices as the rotating body.

Due to the molecular structures of the main chain mesogen skeleton 1a and the side chain mesogen skeleton 1b, the absolute value of the refractive index n1 is larger than the absolute value of the refractive index n2. Further, the refractive indices n1 and n2 usually exhibit forward wavelength distribution. Herein, the refractive index with forward wavelength distribution represents a refractive index in which the absolute value of the refractive index becomes smaller as the measurement wavelength becomes longer. The refractive index n1 of the main chain mesogen skeleton 1a shows a small degree of forward wavelength distribution. Therefore, the refractive index n1 measured at a long wavelength is smaller than the refractive index n1 measured at a short wavelength, but the difference between them is small. In contrast, the refractive index n2 of the side chain mesogen skeleton 1b exhibits a large degree of forward wavelength distribution. Therefore, the refractive index n2 measured at a long wavelength is smaller than the refractive index n2 measured at a short wavelength, and the difference between them is large. Therefore, when the measurement wavelength is short, the difference Δn between the refractive index n1 and the refractive index n2 is small, and when the measurement wavelength is long, the difference Δn between the refractive index n1 and the refractive index n2 is large. In this manner, due to the main chain mesogen skeleton 1a and the side chain mesogen skeleton 1b, the compound (I) may exhibit an in-plane retardation with reverse wavelength distribution when the compound (I) is homogeneously oriented.

In the formula (I), m and q each independently represent an integer of 1 to 20, preferably an integer of 2 to 12, and more preferably an integer of 4 to 8.

In the formula (I), n and p each independently represent 0 or 1, and preferably 1.

In the formula (I), $Ar^1$ represents a divalent aromatic hydrocarbon ring group having $D^1$ as a substituent, or a divalent aromatic heterocyclic ring group having $D^1$ as a substituent.

In the formula (I), $D^1$ represents an organic group of 1 to 20 carbon atoms having at least one aromatic ring selected from the group consisting of an aromatic hydrocarbon ring and an aromatic heterocyclic ring.

Herein, the divalent aromatic hydrocarbon ring group having $D^1$ as a substituent or the divalent aromatic heterocyclic ring group having $D^1$ as a substituent is a group obtained by removing two hydrogen atoms bonded to carbon atoms other than the carbon atom to which $D^1$ is bonded from a ring part of an aromatic hydrocarbon ring to which $D^1$ is bonded or an aromatic heterocyclic ring to which $D^1$ is bonded. Therefore, $Ar^1$ indicated in the formula (I) represents an aromatic hydrocarbon ring group or an aromatic heterocyclic ring group bonded to $D^1$ indicated in the formula (I), and does not include $D^1$ different from the $D^1$ indicated in the formula (I).

Examples of the divalent aromatic hydrocarbon ring group of $Ar^1$ may include a 1,4-phenylene group, a 1,3-phenylene group, a 1,4-naphthylene group, a 2,6-naphthylene group, a 1,5-naphthylene group, an anthracenyl-9,10-diyl group, an anthracenyl-1,4-diyl group, and an anthracenyl-2,6-diyl group.

Among these, as the divalent aromatic hydrocarbon ring group, a 1,4-phenylene group, a 1,4-naphthylene group, and a 2,6-naphthylene group are preferable.

Examples of the divalent aromatic heterocyclic ring group of $Ar^1$ may include a benzothiazole-4,7-diyl group, a 1,2-benzisothiazole-4,7-diyl group, a benzoxazole-4,7-diyl group, an indonyl-4,7-diyl group, a benzimidazole-4,7-diyl group, a benzopyrazole-4,7-diyl group, a 1-benzofuran-4,7-diyl group, a 2-benzofuran-4,7-diyl group, a benzo[1,2-d:4,5-d']dithiazolyl-4,8-diyl group, a benzo[1,2-d:5,4-d']dithiazolyl-4,8-diyl group, a benzothiophenyl-4,7-diyl group, a 1H-isoindole-1,3(2H)-dione-4,7-diyl group, a benzo[1,2-b:5,4-b']dithiophenyl-4,8-diyl group, a benzo[1,2-b:4,5-b']dithiophenyl-4,8-diyl group, a benzo[1,2-b:5,4-b']difuranyl-4,8-diyl group, a benzo[1,2-b:4,5-b']difuranyl-4,8-diyl group, a benzo[2,1-b:4,5-b']dipyrrole-4,8-diyl group, a benzo[1,2-b:5,4-b']dipyrrole-4,8-diyl group, and a benzo[1,2-d:4,5-d']diimidazole-4,8-diyl group.

Among these, as the divalent aromatic heterocyclic ring group, a benzothiazole-4,7-diyl group, a benzoxazole-4,7-diyl group, a 1-benzofuran-4,7-diyl group, a 2-benzofuran-4,7-diyl group, a benzo[1,2-d:4,5-d']dithiazolyl-4,8-diyl group, a benzo[1,2-d:5,4-d']dithiazolyl-4,8-diyl group, a benzothiophenyl-4,7-diyl group, a 1H-isoindole-1,3(2H)-dione-4,7-diyl group, a benzo[1,2-b:5,4-b']dithiophenyl-4,8-diyl group, a benzo[1,2-b:4,5-b']dithiophenyl-4,8-diyl group, a benzo[1,2-b:5,4-b']difuranyl-4,8-diyl group, and a benzo[1,2-b:4,5-b']difuranyl-4,8-diyl group are preferable.

The divalent aromatic hydrocarbon ring group and the divalent aromatic heterocyclic ring group of $Ar^1$ may have, in addition to $D^1$, at least one substituent selected from alkyl groups of 1 to 6 carbon atoms such as a methyl group, an ethyl group, a propyl group, an isopropyl group, a butyl group, a sec-butyl group, and a tertiary butyl group. When a plurality of substituents are contained, the plurality of substituents may be the same as or different from each other. As the substituents other than $D^1$ of the divalent aromatic hydrocarbon ring group and the divalent aromatic heterocyclic ring group, at least one substituent selected from a methyl group, an ethyl group, a propyl group, a sec-butyl group, and a tertiary butyl group is preferable.

In the formula (I), $D^1$ represents "an organic group of 1 to 20 carbon atoms having at least one aromatic ring selected from the group consisting of an aromatic hydrocarbon ring and an aromatic heterocyclic ring". Herein, the "aromatic ring" means a cyclic structure having aromaticity in the broad sense based on the Huckel's rule, that is, a cyclic conjugated structure having (4n+2) π electrons, and a cyclic structure in which a lone electron pair of heteroatoms such as sulphur, oxygen, nitrogen and the like participate in a π electron system and exhibit aromaticity, and which is typified by thiophene, furan, benzothiazole or the like.

The aromatic ring of $D^1$ may have one or a plurality of substituents.

The total number of π electrons contained in the $Ar^1$ and $D^1$ is usually 12 or more, preferably 12 or more and 22 or less, and more preferably 12 or more and 20 or less.

Examples of the aromatic hydrocarbon ring of $D^1$ may include a benzene ring, a naphthalene ring, an anthracene ring, a phenanthrene ring, a pyrene ring, and a fluorene ring.

Among these, as the aromatic hydrocarbon ring, a benzene ring and a naphthalene ring are preferable.

Examples of the aromatic heterocyclic ring of $D^1$ may include a 1H-isoindole-1,3(2H)-dione ring, a 1-benzofuran ring, a 2-benzofuran ring, an acridine ring, an isoquinoline ring, an imidazole ring, an indole ring, an oxadiazole ring, an oxazole ring, an oxazolopyrazine ring, an oxazolopyridine ring, an oxazolopyridazyl ring, an oxazolopyrimidine ring, a quinazoline ring, a quinoxaline ring, a quinoline ring, a cinnoline ring, a thiadiazole ring, a thiazole ring, a thiazolopyrazine ring, a thiazolopyridine ring, a thiazolopyridazine ring, a thiazolopyrimidine ring, a thiophene ring, a triazine ring, a triazole ring, a naphthyridine ring, a pyrazine ring, a pyrazole ring, a pyranone ring, a pyran ring, a pyridine ring, a pyridazine ring, a pyrimidine ring, a pyrrole ring, a phenanthridine ring, a phthalazine ring, a furan ring, a benzo[c]thiophene ring, a benzisoxazole ring, a benzisothiazole ring, a benzimidazole ring, a benzoxadiazole ring, a benzoxazole ring, a benzothiadiazole ring, a benzothiazole ring, a benzothiophene ring, a benzotriazine ring, a benzotriazole ring, a benzopyrazole ring, a benzopyranone ring, a dihydropyran ring, a tetrahydropyran ring, a dihydrofuran ring, and a tetrahydrofuran ring.

Among these, as the aromatic heterocyclic ring, a benzothiazole ring, a benzoxazole ring, a 1-benzofuran ring, a 2-benzofuran ring, a benzothiophene ring, a 1H-isoindole-1,3(2H)-dione ring, a thiophene ring, a furan ring, a benzo[c]thiophene ring, an oxazole ring, a thiazole ring, an oxadiazole ring, a pyran ring, a benzisoxazole ring, a thiadiazole ring, a benzoxadiazole ring, and a benzothiadiazole ring are preferable.

The organic group of 1 to 20 carbon atoms having at least one aromatic ring selected from the group consisting of an aromatic hydrocarbon ring and an aromatic heterocyclic ring as $D^1$ is not particularly limited. Examples of $D^1$ may include an aromatic hydrocarbon ring group optionally having a substituent, an aromatic heterocyclic ring group optionally having a substituent, and a group represented by the formula: —$R^f C(=N-NR^g R^h)$.

In the aforementioned formula, $R^f$ represents a hydrogen atom or an alkyl group of 1 to 6 carbon atoms such as a methyl group, an ethyl group, a propyl group, or an isopropyl group.

In the aforementioned formula, $R^g$ represents a hydrogen atom or an organic group of 1 to 20 carbon atoms optionally having a substituent. Specific examples of the organic group of 1 to 20 carbon atoms and the substituent thereof may include the same ones as those listed as specific examples of the organic group of 1 to 20 carbon atoms and the substituent thereof of $R^a$ to be described later.

In the aforementioned formula, $R^h$ represents an organic group of 2 to 20 carbon atoms having at least one aromatic ring selected from the group consisting of an aromatic hydrocarbon ring and an aromatic heterocyclic ring. Specific examples of the organic group of 2 to 20 carbon atoms and the substituent thereof may include the same ones as those listed as specific examples of the organic group of 2 to 20 carbon atoms and the substituent thereof of $A^x$ to be described later.

Specific examples of the aromatic hydrocarbon ring group serving as $D^1$ may include a phenyl group, a naphthyl group, an anthracenyl group, a phenanthrenyl group, a pyrenyl group, and a fluorenyl group.

Among these, a phenyl group and a naphthyl group are preferable as the aromatic hydrocarbon ring group.

Examples of the aromatic heterocyclic ring group serving as $D^1$ may include a phthalimido group, a 1-benzofuranyl group, a 2-benzofuranyl group, an acridinyl group, an isoquinoryl group, an imidazolyl group, an indolinyl group, a furazanyl group, an oxazolyl group, an oxazolopyrazinyl group, an oxazolopyridinyl group, an oxazolopyridazinyl group, an oxazolopyrimidinyl group, a quinazolinyl group, a quinoxalinyl group, a quinolyl group, a cinnolinyl group, a thiadiazolyl group, a thiazolyl group, a thiazolopyrazinyl group, a thiazolopyridyl group, a thiazolopyridazinyl group, a thiazolopyrimidinyl group, a thienyl group, a triazinyl group, a triazolyl group, a naphthyridinyl group, a pyrazinyl group, a pyrazolyl group, a pyranonyl group, a pyranyl group, a pyridyl group, a pyridazinyl group, a pyrimidinyl group, a pyrrolyl group, a phenanthridinyl group, a phthalazinyl group, a furanyl group, a benzo[c]thienyl group, a benzisoxazolyl group, a benzisothiazolyl group, a benzimidazolyl group, a benzoxadiazolyl group, a benzoxazolyl group, a benzothiadiazolyl group, a benzothiazolyl group, a benzothienyl group, a benzotriazinyl group, a benzotriazolyl group, a benzopyrazolyl group, a benzopyranonyl group, a dihydropyranyl group, a tetrahyaropyranyl group, a dihydrofuranyl group, and a tetrahydrofuranyl group.

Among these, as the aromatic heterocyclic ring group, a furanyl group, a thienyl group, an oxazolyl group, a thiazolyl group, a benzothiazolyl group, a benzoxazolyl group, a 1-benzofuranyl group, a 2-benzofuranyl group, a benzothienyl group, and a thiazolopyridyl group are preferable.

The aromatic hydrocarbon ring group and the aromatic heterocyclic ring group as $D^1$ may have at least one substituent selected from an aliphatic hydrocarbon group of 1 to 20 carbon atoms such as a methyl group, an ethyl group, a propyl group, an isopropyl group, a butyl group, and a sec-butyl group; a halogen atom, such as a fluorine atom and a chlorine atom; a cyano group; a substituted amino group such as a dimethylamino group; an alkoxy group of 1 to 6 carbon atoms such as a methoxy group, an ethoxy group and an isopropoxy group; a nitro group; a cycloalkyl group of 3 to 8 carbon atoms such as a cyclopentyl group and a cyclohexyl group; a halogenated alkyl group of 1 to 6 carbon atoms such as a trifluoromethyl group; —$C(=O)-R^{b'}$; —$C(=O)-OR^{b'}$; —$SR^{b'}$; —$SO_2 R^{d'}$; and a hydroxyl group. Herein, $R^{b'}$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms optionally having a substituent. $R^{d'}$ represents an alkyl group of 1 to 6 carbon atoms such as a methyl group or an ethyl group; or an aromatic hydrocarbon ring group of 6 to 20 carbon atoms optionally having a substituent such as a phenyl group, a 4-methylphenyl group, or a 4-methoxyphenyl group. When the aromatic hydrocarbon ring group and the aromatic heterocyclic ring group have a plurality of substituents, the substituents may be the same as or different from each other.

Examples of the substituents of the alkyl group of 1 to 20 carbon atoms optionally having a substituent, the alkenyl group of 2 to 20 carbon atoms optionally having a substituent, and the aromatic hydrocarbon ring group of 5 to 12 carbon atoms optionally having a substituent of $R^{b'}$ may include: a halogen atom such as a fluorine atom and a chlorine atom; a cyano group; an alkoxy group of 1 to 20 carbon atoms such as a methoxy group, an ethoxy group, an isopropoxy group, and a butoxy group; a nitro group; an aromatic hydrocarbon ring group of 6 to 20 carbon atoms such as a phenyl group and a naphthyl group; an aromatic heterocyclic ring group of 2 to 20 carbon atoms such as a furanyl group and a thiophenyl group; a cycloalkyl group of 3 to 8 carbon atoms such as a cyclopropyl group, a cyclopentyl group, and a cyclohexyl group; and a fluoroalkyl group of 1 to 12 carbon atoms in which at least one hydrogen atom is substituted with a fluorine atom such as a trifluoromethyl group, a pentafluoroethyl group, and —$CH_2 CF_3$. The alkyl group of 1 to 20 carbon atoms, the alkenyl group of 2 to 20 carbon atoms, and the aromatic hydrocarbon ring group of 5 to 12 carbon atoms of $R^{b'}$ may have one or a plurality of substituents selected from the substituents described above, and when the group has a plurality of substituents, the plurality of substituents may be the same as or different from each other.

Examples of the substituent of the cycloalkyl group of 3 to 12 carbon atoms of $R^{b'}$ may include a halogen atom such as a fluorine atom and a chlorine atom; a cyano group; an alkyl group of 1 to 6 carbon atoms such as a methyl group, an ethyl group, and a propyl group; an alkoxy group of 1 to 6 carbon atoms such as a methoxy group, an ethoxy group, and an isopropoxy group; a nitro group; and an aromatic hydrocarbon group of 6 to 20 carbon atoms such as a phenyl group and a naphthyl group. The cycloalkyl group of 3 to 12 carbon atoms of $R^{b'}$ may have one or a plurality of substituents selected from the substituents described above, and when the group has a plurality of substituents, the plurality of substituents may be the same as or different from each other.

Examples of the combination of $Ar^1$ and $D^1$ ($Ar^1$-$D^1$) may include a phenylene group substituted with a group represented by the formula: —$R^fC(\!=\!N\!-\!NR^gR^h)$, a benzothiazole-4,7-diyl group substituted with a 1-benzofuran-2-yl group, a benzothiazole-4,7-diyl group substituted with a 5-(2-butyl)-1-benzofuran-2-yl group, a benzothiazole-4,7-diyl group substituted with a 4,6-dimethyl-1-benzofuran-2-yl group, a benzothiazole-4,7-diyl group substituted with a 6-methyl-1-benzofuran-2-yl group, a benzothiazole-4,7-diyl group substituted with a 4,6,7-trimethyl-1-benzofuran-2-yl group, a benzothiazole-4,7-diyl group substituted with a 4,5,6-trimethyl-1-benzofuran-2-yl group, a benzothiazole-4,7-diyl group substituted with a 5-methyl-1-benzofuran-2-yl group, a benzothiazole-4,7-diyl group substituted with a 5-propyl-1-benzofuran-2-yl group, a benzothiazole-4,7-diyl group substituted with a 7-propyl-1-benzofuran-2-yl group, a benzothiazole-4,7-diyl group substituted with a 5-fluoro-1-benzofuran-2-yl group, a benzothiazole-4,7-diyl group substituted with a phenyl group, a benzothiazole-4,7-diyl group substituted with a 4-fluorophenyl group, a benzothiazole-4,7-diyl group substituted with a 4-nitrophenyl group, a benzothiazole-4,7-diyl group substituted with a 4-trifluoromethylphenyl group, a benzothiazole-4,7-diyl group substituted with a 4-cyanophenyl group, a benzothiazole-4,7-diyl group substituted with a 4-methanesulfonylphenyl group, a benzothiazole-4,7-diyl group substituted with a thiophene-2-yl group, a benzothiazole-4,7-diyl group substituted with a thiophene-3-yl group, a benzothiazole-4,7-diyl group substituted with a 5-methylthiophene-2-yl group, a benzothiazole-4,7-diyl group substituted with a 5-chlorothiophene-2-yl group, a benzothiazole-4,7-diyl group substituted with a thieno[3,2-b]thiophene-2-yl group, a benzothiazole-4,7-diyl group substituted with a 2-benzothiazolyl group, a benzothiazole-4,7-diyl group substituted with a 4-biphenyl group, a benzothiazole-4,7-diyl group substituted with a 4-propylbiphenyl group, a benzothiazole-4,7-diyl group substituted with a 4-thiazolyl group, a benzothiazole-4,7-diyl group substituted with a 1-phenylethylene-2-yl group, a benzothiazole-4,7-diyl group substituted with a 4-pyridyl group, a benzothiazole-4,7-diyl group substituted with a 2-furyl group, a benzothiazole-4,7-diyl group substituted with a naphtho[1,2-b]furan-2-yl group, a 1H-isoindole-1,3(2H)-dione-4,7-diyl group substituted with a 5-methoxy-2-benzothiazolyl group, a 1H-isoindole-1,3(2H)-dione-4,7-diyl group substituted with a phenyl group, a 1H-isoindole-1,3(2H)-dione-4,7-diyl group substituted with a 4-nitrophenyl group, and a 1H-isoindole-1,3(2H)-dione-4,7-diyl group substituted with a 2-thiazolyl group. Herein, $R^f$, $R^g$, and $R^h$ represent the same meanings as described above.

Among these, a group represented by the following formula (II) is more preferable as $Ar^1$-$D^1$.

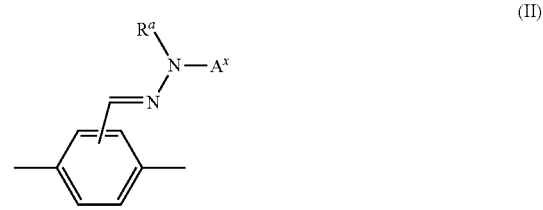

(II)

[In the formula (II), $A^x$ represents an organic group of 2 to 20 carbon atoms having at least one aromatic ring selected from the group consisting of an aromatic hydrocarbon ring and an aromatic heterocyclic ring, and $R^a$ represents a hydrogen atom or an organic group of 1 to 20 carbon atoms optionally having a substituent.]

In this specification, the partial structure represented by the following formula (i) means the partial structure represented by the following formula (ia) and/or (ib).

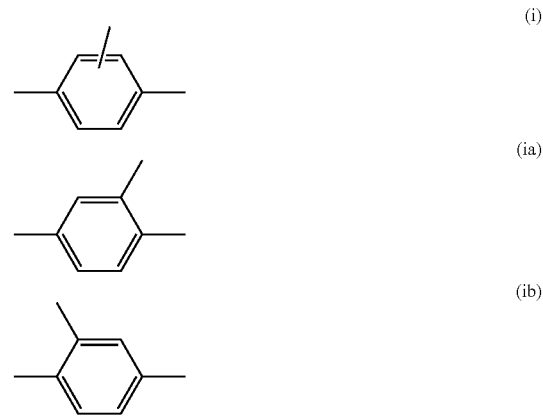

Herein, in "an organic group of 2 to 20 carbon atoms having at least one aromatic ring selected from the group consisting of an aromatic hydrocarbon ring and an aromatic heterocyclic ring" of $A^x$, the term "aromatic ring" means a cyclic structure having aromaticity in the broad sense based on the Huckel's rule, that is, a cyclic conjugated structure having (4n+2) π electrons, and a cyclic structure in which a lone electron pair of heteroatoms such as sulphur, oxygen, nitrogen and the like participate in a π electron system and exhibit aromaticity, and which is typified by thiophene, furan, benzothiazole or the like.

The organic group of 2 to 20 carbon atoms having at least one aromatic ring selected from the group consisting of an aromatic hydrocarbon ring and an aromatic heterocyclic ring of $A^x$ may have a plurality of aromatic rings, or may have a combination of an aromatic hydrocarbon ring and an aromatic heterocyclic ring.

Examples of the aromatic hydrocarbon ring of $A^x$ may include a benzene ring, a naphthalene ring, an anthracene ring, a phenanthrene ring, a pyrene ring, and a fluorene ring.

Among these, as the aromatic hydrocarbon ring, a benzene ring and a naphthalene ring are preferable.

Examples of the aromatic heterocyclic ring of $A^x$ may include a 1H-isoindole-1,3(2H)-dione ring, a 1-benzofuran ring, a 2-benzofuran ring, an acridine ring, an isoquinoline ring, an imidazole ring, an indole ring, an oxadiazole ring, an oxazole ring, an oxazolopyrazine ring, an oxazolopyridine ring, an oxazolopyridazyl ring, an oxazolopyrimidine ring, a quinazoline ring, a quinoxaline ring, a quinoline ring, a cinnoline ring, a thiadiazole ring, a thiazole ring, a thiazolopyrazine ring, a thiazolopyridine ring, a thiazolopyridazine ring, a thiazolopyrimidine ring, a thiophene ring, a triazine ring, a triazole ring, a naphthyridine ring, a pyrazine ring, a pyrazole ring, a pyranone ring, a pyran ring, a pyridine ring, a pyridazine ring, a pyrimidine ring, a pyrrole ring, a phenanthridine ring, a phthalazine ring, a furan ring, a benzo[c]thiophene ring, a benzisoxazole ring, a benzisothiazole ring, a benzimidazole ring, a benzoxadiazole ring, a benzoxazole ring, a benzothiadiazole ring, a benzothiazole ring, a benzothiophene ring, a benzotriazine ring, a benzotriazole ring, a benzopyrazole ring, a benzopyranone ring, a dihydropyran ring, a tetrahydropyran ring, a dihydrofuran ring, and a tetrahydrofuran ring.

Among these, as the aromatic heterocyclic ring, an aromatic heterocyclic ring of a single ring such as a furan ring, a thiophene ring, an oxazole ring, and a thiazole ring; and an aromatic heterocyclic ring of a fused ring such as a benzothiazole ring, a benzoxazole ring, a quinoline ring, a 1-benzofuran ring, a 2-benzofuran ring, a benzothiophene ring, a thiazolopyridine ring, and a thiazolopyrazine ring are preferable.

The aromatic ring contained in $A^x$ may have a substituent. Examples of such a substituent may include a halogen atom such as a fluorine atom and a chlorine atom; a cyano group; an alkyl group of 1 to 6 carbon atoms such as a methyl group, an ethyl group, and a propyl group; an alkenyl group of 2 to 6 carbon atoms such as a vinyl group and an allyl group; a halogenated alkyl group of 1 to 6 carbon atoms such as a trifluoromethyl group; a substituted amino group such as a dimethylamino group; an alkoxy group of 1 to 6 carbon atoms such as a methoxy group, an ethoxy group, and an isopropoxy group; a nitro group; an aromatic hydrocarbon ring group of 6 to 20 carbon atoms such as a phenyl group and a naphthyl group; —C(=O)—$R^b$; —C(=O)—$OR^b$; and —$SO_2R^d$. Herein, $R^b$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms optionally having a substituent. $R^d$ represents an alkyl group of 1 to 6 carbon atoms such as a methyl group or an ethyl group; or an aromatic hydrocarbon ring group of 6 to 20 carbon atoms optionally having a substituent such as a phenyl group, a 4-methylphenyl group, or a 4-methoxyphenyl group. Among these, as the substituent of the aromatic ring contained in $A^x$, a halogen atom, a cyano group, an alkyl group of 1 to 6 carbon atoms, and an alkoxy group of 1 to 6 carbon atoms are preferable.

$A^x$ may have a plurality of substituents selected from the substituents described above. When $A^x$ has a plurality of substituents, the substituents may be the same as or different from each other.

Examples of the alkyl group of 1 to 20 carbon atoms in the alkyl group of 1 to 20 carbon atoms optionally having a substituent of $R^b$ may include a methyl group, an ethyl group, a n-propyl group, an isopropyl group, a n-butyl group, an isobutyl group, a 1-methylpentyl group, a 1-ethylpentyl group, a sec-butyl group, a t-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms of the alkyl group of 1 to 20 carbon atoms optionally having a substituent is preferably 1 to 12, and more preferably 4 to 10.

Examples of the alkenyl group of 2 to 20 carbon atoms in the alkenyl group of 2 to 20 carbon atoms optionally having a substituent of $R^b$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, tridecenyl group, a tetradecenyl group, a pentadecenyl group, a hexadecenyl group, a heptadecenyl group, an octadecenyl group, a nonadenyl group, and an icosenyl group.

It is preferable that the number of carbon atoms of the alkenyl group of 2 to 20 carbon atoms optionally having a substituent is 2 to 12.

Examples of the substituents of the alkyl group of 1 to 20 carbon atoms and the alkenyl group of 2 to 20 carbon atoms of $R^b$ may include: a halogen atom such as a fluorine atom and a chlorine atom; a cyano group; a substituted amino group such as a dimethylamino group; an alkoxy group of 1 to 20 carbon atoms such as a methoxy group, an ethoxy group, an isopropoxy group, and a butoxy group; an alkoxy group of 1 to 12 carbon atoms substituted with an alkoxy group of 1 to 12 carbon atoms such as a methoxymethoxy group and a methoxyethoxy group; a nitro group; an aromatic hydrocarbon ring group of 6 to 20 carbon atoms such as a phenyl group and a naphthyl group; an aromatic heterocyclic ring group of 2 to 20 carbon atoms such as a triazolyl group, a pyrrolyl group, a furanyl group, and a thiophenyl group; a cycloalkyl group of 3 to 8 carbon atoms such as a cyclopropyl group, a cyclopentyl group, and a cyclohexyl group; a cycloalkyloxy group of 3 to 8 carbon atoms such as a cyclopentyloxy group and a cyclohexyloxy group; a cyclic ether group of 2 to 12 carbon atoms such as a tetrahydrofuranyl group, a tetrahydropyranyl group, a dioxolanyl group, and a dioxanyl group; an aryloxy group of 6 to 14 carbon atoms such as a phenoxy group and a naphthoxy group; a fluoroalkyl group of 1 to 12 carbon atoms in which at least one hydrogen atom is substituted with a fluorine atom such as a trifluoromethyl group, a pentafluoroethyl group, and —$CH_2CF_3$; a benzofuryl group; a benzopyranyl group; a benzodioxolyl group; and a benzodioxanyl group. Among these, as the substituents of the alkyl group of 1 to 20 carbon atoms and the alkenyl group of 2 to 20 carbon atoms of $R^b$, a halogen atom such as a fluorine atom and a chlorine atom; a cyano group; an alkoxy group of 1 to 20 carbon atoms such as a methoxy group, an ethoxy group, an isopropoxy group, and a butoxy group; a nitro group; an aromatic hydrocarbon ring group of 6 to 20 carbon atoms such as a phenyl group and a naphthyl group; an aromatic heterocyclic ring group of 2 to 20 carbon atoms such as a furanyl group and a thiophenyl group; a cycloalkyl group of 3 to 8 carbon atoms such as a cyclopropyl group, a cyclopentyl group, and a cyclohexyl group; and a fluoroalkyl group of 1 to 12 carbon atoms in which at least one hydrogen atom is substituted with a fluorine atom such as a trifluoromethyl group, a pentafluoroethyl group, and —$CH_2CF_3$ are preferable.

The alkyl group of 1 to 20 carbon atoms and the alkenyl group of 2 to 20 carbon atoms of $R^b$ may have a plurality of substituents selected from the substituents described above. When the alkyl group of 1 to 20 carbon atoms and the alkenyl group of 2 to 20 carbon atoms of $R^b$ have a plurality of substituents, the plurality of substituents may be the same as or different from each other.

Examples of the cycloalkyl group of 3 to 12 carbon atoms in the cycloalkyl group of 3 to 12 carbon atoms optionally having a substituent of $R^b$ may include a cyclopropyl group, a cyclobutyl group, a cyclopentyl group, a cyclohexyl group, and a cyclooctyl group. Among these, a cyclopentyl group and a cyclohexyl group are preferable.

Examples of the substituent of the cycloalkyl group of 3 to 12 carbon atoms of $R^b$ may include a halogen atom such as a fluorine atom and a chlorine atom; a cyano group; a substituted amino group such as a dimethylamino group; an alkyl group of 1 to 6 carbon atoms such as a methyl group, an ethyl group, and a propyl group; an alkoxy group of 1 to 6 carbon atoms such as a methoxy group, an ethoxy group, and an isopropoxy group; a nitro group; and an aromatic hydrocarbon group of 6 to 20 carbon atoms such as a phenyl group and a naphthyl group. Among these, as the substituent of the cycloalkyl group of 3 to 12 carbon atoms of $R^b$, a halogen atom such as a fluorine atom and a chlorine atom; a cyano group; an alkyl group of 1 to 6 carbon atoms such as a methyl group, an ethyl group, and a propyl group; an alkoxy group of 1 to 6 carbon atoms such as a methoxy group, an ethoxy group, and an isopropoxy group; a nitro group; and an aromatic hydrocarbon group of 6 to 20 carbon atoms such as a phenyl group and a naphthyl group are preferable.

The cycloalkyl group of 3 to 12 carbon atoms of $R^b$ may have a plurality of substituents. When the cycloalkyl group of 3 to 12 carbon atoms of $R^b$ has a plurality of substituents, the plurality of substituents may be the same as or different from each other.

Examples of the aromatic hydrocarbon ring group of 5 to 12 carbon atoms in the aromatic hydrocarbon ring group of 5 to 12 carbon atoms optionally having a substituent of $R^b$ may include a phenyl group, a 1-naphthyl group, and a 2-naphthyl group. Among these, a phenyl group is preferable.

Examples of the substituent of the aromatic hydrocarbon ring group of 5 to 12 carbon atoms optionally having a substituent of $R^b$ may include a halogen atom such as a fluorine atom and a chlorine atom; a cyano group; a substituted amino group such as a dimethylamino group; an alkoxy group of 1 to 20 carbon atoms such as a methoxy group, an ethoxy group, an isopropoxy group, and a butoxy group; an alkoxy group of 1 to 12 carbon atoms substituted with an alkoxy group of 1 to 12 carbon atoms such as a methoxymethoxy group and a methoxyethoxy group; a nitro group; an aromatic hydrocarbon ring group of 6 to 20 carbon atoms such as a phenyl group and a naphthyl group; an aromatic heterocyclic ring group of 2 to 20 carbon atoms such as a triazolyl group, a pyrrolyl group, a furanyl group, and a thiophenyl group; a cycloalkyl group of 3 to 8 carbon atoms such as a cyclopropyl group, a cyclopentyl group, and a cyclohexyl group; a cycloalkyloxy group of 3 to 8 carbon atoms such as a cyclopentyloxy group and a cyclohexyloxy group; a cyclic ether group of 2 to 12 carbon atoms such as a tetrahydrofuranyl group, a tetrahydropyranyl group, a dioxolanyl group, and a dioxanyl group; an aryloxy group of 6 to 14 carbon atoms such as a phenoxy group and a naphthoxy group; a fluoroalkyl group of 1 to 12 carbon atoms in which at least one hydrogen atom is substituted with a fluorine atom such as a trifluoromethyl group, a pentafluoroethyl group, and —CH$_2$CF$_3$; a benzofuryl group; a benzopyranyl group; a benzodioxolyl group; and a benzodioxanyl group. Among these, as the substituent of the aromatic hydrocarbon ring group of 5 to 12 carbon atoms, a halogen atom such as a fluorine atom and a chlorine atom; a cyano group; an alkoxy group of 1 to 20 carbon atoms such as a methoxy group, an ethoxy group, an isopropoxy group, and a butoxy group; a nitro group; an aromatic hydrocarbon ring group of 6 to 20 carbon atoms such as a phenyl group and a naphthyl group; an aromatic heterocyclic ring group of 2 to 20 carbon atoms such as a furanyl group and a thiophenyl group; a cycloalkyl group of 3 to 8 carbon atoms such as a cyclopropyl group, a cyclopentyl group, and a cyclohexyl group; and at least one substituent selected from a fluoroalkyl group of 1 to 12 carbon atoms in which at least one hydrogen atom is substituted with a fluorine atom such as a trifluoromethyl group, a pentafluoroethyl group, and —CH$_2$CF$_3$ are preferable.

The aromatic hydrocarbon ring group of 5 to 12 carbon atoms may have a plurality of substituents. When the aromatic hydrocarbon ring group of 5 to 12 carbon atoms has a plurality of substituents, the substituents may be the same as or different from each other.

Herein, the aromatic ring contained in $A^x$ may have a plurality of the same or different substituents, and two adjacent substituents may be bonded together to form a ring. The ring formed may be a single ring or a fused polycycle, and may be an unsaturated or saturated ring.

The "carbon number" of the organic group of 2 to 20 carbon atoms of $A^x$ means the total carbon number of the entire organic group not including the carbon atoms of the substituents.

Examples of the organic group of 2 to 20 carbon atoms having at least one aromatic ring selected from the group consisting of an aromatic hydrocarbon ring and an aromatic heterocyclic ring of $A^x$ may include an aromatic hydrocarbon ring group of 6 to 20 carbon atoms such as a phenyl group, a naphthyl group, an anthracenyl group, a phenanthrenyl group, a pyrenyl group, and a fluorenyl group; an aromatic heterocyclic ring group of 2 to 20 carbon atoms such as a phthalimide group, a 1-benzofuranyl group, a 2-benzofuranyl group, an acridinyl group, an isoquinolinyl group, an imidazolyl group, an indolinyl group, a flazanyl group, an oxazolyl group, an oxazolopyrazinyl group, an oxazolopyridinyl group, an oxazolopyridazinyl group, an oxazolopyrimidinyl group, a quinazolinyl group, a quinoxalinyl group, a quinolyl group, a cinnolinyl group, a thiadiazolyl group, a thiazolyl group, a thiazolopyrazinyl group, a thiazolopyridinyl group, a thiazolopyridazinyl group, a thiazolopyrimidinyl group, a thienyl group, a triazinyl group, a triazolyl group, a naphthyridinyl group, a pyrazinyl group, a pyrazolyl group, a pyranonyl group, a pyranyl group, a pyridyl group, a pyridazinyl group, a pyrimidinyl group, a pyrrolyl group, a phenanthridinyl group, a phthalazinyl group, a furanyl group, a benzo[c]thienyl group, a benzisoxazolyl group, a benzisothiazolyl group, a benzimidazolyl group, a benzoxazolyl group, a benzoxazolyl group, a benzothiadiazolyl group, a benzothiazolyl group, a benzothiophenyl group, a benzotriazinyl group, a benzotriazolyl group, a benzopyrazolyl group, a benzopyranonyl group, a dihydropyranyl group, a tetrahydropyranyl group, a dihydrofuranyl group, and a tetrahydrofuranyl group; a hydrocarbon ring group having at least one aromatic ring selected from the group consisting of an aromatic hydrocarbon ring and an aromatic heterocyclic ring; a heterocyclic ring group having at least one aromatic ring selected from the group consisting of an aromatic hydrocarbon ring and an aromatic heterocyclic ring; an alkyl group of 3 to 20 carbon atoms having at least one aromatic ring selected from the group consisting of an aromatic hydrocarbon ring and an aromatic heterocyclic ring; an alkenyl group of 4 to 20 carbon atoms having at least one aromatic ring selected from the group consisting of an aromatic hydrocarbon ring and an aromatic heterocyclic ring; and an alkynyl group of 4 to 20 carbon atoms having at least one aromatic ring selected from the group consisting of an aromatic hydrocarbon ring and an aromatic heterocyclic ring.

Examples of the aromatic hydrocarbon ring and the aromatic heterocyclic ring in the hydrocarbon ring group having at least one aromatic ring selected from the group consisting of an aromatic hydrocarbon ring and an aromatic heterocyclic ring; the heterocyclic ring group having at least one aromatic ring selected from the group consisting of an aromatic hydrocarbon ring and an aromatic heterocyclic ring; the alkyl group of 3 to 20 carbon atoms having at least one aromatic ring selected from the group consisting of an aromatic hydrocarbon ring and an aromatic heterocyclic ring; the alkenyl group of 4 to 20 carbon atoms having at least one aromatic ring selected from the group consisting of an aromatic hydrocarbon ring and an aromatic heterocyclic ring; and the alkynyl group of 4 to 20 carbon atoms having at least one aromatic ring selected from the group consisting of an aromatic hydrocarbon ring and an aromatic heterocyclic ring may include the same ones as those listed as specific examples of the aromatic hydrocarbon ring and the aromatic heterocyclic ring of the above-described $D^1$.

The organic group described above may have one or a plurality of substituents. When the organic group has a plurality of substituents, the plurality of substituents may be the same as or different from each other.

Examples of such a substituent may include a halogen atom such as a fluorine atom and a chlorine atom; a cyano group; an alkyl group of 1 to 6 carbon atoms such as a methyl group, an ethyl group, and a propyl group; an alkenyl group of 2 to 6 carbon atoms such as a vinyl group and an allyl group; a halogenated alkyl group of 1 to 6 carbon atoms such as a trifluoromethyl group; a substituted amino group such as a dimethylamino group; an alkoxy group of 1 to 6 carbon atoms such as a methoxy group, an ethoxy group, and an isopropoxy group; a nitro group; an aromatic hydrocarbon ring group of 6 to 20 carbon atoms such as a phenyl group and a naphthyl group; —C(=O)—$R^b$; —C(=O)—$OR^b$; and —$SO_2R^d$. Herein, $R^b$ and $R^d$ represent the same meanings as described above.

Among these, as the substituent contained in the organic group of $A^x$, at least one substituent selected from a halogen atom, a cyano group, an alkyl group of 1 to 6 carbon atoms, and an alkoxy group of 1 to 6 carbon atoms is preferable.

Preferable specific examples of the organic group of 2 to 20 carbon atoms having at least one aromatic ring selected from the group consisting of an aromatic hydrocarbon ring and an aromatic heterocyclic ring as $A^x$ are shown below. However, the present invention is not limited to the following examples. In the formula below, "—" represents a bond with an N atom extending from any position of the ring (i.e., an N atom bonded to $A^x$ in the formula (II)).

1) Aromatic Hydrocarbon Ring Group

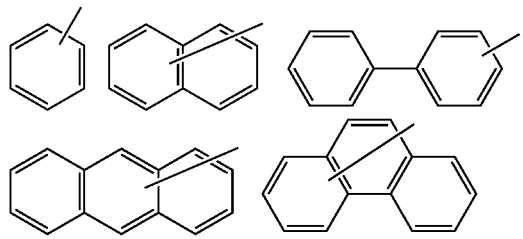

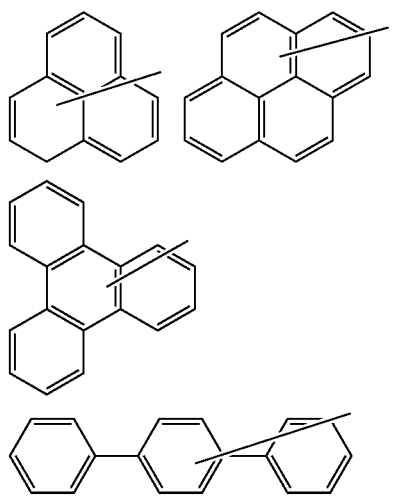

-continued

2) Aromatic Heterocyclic Ring Group

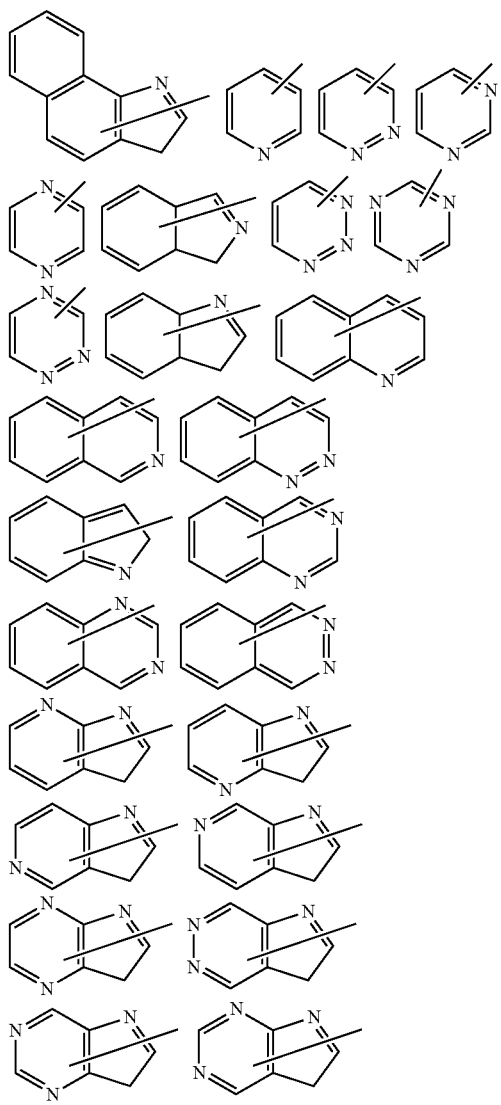

-continued

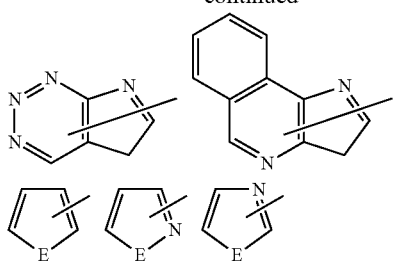

[In each of the formulas, E represents —$NR^z$—, an oxygen atom, or a sulphur atom, wherein $R^z$ represents a hydrogen atom; or an alkyl group of 1 to 6 carbon atoms such as a methyl group, an ethyl group, or a propyl group.]

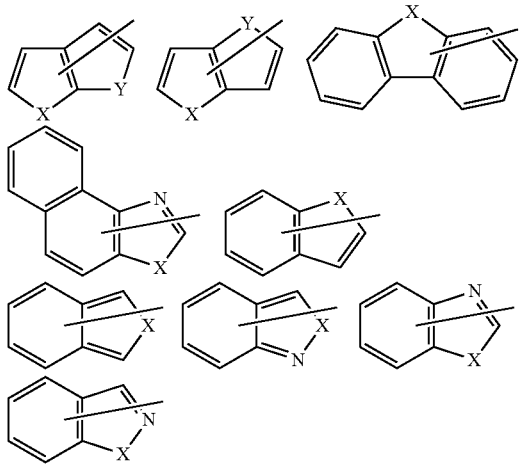

[In each of the formulas, X and Y each independently represent —$NR^z$—, an oxygen atom, a sulfur atom, —SO—, or —$SO_2$—, wherein $R^z$ represents a hydrogen atom; or an alkyl group of 1 to 6 carbon atoms such as a methyl group, an ethyl group, or a propyl group.]

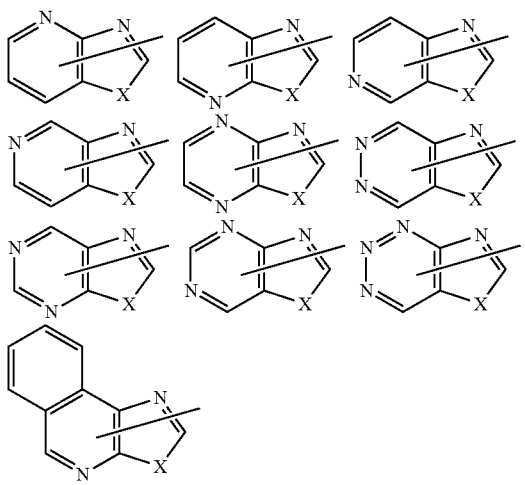

[In each of the formulas, X represents the same meaning as described above.]

3) Hydrocarbon Ring Group Having at Least One Aromatic Ring

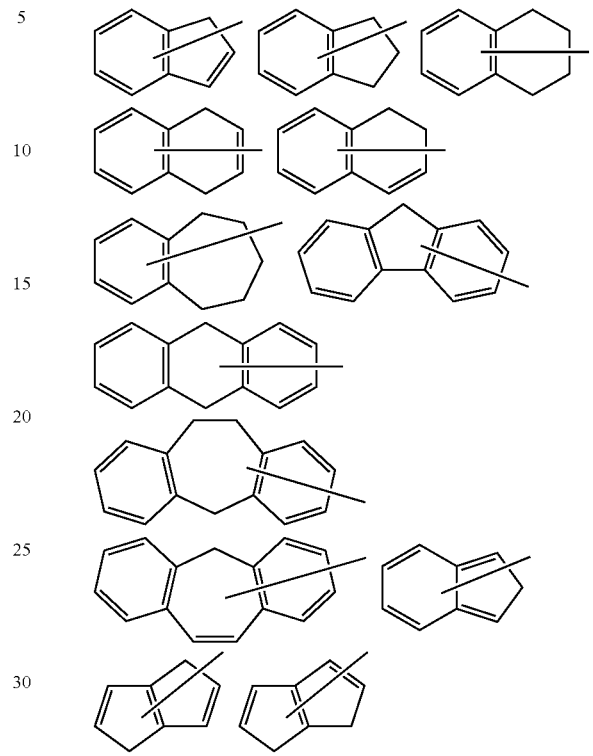

4) Heterocyclic Ring Group Having at Least One Aromatic Ring.

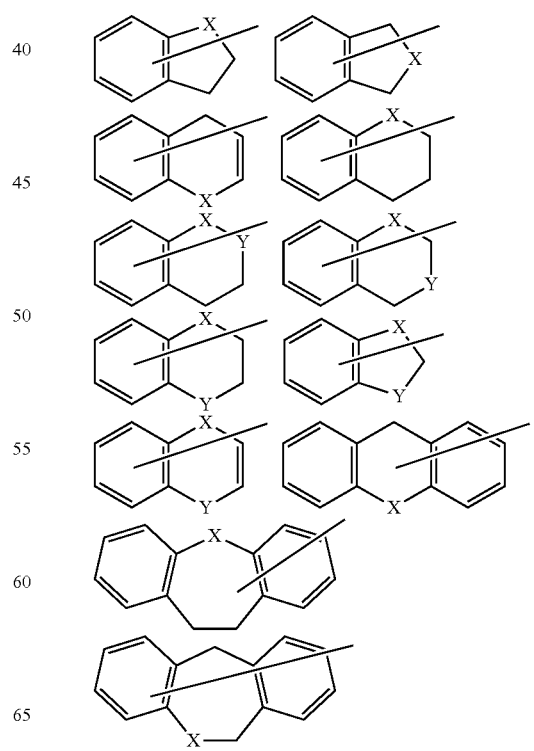

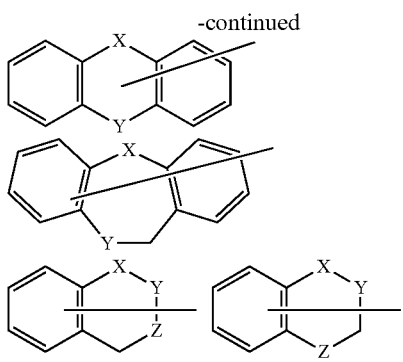

[each of the formulas, X and Y represent the same meanings as described above, and Z represents —NR$^z$—, an oxygen atom, or a sulfur atom, wherein R$^z$ represents the same meanings as those described above (however, in each of the formulas, an oxygen atom, a sulfur atom, —SO—, and —SO$^2$— are not adjacent to each other).]

5) Alkyl Group Having at Least One Aromatic Ring Selected from the Group Consisting of an Aromatic Hydrocarbon Ring and an Aromatic Heterocyclic Ring

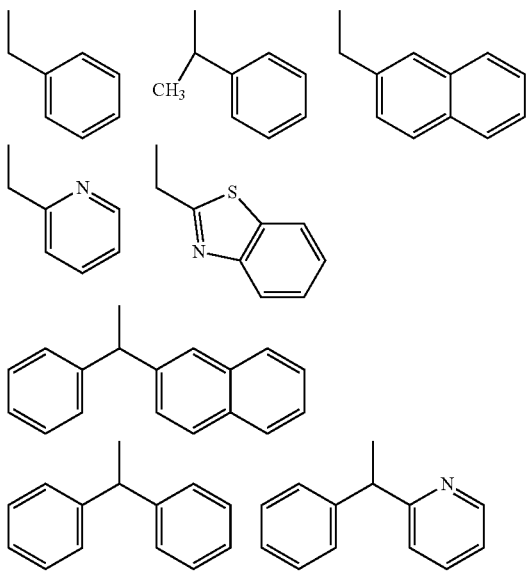

6) Alkenyl Group Having at Least One Aromatic Ring Selected from the Group Consisting of an Aromatic Hydrocarbon Ring and an Aromatic Heterocyclic Ring

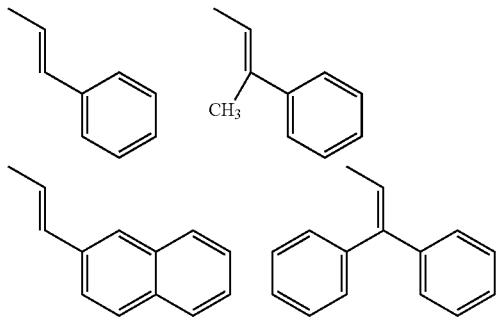

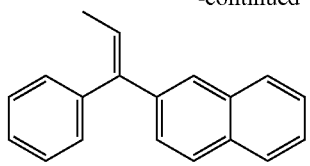

7) Alkynyl Group Having at Least One Aromatic Ring Selected from the Group Consisting of an Aromatic Hydrocarbon Ring and an Aromatic Heterocyclic Ring

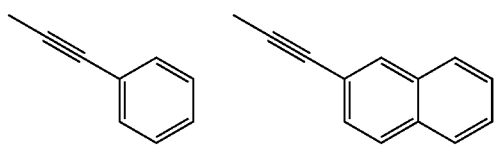

The ring contained in the above-mentioned preferable specific examples of A$^x$ may have one or a plurality of substituents. When the ring of the preferable A$^x$ has a plurality of substituents, the plurality of substituents may be the same as or different from each other. Examples of such a substituent may include a halogen atom such as a fluorine atom and a chlorine atom; a cyano group; an alkyl group of 1 to 6 carbon atoms such as a methyl group, an ethyl group, and a propyl group; an alkenyl group of 2 to 6 carbon atoms such as a vinyl group and an allyl group; a halogenated alkyl group of 1 to 6 carbon atoms such as a trifluoromethyl group; a substituted amino group such as a dimethylamino group; an alkoxy group of 1 to 6 carbon atoms such as a methoxy group, an ethoxy group, and an isopropoxy group; a nitro group; an aromatic hydrocarbon ring group of 6 to 20 carbon atoms such as a phenyl group and a naphthyl group; —C(=O)—R$^b$; —C(=O)—OR$^b$; and —SO$_2$R$^d$.

Herein, R$^b$ and R$^d$ represent the same meanings as described above. Among these, as the substituent contained in the ring of A$^x$, a halogen atom, a cyano group, an alkyl group of 1 to 6 carbon atoms, and an alkoxy group of 1 to 6 carbon atoms are preferable.

Herein, more preferable specific examples of A$^x$ will be described below. However, A$^x$ is not limited to the following examples.

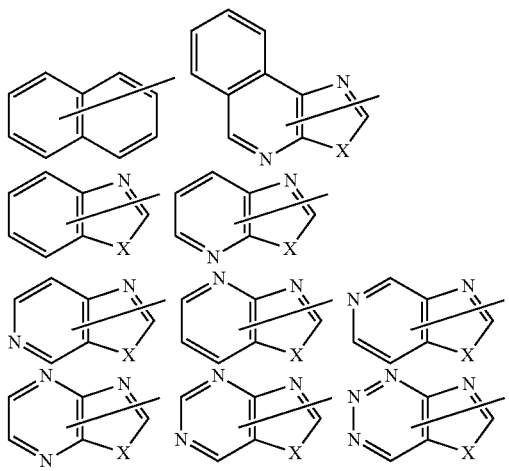

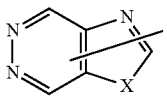

[In each of the formulas, X represents the same meaning as described above.]

As described above, the ring described above may have one or a plurality of substituents. When the ring has a plurality of substituents, the plurality of substituents may be the same as or different from each other. Examples of such a substituent may include a halogen atom such as a fluorine atom, a chlorine atom, and a bromine atom; an alkyl group of 1 to 6 carbon atoms such as a methyl group, an ethyl group, and a propyl group; a cyano group; an alkenyl group of 2 to 6 carbon atoms such as a vinyl group and an allyl group; a halogenated alkyl group of 1 to 6 carbon atoms such as a trifluoromethyl group and a pentafluoroethyl group; a substituted amino group such as a dimethylamino group; an alkoxy group of 1 to 6 carbon atoms such as a methoxy group, an ethoxy group, and an isopropoxy group; a nitro group; an aromatic hydrocarbon ring group of 6 to 20 carbon atoms such as a phenyl group and a naphthyl group; —C(=O)—R$^b$; —C(=O)—R$^b$; and —SO$_2$R$^d$. Herein, R$^b$ and R$^d$ represent the same meanings as described above.

Among these, as the substituent contained in the ring, a halogen atom, a cyano group, an alkyl group of 1 to 6 carbon atoms, and an alkoxy group of 1 to 6 carbon atoms are preferable.

As A$^x$, a group represented by the following formula (III) is more preferable.

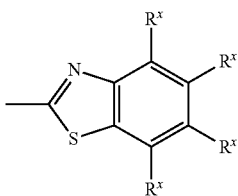

(III)

Herein, in the aforementioned formula (III), R$^X$ represents a hydrogen atom; a halogen atom such as a fluorine atom, a chlorine atom, or a bromine atom; an alkyl group of 1 to 6 carbon atoms such as a methyl group, an ethyl group, or a propyl group; a cyano group; a nitro group; a fluoroalkyl group of 1 to 6 carbon atoms such as a trifluoromethyl group or a pentafluoroethyl group; an alkoxy group of 1 to 6 carbon atoms such as a methoxy group, an ethoxy group, or an isopropoxy group; or —C(=O)—O—R$^b$. As described above, R$^b$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms optionally having a substituent.

The plurality of R$^X$'s may be all the same as or different from each other, and any C—R$^X$ constituting a ring may be replaced with a nitrogen atom.

Specific examples of the group represented by the above formula (III) in which C—R$^X$ of the group is replaced with a nitrogen atom are shown below. However, the group in which C—R$^X$ is replaced with a nitrogen atom is not limited thereto.

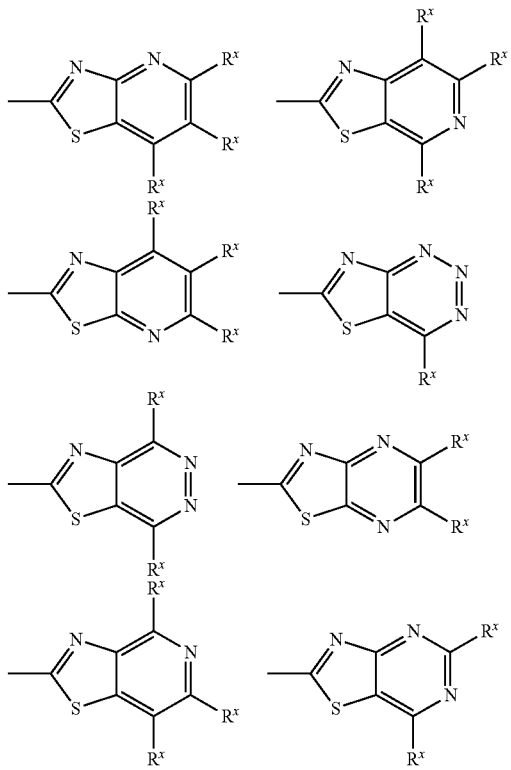

[In each of the formulas, R$^X$ represents the same meanings as defined above.]

Among these, those in which all R$^X$'s of the group represented by the above-mentioned formula (III) are hydrogen atoms are preferable as A$^x$.

The organic group of 1 to 20 carbon atoms optionally having a substituent of R$^a$ of the divalent group represented by the aforementioned formula (II) is not particularly limited, and examples thereof may include an alkyl group of 1 to 20 carbon atoms optionally having a substituent, an alkenyl group of 2 to 20 carbon atoms optionally having a substituent, an alkynyl group of 2 to 20 carbon atoms optionally having a substituent, a cycloalkyl group of 3 to 12 carbon atoms optionally having a substituent, —C(=O)—R$^b$, —SO$_2$—R$^d$, —C(=S)NH—R$^i$, an aromatic hydrocarbon ring group of 6 to 20 carbon atoms optionally having a substituent, and an aromatic heterocyclic ring group of 2 to 20 carbon atoms optionally having a substituent.

Herein, R$^b$ and R$^d$ represent the same meanings as described above. In addition, R$^i$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an aromatic hydrocarbon ring group of 5 to 20 carbon atoms optionally having a substituent, or an aromatic heterocyclic ring group of 5 to 20 carbon atoms optionally having a substituent.

Specific examples of the alkyl group of 1 to 20 carbon atoms and the substituent thereof in the alkyl group of 1 to 20 carbon atoms optionally having a substituent, the alkenyl group of 2 to 20 carbon atoms and the substituent thereof in the alkenyl group of 2 to 20 carbon atoms optionally having a substituent, and the cycloalkyl group of 3 to 12 carbon atoms and the substituent thereof in the cycloalkyl group of 3 to 12 carbon atoms optionally having a substituent of R$^i$ may include the same ones as those listed as the specific examples of the alkyl group of 1 to 20 carbon atoms and the substituent thereof, the alkenyl group of 2 to 20 carbon atoms and the substituent thereof, and the cycloalkyl group of 3 to 12 carbon atoms and the substituent thereof of $R^b$. Examples of the aromatic hydrocarbon ring group of 5 to 20 carbon atoms optionally having a substituent of $R^i$ may include a phenyl group, a 1-naphthyl group, and a 2-naphthyl group. Further, examples of the aromatic heterocyclic ring group of 5 to 20 carbon atoms optionally having a substituent may include a pyridinyl group, and a quinolyl group. Examples of the substituents of the aromatic hydrocarbon ring group and the aromatic heterocyclic ring group may include the same ones as those exemplified as the substituents of the organic group of 2 to 20 carbon atoms of $A^x$.

Examples of the alkyl group of 1 to 20 carbon atoms in the alkyl group of 1 to 20 carbon atoms optionally having a substituent of $R^a$ may include a methyl group, an ethyl group, a n-propyl group, an isopropyl group, a n-butyl group, an isobutyl group, a 1-methylpentyl group, a 1-ethylpentyl group, a sec-butyl group, a t-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms of the alkyl group of 1 to 20 carbon atoms optionally having a substituent is preferably 1 to 12, and more preferably 1 to 10.

Examples of the alkenyl group of 2 to 20 carbon atoms in the alkenyl group of 2 to 20 carbon atoms optionally having a substituent of $R^a$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadenyl group, and an icosenyl group.

It is preferable that the number of carbon atoms of the alkenyl group of 2 to 20 carbon atoms optionally having a substituent is 2 to 12.

Examples of the alkynyl group of 2 to 20 carbon atoms in the alkynyl group of 2 to 20 carbon atoms optionally having a substituent of $R^a$ may include an ethynyl group, a propynyl group, a 2-propynyl group (propargyl group), a butynyl group, a 2-butynyl group, a 3-butynyl group, a pentinyl group, a 2-pentinyl group, a hexynyl group, a 5-hexynyl group, a heptinyl group, an octinyl group, a 2-octynyl group, a nonanyl group, a decanyl group, and a 7-decanyl group.

Examples of the cycloalkyl group of 3 to 12 carbon atoms in the cycloalkyl group of 3 to 12 carbon atoms optionally having a substituent of $R^a$ may include a cyclopropyl group, a cyclobutyl group, a cyclopentyl group, a cyclohexyl group, and a cyclooctyl group.

Examples of the substituents of the alkyl group of 1 to 20 carbon atoms, the alkenyl group of 2 to 20 carbon atoms, and the alkynyl group of 2 to 20 carbon atoms of $R^a$ may include: a halogen atom, such as a fluorine atom and a chlorine atom; a cyano group; a substituted amino group such as a dimethylamino group; an alkoxy group of 1 to 20 carbon atoms such as a methoxy group, an ethoxy group, an isopropoxy group, and a butoxy group; an alkoxy group of 1 to 12 carbon atoms substituted with an alkoxy group of 1 to 12 carbon atoms such as a methoxymethoxy group and a methoxyethoxy group; a nitro group; an aromatic hydrocarbon ring group of 6 to 20 carbon atoms such as a phenyl group and a naphthyl group; an aromatic heterocyclic ring group of 2 to 20 carbon atoms such as a triazolyl group, a pyrrolyl group, a furanyl group, and a thiophenyl group; a cycloalkyl group of 3 to 8 carbon atoms such as a cyclopropyl group, a cyclopentyl group, and a cyclohexyl group; a cycloalkyloxy group of 3 to 8 carbon atoms such as a cyclopentyloxy group and a cyclohexyloxy group; a cyclic ether group of 2 to 12 carbon atoms such as a tetrahydrofuranyl group, a tetrahydropyranyl group, a dioxolanyl group, and a dioxanyl group; an aryloxy group of 6 to 14 carbon atoms such as a phenoxy group and a naphthoxy group; a fluoroalkyl group of 1 to 12 carbon atoms in which at least one hydrogen atom is substituted with a fluorine atom such as a trifluoromethyl group, a pentafluoroethyl group, and —$CH_2CF_3$; a benzofuryl group; a benzopyranyl group; a benzodioxolyl group; a benzodioxanyl group; —$C(=O)$—$R^b$; —$C(=O)$—$OR^b$; —$SO_2R^d$; —$SR^b$; an alkoxy group of 1 to 12 carbon atoms substituted with —$SR^b$; and a hydroxyl group. Herein, $R^b$ and $R^d$ represent the same meanings as described above.

The alkyl group of 1 to 20 carbon atoms, the alkenyl group of 2 to 20 carbon atoms, and the alkynyl group of 2 to 20 carbon atoms of $R^a$ may have a plurality of substituents described above, and when a plurality of substituents are contained, the plurality of substituents may be the same as or different from each other.

Examples of the substituent of the cycloalkyl group of 3 to 12 carbon atoms of $R^a$ may include a halogen atom such as a fluorine atom and a chlorine atom; a cyano group; a substituted amino group such as a dimethylamino group; an alkyl group of 1 to 6 carbon atoms such as a methyl group, an ethyl group, and a propyl group; an alkoxy group of 1 to 6 carbon atoms such as a methoxy group, an ethoxy group, and an isopropoxy group; a nitro group; an aromatic hydrocarbon ring group of 6 to 20 carbon atoms such as a phenyl group and a naphthyl group; a cycloalkyl group of 3 to 8 carbon atoms such as a cyclopropyl group, a cyclopentyl group, and a cyclohexyl group; —$C(=O)$—$R^b$; —$C(=O)$—$OR^b$; —$SO_2R^d$; and a hydroxyl group. Herein, $R^b$ and $R^d$ represent the same meanings as described above.

The cycloalkyl group of 3 to 12 carbon atoms of $R^a$ may have a plurality of the substituents described above, and when a plurality of the substituents are contained, the plurality of the substituents may be the same as or different from each other.

Examples of the aromatic hydrocarbon ring group of 6 to 20 carbon atoms, the aromatic heterocyclic ring group of 2 to 20 carbon atoms, and the substituents thereof of $R^a$ may include the same ones as those listed as the aromatic hydrocarbon ring group and the aromatic heterocyclic ring group of $A^x$ as well as the substituents thereof, respectively.

Among these described above, as $R^a$, a hydrogen atom, an alkyl group of 1 to 20 carbon atoms optionally having a substituent, an alkenyl group of 2 to 20 carbon atoms optionally having a substituent, an alkynyl group of 2 to 20 carbon atoms optionally having a substituent, a cycloalkyl group of 5 to 20 carbon atoms optionally having a substituent, an aromatic hydrocarbon ring group of 6 to 18 carbon atoms optionally having a substituent, and an aromatic heterocyclic ring group of 5 to 18 carbon atoms optionally having a substituent are preferable, and a hydrogen atom, an alkyl group of 1 to 10 carbon atoms optionally having a substituent, an alkenyl group of 2 to 10 carbon atoms optionally having a substituent, an alkynyl group of 2 to 10 carbon atoms optionally having a substituent, a cycloalkyl group of 5 to 10 carbon atoms optionally having a substituent, and an aromatic hydrocarbon ring group of 6 to 12 carbon atoms optionally having a substituent are more preferable. Alternatively, it is preferable that $R^a$ is an alkyl group of 1 to 20 carbon atoms optionally having a substituent, an alkenyl group of 2 to 20 carbon atoms optionally having a substituent, an alkynyl group of 2 to 20 carbon atoms optionally having a substituent, or an aromatic group of 6 to 18 carbon atoms optionally having a substituent.

In the aforementioned formula (I), $Z^{11}$ and $Z^{12}$ each independently represent —CO—O—, —O—CO—, —NR$^{31}$—CO—, or —CO—NR$^{32}$—. Herein, $R^{31}$ and $R^{32}$ each independently represent a hydrogen atom or an alkyl group of 1 to 6 carbon atoms. Among these, it is preferable that $Z^{11}$ is —CO—O—. It is preferable that $Z^{12}$ is —O—CO—.

Further, in the formula (I), $A^{11}$ and $A^{12}$ each independently represent a cyclic aliphatic group optionally having a substituent, or an aromatic group optionally having a substituent. Among these, it is preferable that $A^{11}$ and $A^{12}$ are each a cyclic aliphatic group optionally having a substituent.

The cyclic aliphatic group optionally having a substituent is an unsubstituted divalent cyclic aliphatic group or a divalent cyclic aliphatic group having a substituent. The divalent cyclic aliphatic group is a divalent aliphatic group of usually 5 to 20 carbon atoms having a cyclic structure.

Specific examples of the divalent cyclic aliphatic groups of $A^{11}$ and $A^{12}$ may include a cycloalkanediyl group of 5 to 20 carbon atoms such as cyclopentane-1,3-diyl, cyclohexane-1,4-diyl, 1,4-cycloheptane-1,4-diyl, and cyclooctane-1,5-diyl; and a bicycloalkanediyl group of 5 to 20 carbon atoms such as decahydronaphthalene-1,5-diyl and decahydronaphthalene-2,6-diyl.

The aromatic group optionally having a substituent is an unsubstituted divalent aromatic group or a divalent aromatic group having a substituent. The divalent aromatic group is a divalent aromatic group of usually 2 to 20 carbon atoms having an aromatic ring structure.

Specific examples of the divalent aromatic groups of $A^{11}$ and $A^{12}$ may include a divalent aromatic hydrocarbon ring group of 6 to 20 carbon atoms such as a 1,4-phenylene group, a 1,4-naphthylene group, a 1,5-naphthylene group, a 2,6-naphthylene group, and a 4,4'-biphenylene group; and a divalent aromatic heterocyclic ring group of 2 to 20 carbon atoms such as furan-2,5-diyl, thiophene-2,5-diyl, pyridine-2,5-diyl, and pyrazine-2,5-diyl.

Further, examples of the substituents in the divalent cyclic aliphatic group and the divalent aromatic group of $A^{11}$ and $A^{12}$ may include a halogen atom such as a fluorine atom, a chlorine atom, and a bromine atom; an alkyl group of 1 to 6 carbon atoms such as a methyl group and an ethyl group; an alkoxy group of 1 to 5 carbon atoms such as a methoxy group and an isopropoxy group; a nitro group; and a cyano group. The cyclic aliphatic group and the aromatic group may have at least one substituent selected from the substituents described above. When a plurality of substituents are contained, the respective substituents may be the same as or different from each other.

In the formula (I), $L^{11}$ and $L^{12}$ each independently represent a single bond, —O—, —CO—, —CO—O—, —O—CO—, —NR$^{21}$—CO—, —CO—NR$^{22}$—, —O—CO—O—, —NR$^{23}$—CO—O—, —O—CO—NR$^{24}$—, or —NR$^{25}$—CO—NR$^{26}$—. Herein, $R^{21}$ to $R^{26}$ each independently represent a hydrogen atom or an alkyl group of 1 to 6 carbon atoms. Among these, it is preferable that $L^{11}$ and $L^{12}$ are each independently —O—, —CO—O—, or —O—CO—.

Examples of the alkyl group of 1 to 6 carbon atoms of $R^{21}$ to $R^{26}$ described above may include a methyl group, an ethyl group, a propyl group, and an isopropyl group.

In the formula (I), $B^{11}$ and $B^{12}$ each independently represent a cyclic aliphatic group optionally having a substituent, or an aromatic group optionally having a substituent. Among these, it is preferable that $B^{11}$ and $B^{12}$ are an aromatic group optionally having a substituent.

Herein, the cyclic aliphatic group optionally having a substituent is an unsubstituted divalent cyclic aliphatic group or a divalent cyclic aliphatic group having a substituent. The divalent cyclic aliphatic group is a divalent aliphatic group of usually 5 to 20 carbon atoms having a cyclic structure.

Specific examples of the divalent cyclic aliphatic groups of $B^{11}$ and $B^{12}$ may include the same ones as those exemplified as the divalent cyclic aliphatic groups of $A^{11}$ and $A^{22}$ described above.

The aromatic group optionally having a substituent is an unsubstituted divalent aromatic group or a divalent aromatic group having a substituent. The divalent aromatic group is a divalent aromatic group of usually 2 to 20 carbon atoms having an aromatic ring structure.

Specific examples of the divalent aromatic groups of $B^{11}$ and $B^{12}$ may include the same ones as those exemplified as the divalent aromatic groups of $A^{11}$ and $A^{22}$ described above.

Examples of the substituents of the divalent cyclic aliphatic group and the divalent aromatic group of $B^{11}$ and $B^{12}$ may include the same ones as those exemplified as the substituents of the divalent cyclic aliphatic group and the divalent aromatic group of $A^{11}$ and $A^{22}$ described above.

In the formula (I), $Y^{11}$ and $Y^{12}$ each independently represent a single bond, —O—, —CO—, —CO—O—, —O—CO—, —NR$^{21}$—CO—, —CO—NR$^{22}$—, —O—CO—O—, —NR$^{23}$—CO—O—, —O—CO—NR$^{24}$—, or —NR$^{25}$—CO—NR$^{26}$—. Herein, $R^{21}$ to $R^{26}$ each independently represent a hydrogen atom or an alkyl group of 1 to 6 carbon atoms. Among these, it is preferable that $Y^{11}$ and $Y^{12}$ are each independently —O—, —CO—O—, or —O—CO—.

Examples of the alkyl group of 1 to 6 carbon atoms of $R^{21}$ to $R^{26}$ may include a methyl group, an ethyl group, a propyl group, and an isopropyl group.

In the formula (I), $R^1$ and $R^2$ each independently represent a hydrogen atom, a methyl group or a chlorine atom, and preferably a hydrogen atom or a methyl group. It is more preferable that $R^1$ and $R^2$ are the same as each other, and $R^1$ and $R^2$ are both a hydrogen atom.

From the viewpoint of obtaining the second optically anisotropic layer having excellent reverse wavelength distribution, it is preferable that the compound (I) has a symmetrical structure about $Ar^1$-$D^1$. Specifically, in the compound (I), it is preferable that $R^1$, m, and n are the same as $R^2$, q, and p, respectively, and —Y$^{11}$—[B$^{11}$-L$^{11}$]$_n$-A$^{11}$-Z$^{11}$—(*) and (*)—Z$^{12}$—A$^{12}$-[L$^{12}$-B$^{12}$]$_p$—Y$^{12}$— have a symmetrical structure with the side (*) bonded to $Ar^1$ serving as a center of symmetry.

The phrase "having a symmetrical structure with (*) serving as a center of symmetry" means, for example, having a structure of —CO—O—(*) and (*)—O—CO—; —O—(*) and (*)—O—; —O—CO—(*) and (*)—CO—O—; or the like.

The compound (I) described above may be produced by a combination of known synthesis reactions. That is, it may be synthesized by referring to the methods described in various literatures (for example, MARCH'S ADVANCED ORGANIC CHEMISTRY (WILEY), Sandler and Karo, "Organic Functional Group Preparations", Naoki Inamoto Co-translation (Hirokawa Shoten)).

Herein, preferable examples of the polymerizable compound (I) in which n and p are 1 are not particularly limited, and a compound represented by the following formula (IVa) (hereinafter, this may be referred to as a "compound (IVa)") may be mentioned.

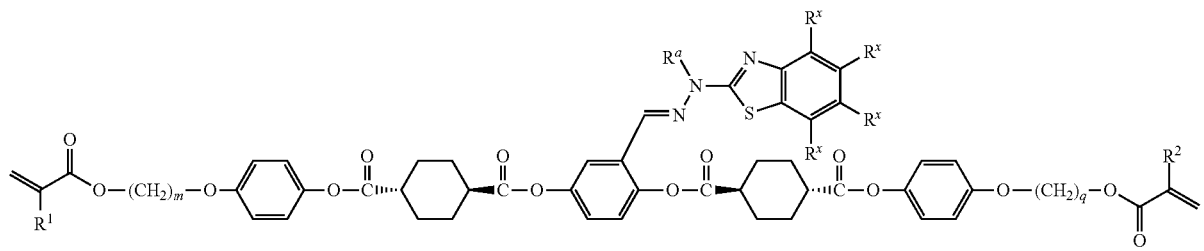

(IVa)

[In the formula (Iva), $R^1$, $R^2$, $R^a$, $R^x$, m, and q represent the same meanings as described above.]

As the compound (Iva), a compound in which all $R^x$'s are hydrogen atoms is preferable.

The compound (I) may be produced, for example, by a reaction of a hydrazine compound with a carbonyl compound as described in WO 2012/147904. In particular, the compound (Iva) may be produced by a publicly known method such as, for example, the method described in WO 2014/010325.

pound having a rod-shaped structure that may form a liquid crystal phase at 100° C. Specific examples of particularly preferable evaluator liquid crystal compounds may include a liquid crystal compound "LC242" with forward wavelength distribution having a structure represented by the following formula (E1) and a liquid crystal compound with forward wavelength distribution having a structure represented by the following formula (E2). In the following formulae, Me represents a methyl group.

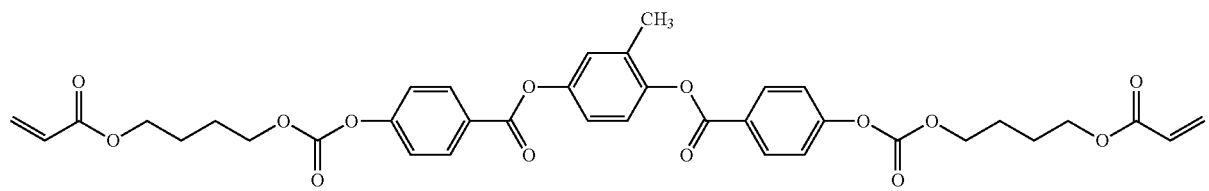

(E1)

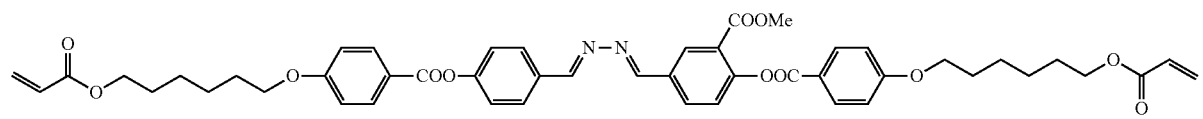

(E2)

Subsequently, the mesogen compound with reverse wavelength distribution will be described.

The mesogen compound with reverse wavelength distribution is a compound that does not solely exhibit liquid crystal properties, and has a property such that an evaluation mixture obtained by mixing the mesogen compound with an evaluator liquid crystal compound at a specific mixing ratio exhibits liquid crystal properties. As the evaluator liquid crystal compound, a liquid crystal compound with forward wavelength distribution, which is a liquid crystal compound exhibiting an in-plane retardation with forward wavelength distribution when it is homogeneously oriented, is used. When the liquid crystal compound with forward wavelength distribution is used as the evaluator liquid crystal compound, wavelength distribution of in-plane retardation of the mesogen compound with reverse wavelength distribution when the evaluation mixture is homogeneously oriented can be easily evaluated. In particular, it is preferable that the evaluator liquid crystal compound is a liquid crystal com- The mixing ratio of the mesogen compound with reverse wavelength distribution mixed with the evaluator liquid crystal compound for obtaining the evaluation mixture is usually at least any of 30 parts by weight to 70 parts by weight relative to 100 parts by weight of the total of the evaluator liquid crystal compound and the mesogen compound with reverse wavelength distribution. Thus, as long as the evaluation mixture having liquid crystal properties is obtained by mixing the mesogen compound with reverse wavelength distribution with the evaluator liquid crystal compound at at least one mixing ratio of the mesogen compound falling within the range of 30 parts by weight to 70 parts by weight relative to 100 parts by weight of the total of the evaluator liquid crystal compound and the mesogen compound with reverse wavelength distribution, a mixture obtained by mixing the mesogen compound with reverse wavelength distribution with the evaluator liquid crystal compound at another mixing ratio of the mesogen compound with reverse wavelength distribution falling within the range of 30 parts by weight to 70 parts by weight relative to 100 parts by weight of the total of the evaluator liquid crystal compound and the mesogen compound with reverse wavelength distribution may not exhibit liquid crystal properties.

Whether the evaluation mixture exhibits liquid crystal properties may be confirmed by the following method.

The evaluation mixture is applied onto a substrate and dried to obtain a sample film including the substrate and a layer of the evaluation mixture. The sample film is disposed on a hot stage. While the sample film is observed by a polarized light microscope, temperature of the sample film is elevated. When phase transition of the layer of the evaluation mixture to a liquid crystal phase is observed, the evaluation mixture can be judged to exhibit liquid crystal properties.

When the aforementioned evaluation mixture is homogeneously oriented, the mesogen compound with reverse wavelength distribution in the evaluation mixture exhibits an in-plane retardation with reverse wavelength distribution. Herein, to effect homogeneous orientation of the evaluation mixture means to form a layer of the evaluation mixture and then effect homogeneous orientation of the evaluator liquid crystal compound in the layer. Therefore, in the homogeneously oriented evaluation mixture, the long-axis direction of the mesogen skeleton of molecules of the evaluator liquid crystal compound is usually oriented in one certain direction parallel to the plane of the layer.

That the mesogen compound with reverse wavelength distribution exhibits an in-plane retardation with reverse wavelength distribution in the homogeneously oriented evaluation mixture means that the in-plane retardations Re(450) and Re(550) of the mesogen compound with reverse wavelength distribution contained in the evaluation mixture at wavelengths of 450 nm and 550 nm, respectively, satisfy Re(450)/Re(550)<1.00.

However, it is difficult to selectively measure only the in-plane retardation of the mesogen compound with reverse wavelength distribution in the layer of the evaluation mixture. Whether the mesogen compound with reverse wavelength distribution in the evaluation mixture exhibits an in-plane retardation with reverse wavelength distribution may be confirmed by the following confirmation method taking advantage of the nature of the evaluator liquid crystal compound being a liquid crystal compound with forward wavelength distribution.

A liquid crystal layer containing the evaluator liquid crystal compound as the liquid crystal compound with forward wavelength distribution is formed, and the evaluator liquid crystal compound in the liquid crystal layer is homogeneously oriented. The ratio Re(X450)/Re(X550) of the in-plane retardation Re(X450) of the liquid crystal layer at a wavelength of 450 nm relative to the in-plane retardation Re(X550) thereof at a wavelength of 550 nm is measured.

Separately, a layer of the evaluation mixture containing the evaluator liquid crystal compound and the mesogen compound with reverse wavelength distribution is formed and the evaluation mixture in the layer of the evaluation mixture is homogeneously oriented. The ratio Re(Y450)/Re(Y550) of the in-plane retardation Re(Y450) of the layer of the evaluation mixture at a wavelength of 450 nm relative to the in-plane retardation Re(Y550) thereof at a wavelength of 550 nm is measured.

Seeing from the measurement results, when the retardation ratio Re(Y450)/Re(Y550) of the layer of the evaluation mixture containing the mesogen compound with reverse wavelength distribution is smaller than the retardation ratio Re(X450)/Re(X550) of the liquid crystal layer containing no mesogen compound with reverse wavelength distribution, it can be determined that the mesogen compound with reverse wavelength distribution exhibits an in-plane retardation with reverse wavelength distribution.

From the viewpoint of favorably exhibiting the desired effects of the present invention, it is preferable that the ratio Re(Y650)/Re(Y550) of the in-plane retardation of the layer of the evaluation mixture is larger than the ratio Re(X650)/Re(X550) of the in-plane retardation of the liquid crystal layer in the aforementioned confirmation method. Herein, Re(X550) represents the in-plane retardation of the liquid crystal layer at a wavelength of 550 nm, Re(X650) represents the in-plane retardation of the liquid crystal layer at a wavelength of 650 nm, Re(Y550) represents the in-plane retardation of the layer of the evaluation mixture at a wavelength of 550 nm, and Re(Y650) represents the in-plane retardation of the layer of the evaluation mixture at a wavelength of 650 nm.

As the mesogen compound with reverse wavelength distribution, for example, a compound having a main chain mesogen skeleton and a side chain mesogen skeleton bonded to the main chain mesogen skeleton in a molecule of the mesogen compound with reverse wavelength distribution may be used.

Further, it is preferable that the mesogen compound with reverse wavelength distribution has polymerizability. It is therefore preferable that the mesogen compound with reverse wavelength distribution has a polymerizable group. When a mesogen compound with reverse wavelength distribution having a polymerizable group is used, the orientation state of the mesogen compound with reverse wavelength distribution can be easily fixed by polymerization. Therefore, a second optically anisotropic layer having stable optical properties can be easily obtained.

When the mesogen compound with reverse wavelength distribution is a monomer, the molecular weight thereof is preferably 300 or more, more preferably 700 or more, and particularly preferably 1,000 or more, and is preferably 2,000 or less, more preferably 1,700 or less, and particularly preferably 1,500 or less. When the mesogen compound with reverse wavelength distribution has the aforementioned molecular weight, the coating property of a coating liquid for forming the second optically anisotropic layer can be particularly improved.

As the mesogen compound with reverse wavelength distribution, one type thereof may be solely used, and two or more types thereof may also be used in combination at any ratio.

Examples of the mesogen compound with reverse wavelength distribution may include a compound that does not exhibit liquid crystal properties among the compounds represented by the aforementioned formula (I). In particular, examples of preferable mesogen compound with reverse wavelength distribution may include the following compounds.

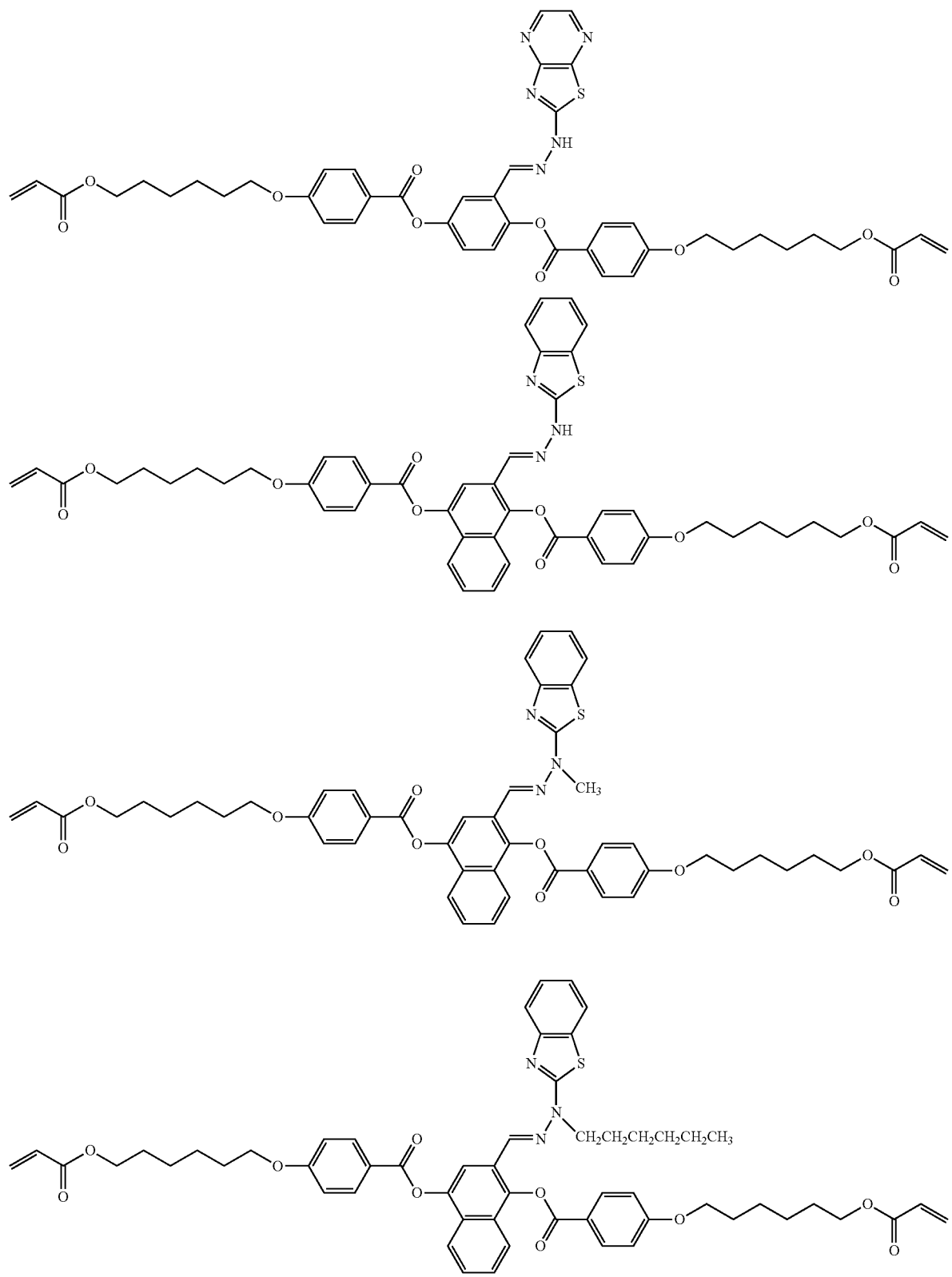

Among the aforementioned mesogen compounds, a mesogen compound containing, in the molecule thereof, at least one selected from the group consisting of a benzothiazole ring (ring represented by the following formula (10A)); and a combination of a cyclohexyl ring (ring represented by the following formula (10B)) and a phenyl ring (ring represented by the following formula (10C)), is preferable from the viewpoint of further favorably exhibiting the desired effects of the present invention.

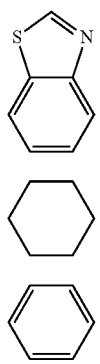

The ratio of the mesogen compound in the total solid content of the second optically anisotropic layer is preferably 20% by weight or more, more preferably 30% by weight or more, and particularly preferably 40% by weight or more, and is preferably 60% by weight or less, more preferably 55% by weight or less, and particularly preferably 50% by weight or less. When the ratio of the mesogen compound is equal to or more than the lower limit value of the aforementioned range, the wavelength distribution of thickness direction retardation of the second optically anisotropic layer can be easily made closer to reverse distribution. When the ratio is equal to or less than the upper limit value of the aforementioned range, the mesogen compound can be uniformly dispersed in the second optically anisotropic layer, and mechanical strength of the second optically anisotropic layer can be enhanced.

[5.3. Optional Component]

The second optically anisotropic layer may further contain an optional component in combination with the positive C polymer and the mesogen compound.

[5.4. Properties and Thickness of Second Optically Anisotropic Layer]

The total light transmittance of the second optically anisotropic layer is preferably 80% or more, more preferably 85% or more, and particularly preferably 90% or more. The total light transmittance may be measured in the wavelength range of 400 nm to 700 nm using an ultraviolet-visible spectrometer.

The haze of the second optically anisotropic layer is preferably 5% or less, more preferably 3% or less, particularly preferably 1% or less, and ideally 0%. As the haze, an average value of haze values measured at five points by using a "turbidimeter NDH-300A" manufactured by Nippon Denshoku Industries Co., Ltd., in accordance with JIS K7361-1997 may be adopted.

It is preferable that the second optically anisotropic layer does not exhibit liquid crystal properties. When the second optically anisotropic layer does not exhibit liquid crystal properties, the positive C polymer and the mesogen compound can be favorably dispersed in the second optically anisotropic layer. In the second optically anisotropic layer having no liquid crystal properties, occurrence of orientation ununiformity of the mesogen compound due to influence of air fluctuation such as drying wind can be suppressed during production of the second optically anisotropic layer using a coating liquid.

The thickness of the second optically anisotropic layer may be appropriately adjusted so as to obtain a desired retardation. The specific thickness of the second optically anisotropic layer is preferably 1.0 μm or more, and more preferably 3.0 μm or more, and is preferably 50 μm or less, more preferably 40 μm or less, and particularly preferably 30 μm or less.

[5.5. Method for Producing Second Optically Anisotropic Layer]

The second optically anisotropic layer may be produced by a production method including a step of preparing a coating liquid containing a positive C polymer, a mesogen compound, and a solvent; a step of applying the coating liquid onto a support surface to obtain a coating liquid layer; and a step of drying the coating liquid layer.

In the step of preparing a coating liquid, a positive C polymer, a mesogen compound, and a solvent are usually mixed to obtain a coating liquid. The ratio of the positive C polymer and the mesogen compound in the total solid content of the coating liquid may be adjusted to the same range as the ratio of the positive C polymer and the mesogen compound in the total solid content of the second optically anisotropic layer.

As the solvent, an organic solvent is usually used. Examples of such an organic solvent may include a hydrocarbon solvent such as cyclopentane and cyclohexane; a ketone solvent such as cyclopentanone, cyclohexanone, methyl ethyl ketone, acetone, methyl isobutyl ketone, and N-methylpyrrolidone; an acetic acid ester solvent such as butyl acetate and amyl acetate; a halogenated hydrocarbon solvent such as chloroform, dichloromethane, and dichloroethane; an ether solvent such as 1,4-dioxane, cyclopentyl methyl ether, tetrahydrofuran, tetrahydropyran, 1,3-dioxolane, and 1,2-dimethoxyethane; an aromatic hydrocarbon solvent such as toluene, xylene, and mesitylene; and mixtures thereof. The boiling point of the solvent is preferably 60° C. to 250° C., and more preferably 60° C. to 150° C. from the viewpoint of excellent handleability. As the solvent, one type thereof may be solely used, and two or more types thereof may also be used in combination at any ratio.

The amount of the solvent is preferably adjusted so that the solid content, concentration of the coating liquid falls within a desired range. The solid content concentration of the coating liquid is preferably 6% by weight or more, more preferably 8% by weight or more, and particularly preferably 10% by weight or more, and is preferably 20% by weight or less, more preferably 18% by weight or less, and particularly preferably 15% by weight or less. When the solid content concentration of the coating liquid falls within the aforementioned range, the second optically anisotropic layer having desired optical properties can be easily formed.

The coating liquid to be used for forming the second optically anisotropic layer may contain an optional component in combination with the positive C polymer, the mesogen compound, and the solvent. As the optional component, one type thereof may be solely used, and two or more types thereof may also be used in combination at any ratio.

The coating liquid may contain, for example, a plasticizer as an optional component. Examples of the plasticizer may include triphenyl phosphate, and glyceryl triacetate. As the plasticizer, one type thereof may be solely used, and two or more types thereof may also be used in combination at any ratio.

The amount of the plasticizer is preferably 2 parts by weight or more, more preferably 5 parts by weight or more, and particularly preferably 8 parts by weight or more, and is preferably 15 parts by weight or less, preferably 12 parts by weight or less, and particularly preferably 10 parts by weight or less, relative to 100 parts by weight of the positive C polymer. When the amount of the plasticizer is adjusted to fall within the aforementioned range, mechanical strength can be increased while the embrittlement of the second optically anisotropic layer can be suppressed.

The coating liquid may contain, for example, a polymerization initiator as an optional component. The type of the polymerization initiator may be appropriately selected in accordance with the type of the polymerizable group contained in the polymerizable compound in the coating liquid. Herein, the polymerizable compound is a generic term for compounds having polymerizability. Among these, a photopolymerization initiator is preferable. Examples of the photopolymerization initiator may include a radical polymerization initiator, an anionic polymerization initiator, and a cationic polymerization initiator. Specific examples of a commercially available photopolymerization initiator may include trade name: Irgacure 907, trade name: Irgacure 184, trade name: Irgacure 369, trade name: Irgacure 651, trade name: Irgacure 819, trade name: Irgacure 907, trade name: Irgacure 379, trade name: Irgacure 379EG, and trade name: Irgacure OXE02, manufactured by BASF, and trade name: Adecaoptomer N1919, manufactured by ADEKA Corporation. As the polymerization initiator, one type thereof may be solely used, and two or more types thereof may also be used in combination at any ratio.

The amount of the polymerization initiator is preferably 0.1 part by weight or more, and more preferably 0.5 part by weight or more, and is preferably 30 parts by weight or less, and more preferably 10 parts by weight or less, relative to 100 parts by weight of the polymerizable compound.

The coating liquid may further contain, as an optional component, optional additives such as a metal, a metal complex, a dye, a pigment, a fluorescent material, a phosphorescent material, a leveling agent, a thixotropic agent, a gelling agent, a polysaccharide, a surfactant, an ultraviolet absorber, an infrared absorber, an antioxidant, an ion exchange resin, and a metal oxide such as titanium oxide. The ratio of each of such optional additives is preferably 0.1 part by weight to 20 parts by weight relative to 100 parts by weight of the positive C polymer.

It is preferable that the coating liquid does not exhibit liquid crystal properties. When a coating liquid that does not exhibit liquid crystal properties is used, the positive C polymer and the mesogen compound can be dispersed favorably in the second optically anisotropic layer. In addition, when a coating liquid not having liquid crystal properties, it is possible to suppress occurrence of orientation ununiformity of the mesogen compound due to influence of air fluctuation such as drying wind.

After the coating liquid is prepared as described above, a step of applying the coating liquid onto the support surface to obtain a coating liquid layer is performed. As the support surface, any surface capable of supporting the coating liquid layer may be used. As this support surface, from the viewpoint of improving the surface condition of the second optically anisotropic layer, a flat surface without concave portions and convex portions is usually used. As the support surface, the surface of a long-length substrate is preferably used. When the long-length substrate is used, the coating liquid can be continuously applied onto the substrate that is continuously conveyed. Accordingly, when the long-length substrate is used, the second optically anisotropic layer can be continuously produced. Therefore, the productivity can be improved.

When the coating liquid is applied onto a substrate, it is preferable that an appropriate tensile force (usually 100 N/m to 500 N/m) is applied to the substrate to suppress flopping of the substrate during conveyance and maintain the flatness during coating. The flatness is the swung amount of the substrate in its widthwise direction and vertical direction perpendicular to the conveyance direction of the substrate, and is ideally 0 mm, and usually 1 mm or less.

As the substrate, a substrate film is usually used. As the substrate film, a film usable as a substrate for an optical layered body may be appropriately selected for use. In particular, from the viewpoint of rendering the substrate film usable as an optional layer included in the optically anisotropic layered body, it is preferable that the substrate film is a transparent film. Specifically, the total light transmittance of the substrate film is preferably 80% or more, more preferably 85% or more, and particularly preferably 88% or more.

The material of the substrate film is not particularly limited, and various resins may be used. Examples of the resin may include resins containing various polymers. Examples of the polymer may include an alicyclic structure-containing polymer, a cellulose ester, a polyvinyl alcohol, a polyimide, a UV transparent acrylic, a polycarbonate, a polysulfone, a polyether sulfone, an epoxy polymer, a polystyrene, and combinations thereof. Among these, from the viewpoint of transparency, low hygroscopicity, size stability, and light-weight properties, an alicyclic structure-containing polymer and a cellulose ester are preferable, and an alicyclic structure-containing polymer is more preferable.

The alicyclic structure-containing polymer is a polymer having an alicyclic structure in the repeating unit, and is usually an amorphous polymer. As the alicyclic structure-containing polymer, any of a polymer containing an alicyclic structure in the main chain and a polymer containing an alicyclic structure in the side chain may be used.

Examples of the alicyclic structure may include a cycloalkane structure and a cycloalkene structure, and a cycloalkane structure is preferable from the viewpoint of thermal stability and the like.

The number of carbon atoms constituting one alicyclic structure repeating unit is not particularly limited, but is preferably 4 or more, more preferably 5 or more, and particularly preferably 6 or more, and is preferably 30 or less, more preferably 20 or less, and particularly preferably 15 or less.

The ratio of the repeating unit having the alicyclic structure in the alicyclic structure-containing polymer may be appropriately selected in accordance with the use purpose, and is preferably 50% by weight or more, more preferably 70% by weight or more, and particularly preferably 90% by weight or more. When the repeating unit having the alicyclic structure is increased in such an amount, heat resistance of the substrate film can be enhanced.

Examples of the alicyclic structure-containing polymer may include (1) a norbornene polymer, (2) a monocycle olefin polymer, (3) a cyclic conjugated diene polymer, (4) a vinyl alicyclic hydrocarbon polymer, and hydrogenated products of these. Among these, a norbornene polymer is more preferable from the viewpoint of transparency and moldability.

Examples of the norbornene polymer may include a ring-opening polymer of a norbornene monomer, a ring-opening copolymer of a norbornene monomer with another monomer ring-opening copolymerizable therewith, and hydrogenated products thereof; an addition polymer of a norbornene monomer, and an addition copolymer of a norbornene monomer with another monomer copolymerizable therewith. Among these, from the viewpoint of transparency, a hydrogenated product of a ring-opening polymer of a norbornene monomer is particularly preferable.

The above-described alicyclic structure-containing polymer may be selected from publicly known polymers disclosed, for example, Japanese Patent Application Laid-Open No. 2002-321302 A and the like.

The glass transition temperature of the alicyclic structure-containing polymer is preferably 80° C. or more, and more preferably in a range of 100° C. to 250° C. The alicyclic structure-containing polymer having a glass transition temperature falling within such a range has low tendency to causes deformation and stress in use under high temperature, and is excellent in durability.

The weight-average molecular weight (Mw) of the alicyclic structure-containing polymer is preferably 10,000 to 100,000, more preferably 25,000 to 80,000, and furthermore preferably 25,000 to 50,000. When the weight-average molecular weight falls within such a range, mechanical strength and molding proccessability of the substrate film are highly balanced, and thus, it is suitable. The above-mentioned weight-average molecular weight may be measured as a polyisoprene-equivalent value by gel permeation chromatography (hereinafter abbreviated as "GPC") using cyclonexane as a solvent. When the resin as a sample is not dissolved in cyclohexane, toluene may be used as a solvent in the aforementioned gel permeation chromatography. When the solvent is toluene, the weight-average molecular weight may be measured as a polystyrene-equivalent, value in the aforementioned gel permeation chromatography.

The molecular weight distribution (weight-average molecular weight (Mw)/number-average molecular weight (Mn)) of the alicyclic structure-containing polymer is preferably 1 or more, and more preferably 1.2 or more, and is preferably 10 or less, more preferably 4 or less, and particularly preferably 3.5 or less.

When a resin containing the alicyclic structure-containing polymer is used as the material of the substrate film, the thickness of the substrate film is preferably 1 μm to 1,000 μm, more preferably 5 μm to 300 μm, and particularly preferably 30 μm to 100 μm, from the viewpoint of facilitating productivity improvement, thickness reduction, and weight reduction.

The resin containing the alicyclic structure-containing polymer may be composed solely of the alicyclic structure-containing polymer, but may contain an optional additive as long as the advantageous effects of the present invention is not significantly impaired. The ratio of the alicyclic structure-containing polymer in the resin containing the alicyclic structure-containing polymer is preferably 70% by weight or more, and more preferably 80% by weight or more.

Suitable specific examples of the resin containing the alicyclic structure-containing polymer may include "ZEONOR" manufactured by ZEON Corporation.

As the cellulose ester, lower fatty acid esters of cellulose (for example, cellulose acetate, cellulose acetate butyrate, and cellulose acetate propionate) are representative examples. Lower fatty acid means a fatty acid of 6 or less carbon atoms per molecule. Examples of the cellulose acetate may include triacetyl cellulose (TAC) and cellulose diacetate (DAC).

The degree of acetylation of cellulose acetate is preferably 50% to 70%, and particularly preferably 55% to 65%. The weight-average molecular weight is preferably 70,000 to 120,000, and particularly preferably 80,000 to 100,000. In addition, the aforementioned cellulose acetate may be esterified with not only acetic acid but also percially with a certain type of a fatty acid such as propionic acid and butyric acid. Further, the resin constituting the substrate film may contain cellulose acetate in combination with a cellulose ester other than cellulose acetate (cellulose propionate, cellulose butyrate, and the like). In that case, it is preferable that the entirety of all of these cellulose esters satisfy the degree of acetylation described above.

When a film of triacetylcellulose is used as the substrate film, such a film is particularly preferably a triacetylcellulose film formed using triacetylcellulose dope that is prepared by dissolving triacetylcellulose in a solvent essentially free of dichloromethane by a low-temperature dissolution method or a high-temperature dissolution method, from the viewpoint of environmental conservation. The film of triacetylcellulose may be produced by a co-casting method. The co-casting method may be performed by preparing a solution (dope) containing raw material flakes of triacetylcellulose and a solvent, and if necessary, an optional additive, casting the dope on a support from a dope supply device (die), drying the cast product to some extent, peeling the cast product as a film from the support when rigidity has been imparted thereto, and further drying the film to remove the solvent. Examples of the solvent in which the raw material flakes are dissolved may include a halogenated hydrocarbon solvent (dichloromethane, etc.), an alcohol solvent (methanol, ethanol, butanol, etc.), an ester solvent (methyl formate, methyl acetate, etc.), and an ether solvent (dioxane, dioxolane, diethyl ether, etc.). Examples of the additive contained in the dope may include a retardation-increasing agent, a plasticizer, an ultraviolet absorber, a deterioration preventing agent, a lubricant, and a peeling accelerator. Examples of the support on which the dope is cast may include a horizontal endless metal belt and a rotation drum. For casting, a single dope may be cast as a single layer. Alternatively, co-casting of a plurality of layers may also be performed. In co-casting of a plurality of layers, for example, a plurality of dopes may be successively cast so that a layer of a low-concentration cellulose ester dope and layers of a high-concentration cellulose ester dope in contact with the front and back surfaces of the layer of the low-concentration cellulose ester dope are formed. Examples of the method for drying the film to remove the solvent may include a method of conveying the film to pass the film through a drying portion of which the interior portion is under a condition suitable for drying.

Preferable examples of the film of triacetylcellulose may include "TAC-TD80U" manufactured by Fuji Photo Film Co., Ltd. and those disclosed in JIII journal of technical disclosure No. 2001-1745. The thickness of the film of triacetylcellulose is not particularly limited, but is preferably 20 μm to 150 μm, more preferably 40 μm to 130 μm, and still more preferably 70 μm to 120 μm.

Examples of the coating method of the coating liquid may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. The thickness of the coating liquid to be applied may be appropriately set in accordance with a desired thickness required for the second optically anisotropic layer.

After the coating liquid is applied onto the support surface to obtain a coating liquid layer, the step of drying the coating liquid layer is performed. By drying, the solvent is removed from the coating liquid layer to obtain the second optically anisotropic layer. The drying method may be any drying method such as heat drying, reduced pressure drying, reduced pressure heating drying, and natural drying.

In the above-described method for producing the second optically anisotropic layer, the second optically anisotropic layer can be produced by a simple operation of applying the coating liquid containing a combination of the positive C polymer and the mesogen compound and drying. Therefore, an orientation film is unnecessary. Thus, it is unnecessary to adjust the compatibility between the mesogen compound and the orientation film and to form the orientation film, so that the second optically anisotropic layer can be easily produced.

Further, the coating liquid containing the positive C polymer and the mesogen compound in combination can suppress occurrence of orientation ununiformity of the mesogen compound due to influence of air fluctuation during drying. Accordingly, the second optically anisotropic layer in which the orientation state is uniform at a wide area in the in-plane directions can be easily obtained. Therefore, the second optically anisotropic layer having an excellent surface state can be easily obtained.

Herein, a mechanism that enables obtaining of a desired second optically anisotropic layer by combining the positive C polymer and the mesogen compound will be described. However, the technical scope of the present invention is not limited by the mechanism described below.

A positive C polymer generally includes a side chain intersecting a main chain, the side chain having a rigid structure such as a naphthalene ring and a biphenyl group. In the second optically anisotropic layer containing the positive C polymer, the main chain of the positive C polymer is disposed so as to be parallel to the in-plane direction of the second optically anisotropic layer and the side chain thereof stands in the thickness direction of the second optically anisotropic layer. Therefore, when the positive C polymer is combined with the mesogen compound, the direction of molecule of the mesogen compound is corrected by the side chain of the positive C polymer, and the molecule of the mesogen compound is thereby oriented so that the long-axis direction of the molecule is parallel to the thickness direction of the second optically anisotropic layer. Accordingly, a high refractive index is exhibited in the thickness direction of the second optically anisotropic layer. Further, the liquid crystal compound with reverse wavelength distribution and the mesogen compound including the mesogen compound with reverse wavelength distribution may exhibit an in-plane retardation with reverse wavelength distribution. Therefore, the thickness direction retardation of the second optically anisotropic layer containing the mesogen compound in which the molecule is oriented in the thickness direction can exhibit reverse wavelength distribution.

In addition to the aforementioned steps, the method for producing a second optically anisotropic layer may further include an optional step. For example, in the method for producing a second optically anisotropic layer, a step of fixing the orientation state of the mesogen compound in the second optically anisotropic layer obtained after drying may be performed. In this step, the orientation state of the mesogen compound is usually fixed by polymerizing the mesogen compound.

As the polymerization of the mesogen compound, a method suitable for the properties of components contained in the coating liquid, such as the polymerizable compound and the polymerization initiator, may be appropriately selected. For example, a method of irradiating the compound with light is preferable. Herein, the light for irradiation may include visible light, ultraviolet light, and infrared light. Among these, a method of irradiation with ultraviolet light is preferable because of its simple operation. The irradiation intensity of ultraviolet light is preferably in a range of 0.1 mW/cm$^2$ to 1,000 mW/cm$^2$, and more preferably in a range of 0.5 mW/cm$^2$ to 600 mW/cm$^2$. The irradiation time of ultraviolet light is preferably in a range of 1 second to 300 seconds, and more preferably in a range of 5 seconds to 100 seconds. The cumulative amount of ultraviolet light (mJ/cm$^2$) is determined by multiplying the ultraviolet irradiation intensity (mW/cm$^2$) by the irradiation time (sec). As an irradiation light source of ultraviolet light, a high-pressure mercury lamp, a metal halide lamp, or a low-pressure mercury lamp may be used. It is preferable that the polymerization of the mesogen compound is performed under an inactive gas atmosphere such as a nitrogen atmosphere. This is because the ratio of residual monomer tends to be decreased.

According to the above-described production method, the second optically anisotropic layer may be obtained in a state of an optically anisotropic transfer body including a substrate and the second optically anisotropic layer. Herein, the optically anisotropic transfer body is a member including a plurality of layers and is used for production of a product that includes a part of the plurality of layers by transferring the part of the plurality of layers. The method for producing a second optically anisotropic layer may include, for example, a step of peeling the substrate from the optically anisotropic transfer body.

[6. Structure of First Optically Anisotropic Layer]

As the first optically anisotropic layer, a liquid crystal layer containing a liquid crystal compound whose orientation state may be fixed (hereinafter, this may be referred to as a "liquid crystal compound for the first layer optically anisotropic layer" as appropriate) may be used. In this case, as the liquid crystal compound for the first layer optically anisotropic layer, it is preferable to use the aforementioned liquid crystal compound with reverse wavelength distribution described above that is homogeneously oriented. This makes it possible to obtain the same advantages as described in the section on the second optically anisotropic layer also in the first optically anisotropic layer. In particular, it is particularly preferable that the liquid crystal layer as the first optically anisotropic layer contains a liquid crystal compound represented by the following formula (V) whose orientation state may be fixed.

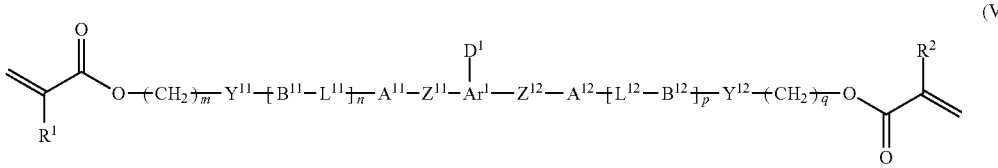

In the above-described formula (V), $R^1$, $R^2$, $Y^{11}$, $Y^{12}$, $B^{11}$, $B^{12}$, $L^{11}$, $L^{12}$, $A^{11}$, $A^{12}$, $Z^{11}$, $Z^{12}$, $Ar^1$, $D^1$, m, n, p, and q represent, the same meanings as those in the formula (I). Therefore, the liquid crystal compound represented by the formula (V) represents the same compounds as the liquid crystal, compounds represented by the formula (I).

The in-plane slow axis direction of the first optically anisotropic layer may be any direction, and may be optionally set depending on applications of the optically anisotropic layered body. In particular, when the optically anisotropic layered body is a long-length film, an angle formed between the slow axis of the first optically anisotropic layer and the widthwise direction of the film is preferably larger than 0° and less than 90°. In one aspect, the angle formed between the in-plane slow axis of the first optically anisotropic layer and the widthwise direction of the film may fall within a specific range of preferably 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°. When such an angle relationship is satisfied, it is possible to perform an efficient production of a circularly polarizing plate by bonding the optically anisotropic layered body to a long-length linear polarizer in a roll-to-roll manner.

The total light transmittance of the first optically anisotropic layer is preferably 80% or more, more preferably 85% or more, and particularly preferably 90% or more. The haze of the first optically anisotropic layer is preferably 5% or less, more preferably 3% or less, particularly preferably 1% or less, and ideally 0%.

The thickness of the first optically anisotropic layer is not particularly limited, and may be appropriately adjusted so that properties such as retardation fall within desired ranges. Specifically, the thickness of the first optically anisotropic layer is preferably 0.5 μm or more, and more preferably 1.0 μm or more, and is preferably 10 μm or less, more preferably 7 μm or less, and particularly preferably 5 μm or less.

The liquid crystal layer as the first optically anisotropic layer may be produced by, for example, a method including a step of preparing a liquid crystal composition containing a liquid crystal compound for the first optically anisotropic layer; a step of applying the liquid crystal composition onto a support to obtain a layer of the liquid crystal composition; and a step of giving orientation to the liquid crystal compound for the first optically anisotropic layer contained in the layer of the liquid crystal composition.

In the step of preparing a liquid crystal composition, the liquid crystal composition is usually obtained by mixing the liquid crystal compound for the first optically anisotropic layer with an optional component used if necessary.

The liquid crystal composition may include a polymerizable monomer as an optional component. The term "polymerizable monomer" refers to a compound other than the liquid crystal compound for the first optically anisotropic layer described above, among the compounds having polymerizability and capable of functioning as a monomer. As the polymerizable monomer, for example, those having one or more polymerizable groups per molecule may be used. When the polymerizable monomer is a crosslinkable monomer having two or more polymerizable groups per molecule, crosslinking polymerization can be achieved. Examples of such a polymerizable group may include an acryloyl group, a methacryloyl group, and an epoxy group. As the polymerizable monomer, one type thereof may be solely used, and two or more types thereof may also be used in combination at any ratio.

In the liquid crystal composition, the ratio of the polymerizable monomer is preferably 1 part by weight to 100 parts by weight, and more preferably 5 parts by weight to 50 parts by weight, relative to 100 parts by weight of the liquid crystal compound for the first optically anisotropic layer.

The liquid crystal composition may contain a photopolymerization initiator as an optional component. Examples of the polymerization initiator may include the same polymerization initiators as those which may be contained in the coating liquid for producing the second optically anisotropic layer. As the polymerization initiator, one type thereof may be solely used, and two or more types thereof may also be used in combination at any ratio.

In the liquid crystal composition, the ratio of the polymerization initiator is preferably 0.1 part by weight to 30 parts by weight, and more preferably 0.5 part by weight to 10 parts by weight, relative to 100 parts by weight of the polymerizable compound.

The liquid crystal composition may contain a surfactant as an optional component. The surfactant is preferably a nonionic surfactant. As the nonionic surfactant, a commercially available product may be used. For example, a nonionic surfactant which is an oligomer having a molecular weight of about several thousand may be used. Specific examples of these surfactants may include PolyFox "PF-151N", "PF-636", "PF-6320", "PF-656", "PF-6520", "PF-3320", "PF-651", and "PF-652" manufactured by OMNOVA, Ftargent "FTX-209F", "FTX-208G", "FTX-204D", and "601AD" manufactured by Neos Co., Ltd., and Surflon "KH-40" and "S-420" manufactured by Seimi Chemical Co., Ltd. As the surfactant, one type thereof may be solely used, and two or more types thereof may also be used in combination at any ratio.

In the liquid crystal composition, the ratio of the surfactant is preferably 0.01 part by weight to 10 parts by weight, and more preferably 0.1 part by weight to 2 parts by weight, relative to 100 parts by weight of the polymerizable compound.

The liquid crystal composition may include a solvent as an optional component. Examples of the solvent may include the same solvents as those which may be contained in the coating liquid for producing the second, optically anisotropic layer. As the solvent, one type thereof may be solely used, and two or more types thereof may also be used in combination at any ratio.

In the liquid crystal composition, the ratio of the solvent is preferably 100 parts by weight to 1000 parts by weight relative to 100 parts by weight of the polymerizable compound.

The liquid crystal composition may further contain, as an optional component, additives such as a metal, a metal complex, a dye, a pigment, a fluorescent material, a phosphorescent material, a leveling agent, a thixotropic agent, a gelling agent, a polysaccharide, an ultraviolet absorber, an infrared absorber, an antioxidant, an ion exchange resin, and a metal oxide such as titanium oxide. The ratio of each of such additives is preferably 0.1 part by weight to 20 parts by weight relative to 100 parts by weight of the polymerizable compound.

After the liquid crystal composition as described above is prepared, the step of applying the liquid crystal composition onto a support to obtain a layer of the liquid crystal composition is performed. As the support, a long-length support is preferably used. When the long-length support is used, the liquid crystal composition can be continuously applied onto the support that is continuously conveyed. Accordingly, when the long-length support is used, the first optically anisotropic layer can be continuously produced. Therefore, the productivity can be improved.

When the liquid crystal composition is applied onto the support, it is preferable that an appropriate tensile force (usually 100 N/m to 500 N/m) is applied to the support to suppress flopping of the support during conveyance and maintain the flatness during coating. The flatness is the swung amount of the support in its widthwise direction and vertical direction perpendicular to the conveyance direction, and is ideally 0 mm, and usually 1 mm or less.

As the support, a support film is usually used. As the support film, a film usable as a support for an optical layered body may be appropriately selected for use. In particular, from the viewpoint of rendering the support film usable as an optional layer included in the optically anisotropic layered body, it is preferable that the support film is a transparent film. Specifically, the total light transmittance of the support film is preferably 80% or more, more preferably 85% or more, and particularly preferably 88% or more.

The material of the support film is not particularly limited, and various resins may be used. Examples of the resin may include resins containing polymers described as a material for the substrate usable in forming the second optically anisotropic layer. Among these, from the viewpoint of transparency, low hygroscopicity, size stability, and lightweight properties, an alicyclic structure-containing polymer and a cellulose ester are preferable, and an alicyclic structure-containing polymer is more preferable, as the polymer contained in the resin.

As the support, one having an orientation regulating force may be used. The orientation regulating force of the support means a property of the support capable of giving orientation to the liquid crystal compound for the first optically anisotropic layer in the liquid crystal composition applied onto the support.

The orientation regulating force may be imparted by subjecting a member such as a film, which is a material of the support, to a treatment for imparting an orientation regulating force. Examples of such a treatment may include a stretching treatment and a rubbing treatment.

In a preferred aspect, the support is a stretched film. By using such a stretched film, it is possible to obtain a support having an orientation regulating force corresponding to the stretched direction.

The stretching direction of the stretched film may be any direction. Therefore, the stretching direction may be the lengthwise direction, widthwise direction, or oblique direction. Furthermore, the stretching may be performed in two or more directions among these stretched directions. The stretching ratio may be appropriately set within a range where an orientation regulating force is generated on the surface of the support. When the material of the support is a resin having a positive intrinsic birefringence value, the molecules are oriented in the stretched direction to exhibit a slow axis in the stretched direction. The stretching may be performed using a known stretching machine such as a tenter stretching machine.

In a further preferable aspect, the support is an obliquely stretched film. When the support is an obliquely stretched film, the angle between the stretched direction and the widthwise direction of the stretched film may be specifically larger than 0° and less than 90°. When such an obliquely stretched film is used as the support, it is possible to render the optically anisotropic layered body a material that enables efficient production of a circularly polarizing plate.

In a certain aspect, the angle formed between the stretched direction and the widthwise direction of the stretched film may falls within a specific range such as preferably 15°±5°, 22.5°±5°, 45°±5°, or 75°±5°, more preferably 15°±4°, 22.5°±4°, 45°±4°, or 75°±4°, and further more preferably 15°±3°, 22.5°±3°, 45°±3°, or 75°±3°. When such an angular relationship is satisfied, it is possible to render the optically anisotropic layered body a material that enables efficient production of a circularly polarizing plate.

Examples of the coating method of the liquid crystal composition may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. The thickness of the layer of the liquid crystal composition to be applied may be appropriately set in accordance with a desired thickness required for the first optically anisotropic layer.

After the layer of the liquid crystal composition is obtained by applying the liquid crystal composition onto the support, the step of giving orientation to the liquid crystal compound for the first optically anisotropic layer contained in the layer of the liquid crystal composition is performed. By performing this step, the liquid crystal compound for the first optically anisotropic layer contained in the layer of the liquid crystal composition is oriented in the orientation direction according to the orientation regulating force of the support. For example, when a stretched film is used as the support, the liquid crystal compound for the first optically anisotropic layer contained in the layer of the liquid crystal composition is oriented in a direction parallel to the stretched direction of the stretched film.

The orientation of the liquid crystal compound for the first optically anisotropic layer may be achieved immediately by coating. But it may also be achieved by performing an orientation treatment such as warming after coating, if necessary. The conditions of the orientation treatment may be appropriately set in accordance with the properties of the liquid crystal composition to be used. The conditions may be, for example, a treatment condition of 30 seconds to 5 minutes under a temperature condition of 50° C. to 160° C.

By giving orientation to the liquid crystal compound for the first optically anisotropic layer in the layer of the liquid crystal composition as described above, desired optical properties are exhibited in the layer of the liquid crystal composition, and thereby the first optically anisotropic layer is obtained as a liquid crystal layer.

The above-described method for producing the first optically anisotropic layer may further include an optional step.

In the method for producing the first optically anisotropic layer, for example, a step of drying the liquid crystal composition layer or the liquid crystal layer may be performed. Such drying may be accomplished by a drying method such as natural drying, heating drying, reduced pressure drying, and reduced pressure heating drying.

Further, in the method for producing the first optically anisotropic layer, for example, a step of fixing the orientation state of the liquid crystal compound for the first optically anisotropic layer may be performed after the liquid crystal compound for the first optically anisotropic layer contained in the liquid crystal composition is oriented. In this step, the orientation state of the liquid crystal compound for the first optically anisotropic layer is usually fixed by polymerizing the liquid crystal compound for the first optically anisotropic layer. By polymerizing the liquid crystal compound for the first optically anisotropic layer, the rigidity of the first optically anisotropic layer can be enhanced and mechanical strength can thus be improved.

As the polymerization of the liquid crystal compound for the first optically anisotropic layer, a method suitable for the properties of the components of the liquid crystal composition may be appropriately selected. For example, a method of irradiating the compound with light is preferable. In particular, a method of irradiating with ultraviolet light is preferable because of its simple operation. Irradiation conditions such as ultraviolet irradiation intensity, ultraviolet irradiation time, cumulative amount of ultraviolet light, and ultraviolet irradiation light source and the like may be adjusted to the same ranges as the irradiation conditions in the method for producing the second optically anisotropic layer.

During the polymerization, the liquid crystal compound for the first optically anisotropic layer usually polymerizes while maintaining the orientation of the molecules thereof. Thus, by the aforementioned polymerization, a liquid crystal layer containing the polymer of the liquid crystal compound for the first optically anisotropic layer which is oriented in a direction parallel to the orientation direction of the liquid crystal compound for the first optically anisotropic layer contained in the liquid crystal composition before polymerization can be obtained as the first optically anisotropic layer. Thus, for example, when a stretched film is used as the support, a liquid crystal layer having an orientation direction parallel to the stretched direction of the stretched film can be obtained. Herein, the term "parallel" means that the deviation between the stretched direction of the stretched film and the orientation direction of the polymer of the liquid crystal compound for the first optically anisotropic layer is usually ±3°, preferably ±1°, and ideally 0°.

In the first optically anisotropic layer produced by the above-described production method, the molecules of the polymer obtained from the liquid crystal compound for the first optically anisotropic layer preferably have orientation regularity horizontally oriented with respect to the support film. For example, when a support film having an orientation regulating force is used as the support film, the molecules of the polymer of the liquid crystal compound for the first optically anisotropic layer can be horizontally oriented in the first optically anisotropic layer. Herein, the term "horizontal orientation" of the molecules of the polymer of the liquid crystal compound for the first optically anisotropic layer with respect to the support film means that the average direction of the long axis directions of the mesogen skeletons of the structural unit derived from the liquid crystal compound for the first optically anisotropic layer contained in the polymer is oriented to one certain direction parallel to or close parallel to the film surface (for example, the angle formed with the film surface is within 5°). Like in the case where the compound represented by the formula (V) is used as the liquid crystal compound for the first optically anisotropic layer, when a plurality of types of mesogen skeletons having different orientation directions exist in the first optically anisotropic layer, the direction in which the long axis direction of the longest type mesogen skeleton among them is oriented is usually the orientation direction.

By the production method described above, the first optically anisotropic layer can be obtained in a state of a multilayer body including a support and the first optically anisotropic layer. The method for producing the first optically anisotropic layer may include, for example, a step of peeling the support from the multilayer body.

[7. Optional Layer]

The optically anisotropic layered body may further include an optional layer in combination with the first optically anisotropic layer and the second optically anisotropic layer. Examples of such an optional layer may include an adhesive layer, and a hard coat layer.

[8. Properties and Thickness of Optically Anisotropic Layered Body]

The total light transmittance of the optically anisotropic layered body is preferably 80% or more, more preferably 85% or more, and particularly preferably 90% or more.

The haze of the optically anisotropic layered body is preferably 5% or less, more preferably 3% or less, particularly preferably 1% or less, and ideally 0%.

The thickness of the optically anisotropic layered body may be optionally adjusted so that the above-described optical properties are obtained. The specific thickness thereof is preferably 3 µm or more, more preferably 4 µm or more, and particularly preferably 5 µm or more, and is preferably 20 µm or less, more preferably 15 µm or less, and particularly preferably 12 µm or less, from the viewpoint of thickness reduction.

[9. Method for Producing Optically Anisotropic Layered Body]

The optically anisotropic layered body may be produced by, for example, the following production method 1 or 2.

Production Method 1:

A production method including:

a step of producing a first optically anisotropic layer, and a step of obtaining an optically anisotropic layered body by performing the aforementioned method for producing the second optically anisotropic layer using the first optically anisotropic layer as a substrate to form the second optically anisotropic layer on the first optically anisotropic layer.

When a coating liquid is applied onto the first optically anisotropic layer as in the production method 1, formation of the second optically anisotropic layer on the first optically anisotropic layer can be achieved by drying of the coating liquid layer, and thereby the optically anisotropic layered body can be obtained.

Production Method 2:

A production method including:

a step of producing a first optically anisotropic layer, a step of producing an optically anisotropic transfer body including a substrate and a second optically anisotropic layer, a step of bonding the second optically anisotropic layer of the optically anisotropic transfer body to the first optically anisotropic layer to obtain an optically anisotropic layered body, and a step of peeling the substrate of the optically anisotropic transfer body.

When the optically anisotropic layered body is produced by bonding the second optically anisotropic layer and the first optically anisotropic layer as in the production method 2, a suitable adhesive may be used for bonding. Examples of this adhesive may include the same adhesives as those used in the polarizing plate described later.

In addition to the above-described steps, the method for producing the optically anisotropic layered body may include an optional step. For example, the above-described production method may include a step of providing an optional layer such as a hard coat layer.

[10. Polarizing Plate]

Figure 2:
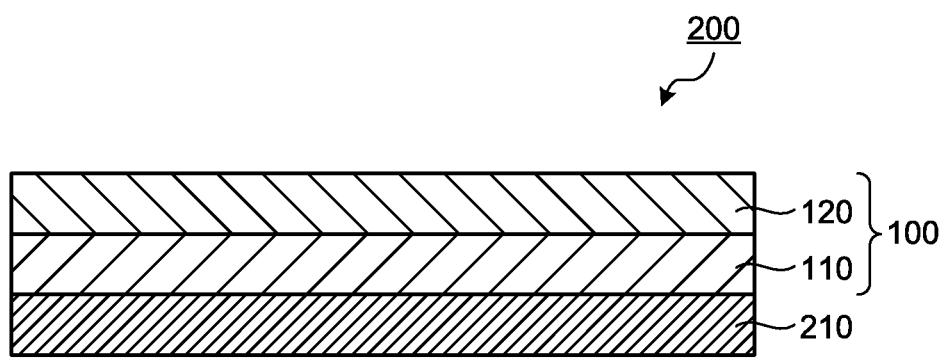
FIG. 2 is a cross-sectional view schematically illustrating a polarizing plate according to an embodiment of the present invention.

FIG. 2 is a cross-sectional view schematically illustrating a polarizing plate according to an embodiment of the present invention.

As illustrated in FIG. 2, the polarizing plate 200 includes a linear polarizer 210 and an optically anisotropic layered body 100. Usually, such a polarizing plate 200 can function as a circularly polarizing plate, and therefore reflection of external light can be suppressed by providing the polarizing plate 200 on a display surface of an image display device. Specifically, with the polarizing plate 200 including the optically anisotropic layered body 100, when a display surface is observed in a tilt direction, reflection of external light can be suppressed and coloring can be effectively suppressed.

The polarizing plate 200 may include the linear polarizer 210, the second optically anisotropic layer 120, and the first optically anisotropic layer 110 in this order. However, from the viewpoint of effectively suppressing reflection of external light in a tilt direction, as illustrated in FIG. 2, it is preferable that the linear polarizer 210, the first optically anisotropic layer 110, and the second optically anisotropic layer 120 are included in this order.

As the linear polarizer 210, any linear polarizer may be used. Examples of the linear polarizer may include a film obtained by allowing a polyvinyl alcohol film to adsorb iodine or a dichroic dye and then uniaxially stretching the film in a boric acid bath; and a film obtained by allowing a polyvinyl alcohol film to adsorb iodine or a dichroic dye and stretching the film, and further modifying a part of the polyvinyl alcohol units in the molecular chain into a polyvinylene unit. Other examples of the linear polarizer may include a polarizer having a function of separating polarized light into reflected light and transmitted light, such as a grid polarizer, a multilayer polarizer, or a cholesteric liquid crystal polarizer. Among these, a polarizer containing polyvinyl alcohol is preferable as the linear polarizer 210.

When natural light is allowed to be incident on the linear polarizer 210, only one polarized light is transmitted. The degree of polarization of the linear polarizer 210 is not particularly limited, but is preferably 98% or more, and more preferably 99% or more.

The thickness of the linear polarizer 210 is preferably 5 µm to 80 µm.

The polarizing plate may further include an adhesive layer for bonding the linear polarizer 210 and the optically anisotropic layered body 100. As the adhesive layer, a tackiness layer formed of a tackiness adhesive or a layer formed by curing a curable adhesive may be used. As the curable adhesive, a thermosetting adhesive may be used, but it is preferable to use a photocurable adhesive. The photocurable adhesive used may contain a polymer or a reactive monomer. The adhesive may contain a solvent, a photopolymerization initiator, other additives, and the like if necessary.

The photocurable adhesive is an adhesive that can be cured by irradiation with light such as visible light, ultraviolet light, and infrared light. Among these, an adhesive which can be cured by ultraviolet light is preferable because of its simple operation.

The thickness of the adhesive layer is preferably 0.5 µm or more, and more preferably 1 µm or more, and is preferably 30 µm or less, more preferably 20 µm or less, and still more preferably 10 µm or less. When the thickness of the adhesive layer falls within the aforementioned range, good adhesion can be achieved without impairing the optical properties of the optically anisotropic layer.

In the polarizing plate, an angle formed by the slow axis of the optically anisotropic layered body 100 relative to the polarized light absorption axis of the linear polarizer 210 is 45° or an angle close to 45°. Specifically, the angle is preferably 45°±5°, more preferably 45°±4°, and particularly preferably 45°±3°.

The aforementioned polarizing plate may further include an optional layer. An example of the optional layer may be a polarizer protective film layer. As the polarizer protective film layer, any transparent film layer may be used. Among these, a film layer formed of a resin having excellent transparency, mechanical strength, thermal stability, moisture shielding property, and the like is preferable. Examples of such a resin may include an acetate resin such as triacetyl cellulose, a polyester resin, a polyethersulfone resin, a polycarbonate resin, a polyamide resin, a polyimide resin, a chain olefin resin, a cyclic olefin resin, and a (meth)acrylic resin. Examples of the optional layer which may be contained in the polarizing plate may include a hard coat layer such as an impact-resistant polymethacrylate resin layer, a mat layer for improving the sliding property of the film, an anti-reflection layer, an anti-fouling layer, and an electric charge suppression layer. As these optional layers, one layer thereof may be solely provided, and two or more layers thereof may also be provided.

The polarizing plate may be produced by bonding the linear polarizer and the optically anisotropic layered body using an adhesive if necessary.

[11. Image Display Device]

Figure 3:
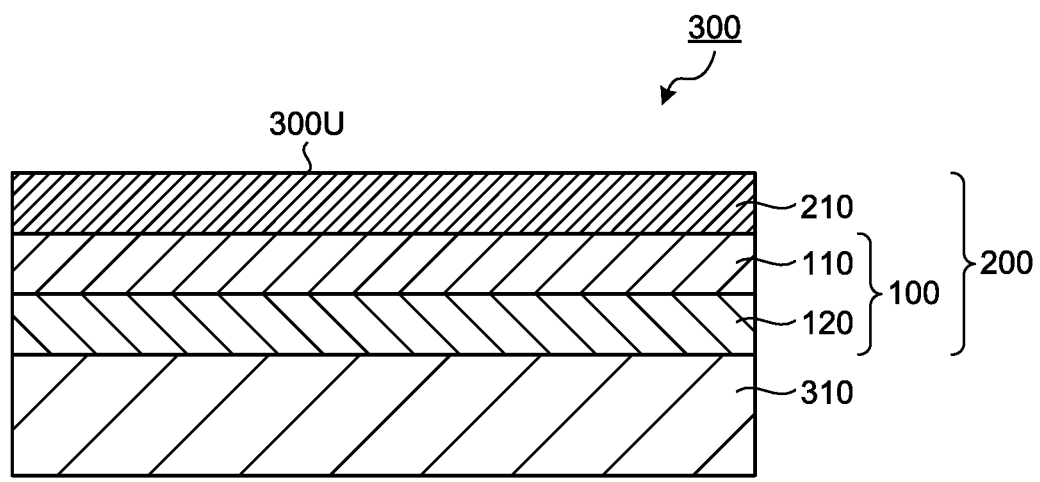
FIG. 3 is a cross-sectional view schematically illustrating an image display device according to an embodiment of the present invention.

FIG. 3 is a cross-sectional view schematically illustrating the image display device 300 according to an embodiment of the present invention.

As illustrated in FIG. 3, the image display device 300 includes a polarizing plate 200 and an organic electroluminescent element (hereinafter, this may be referred to as an "organic EL display element" as appropriate) 310. The image display device 300 usually includes a linear polarizer 210, an optically anisotropic layered body 100, and the organic EL display element 310 in this order.

Although the image display device 300 may include the linear polarizer 210, the second optically anisotropic layer 120, the first optically anisotropic layer 110, and the organic EL element 310 in this order, it is preferable that the image display device 300 includes the linear polarizer 210, the first optically anisotropic layer 110, the second optically anisotropic layer 120, and the organic EL element 310 in this order, as illustrated in FIG. 3, from the viewpoint of effectively suppressing reflection of external light in a tilt direction.

The organic EL element 310 includes a transparent electrode layer, a light-emitting layer, and an electrode layer in this order, and when an electric voltage is applied from the transparent electrode layer and the electrode layer, the light-emitting layer can generate light. Examples of materials constituting the organic light-emitting layer may include a polyparaphenylene vinylene-based material, a polyfluorene-based material, and a polyvinyl carbazole-based material. In addition, the light-emitting layer may have a layered body of layers having a plurality of different emission colors or a mixed layer in which a colorant layer is doped with different colorant. Further, the organic EL element 310 may have functional layers such as a hole injection layer, a hole transport layer, an electron injection layer, an electron transport layer, an equipotential surface formation layer, and a charge generation layer.

The image display device 300 described above can suppress reflection of external light on the display surface 300U. More specifically, only the linearly polarized light, which is a part of light entering the device from outside, passes through the linear polarizer 210, and then, it passes through the optically anisotropic layered body 100 to become circularly polarized light. Circularly polarized light is reflected by a constituent element that reflects the light in the display device (such as a reflective electrode (not illustrated) in the organic EL element 310), and again passes through the optically anisotropic layered body 100. This makes the light linearly polarized light having a vibration direction orthogonal to the vibration direction of the linearly polarized light that have been incident thereon and does not pass through the linear polarizer 210. Herein, the vibration direction of the linearly polarized light means the vibration direction of the electric field of the linearly polarized light. In this manner, the function of suppressing reflection is achieved (see Japanese Patent Application Laid-Open No. Hei. 9-127885 A for the principle of reflection suppression in an organic EL display device as an image display device).

Furthermore, in the image display device 300, the optically anisotropic layered body 100 has specific optical properties, and thereby the function of suppressing reflection can be exerted not only in the front direction of the display surface 300U but also in the tilt direction. Then, it is thereby possible to suppress coloring of the display surface 300U due to the reflected light. Therefore, in the image display device 300, it is possible to effectively suppress reflection of external light to thereby suppress coloring in both the front direction and the tilt direction of the display surface 300.

The degree of coloring may be evaluated by the color difference ΔE*ab between the chromaticity measured during observing the display surface 300U in a tilt direction and the chromaticity of a black display surface 300U in which reflection does not occur. The aforementioned chromaticity may be obtained by measuring a spectrum of light reflected on the display surface 300U, multiplying the measured spectrum by spectral sensitivity (color-matching functions) of the human eye to determine tristimulus values X, Y, and Z, and calculating therefrom a chromaticity (a*, b*, L*). The color difference ΔE*ab may be determined by the following expression (X) from chromaticity (a0*, b0*, L0*) without exposure of the display surface 300U to external light and chromaticity (a1*, b1*, L1*) with exposure of the display surface 300U to external light.

$$\Delta E^*ab = \sqrt{(L1^* - L0^*)^2 + (a1^* - a0^*)^2 + (b1^* - b0^*)^2} \quad (X)$$

The coloring of the display surface 300U by reflected light may generally vary depending on the azimuth angle of an observation direction. Therefore, when the display surface 300U is observed in the tilt direction of the display surface 300, a chromaticity to be measured may vary depending on the azimuth angle of the observation direction. Accordingly, the color difference ΔE*ab may also vary. When the degree of coloring corresponds to the degree of coloring during observation in the tilt direction of the display surface 300 as described above, it is preferable that the coloring is evaluated by the average of color differences ΔE*ab obtained during observation in a plurality of azimuth angle directions. Specifically, the color differences ΔE*ab are measured at an interval of azimuth angle direction of 5° within a range of azimuth angle φ of 0° or more and less than 360° (see FIG. 4). The degree of coloring is evaluated by the average (average color difference) of the measured color differences ΔE*ab. A small value of the average color difference is indicative of small degree of coloring of the display surface during observation of the display surface 300U in the tilt direction.

EXAMPLES

Hereinafter, the present invention will be specifically described by illustrating Examples. However, the present invention is not limited to the Examples described below. The present invention may be optionally modified for implementation without departing from the scope of claims of the present invention and the scope of their equivalents. In the following description, "%" and "part" representing quantity are on the basis of weight, unless otherwise specified. The operation described below was performed under the conditions of normal temperature and normal pressure in the atmospheric air, unless otherwise specified.

[Method for Measuring Retardation and Refractive Index]

The retardation and a reverse wavelength distribution property of a specimen layer (first optically anisotropic layer or second optically anisotropic layer) formed on a certain film (substrate film or support film) were measured by the following methods.

The specimen layer as an evaluation object was bonded to a slide glass with a tackiness agent (the tackiness agent was "CS9621T" manufactured by Nitto Denko Corporation). After that, the film was peeled off to obtain a sample including the slide glass and the specimen layer. This sample was disposed on a stage of a phase difference meter (manufactured by Axometrics, Inc.), and the wavelength distribution of an in-plane retardation Re of the specimen layer was measured. Herein, the wavelength distribution of in-plane retardation Re is a graph showing the in-plane retardations Re per respective wavelengths, for example, a graph having a coordinate in which the horizontal axis is a wavelength and the vertical axis is an in-plane retardation Re. From the obtained wavelength distribution of in-plane retardation Re of the specimen layer, the in-plane retardations Re(450), Re(550), and Re(650) of the specimen layer at wavelengths of 450 nm, 550 nm, and 650 nm, respectively, were determined.

The stage was inclined at 40° with respect to a slow axis of the specimen layer as a rotation axis. The wavelength distribution of the retardation Re40 of the specimen layer in a tilt direction in which the angle relative to a thickness direction of the specimen layer was 40° was measured. Herein, the wavelength distribution of the retardation Re40 is a graph showing the retardations Re40 per respective wavelengths, for example, a graph having a coordinate in which the horizontal axis is a wavelength and the vertical axis is an in-plane retardation Re40.

Further, the average refractive index no was measured using a prism coupler (manufactured by Metricon Corporation) at wavelengths of 407 nm, 532 nm, and 633 nm, and fit to a Cauchy model, wherein the average refractive index no is an average of a refractive index nx in a direction which gives the maximum refractive index among in-plane directions, a refractive index ny in a direction perpendicular to the direction giving nx among the in-plane directions, and a thickness direction refractive index nz of the specimen layer. Thus, the wavelength distribution of the average refractive index no was obtained. Herein, the wavelength distribution of refractive index is a graph showing the refractive indices per respective wavelengths, for example, a graph having a coordinate in which the horizontal axis is a wavelength and the vertical axis is a refractive index.

Subsequently, the wavelength distribution of the thickness direction retardation Rth of the specimen layer was calculated from data of wavelength distributions of the retardation Re in the in-plane direction, the retardation Re40, and the average refractive index no. Herein, the wavelength distribution of the thickness direction retardation Rth is a graph showing the thickness direction retardations Rth per respective wavelengths, for example, a graph having a coordinate in which the horizontal axis is a wavelength and the vertical axis is a thickness direction retardation Rth. From the obtained wavelength distribution of the thickness direction retardation Rth of the specimen layer, the thickness direction retardations Rth(450), Rth(550), and Rth(650) of the specimen layer at wavelengths of 450 nm, 550 nm, and 650 nm, respectively, were determined.

The retardation and NZ factor of the optically anisotropic layered body were determined by calculation from values of optical properties of the first optically anisotropic layer and the second optically anisotropic layer.

[Method for Calculating Color Difference ΔE*ab by Simulation]

The following evaluation model including a circularly polarizing plate produced in each of Examples and Comparative Examples was formed using a software for simulation "LCD Master" manufactured by Shintech.

In the evaluation model for simulation, a structure in which a surface on a second optically anisotropic layer side of the circularly polarizing plate was bonded to a flat reflective surface of a mirror having the reflective surface was set. Therefore, in this evaluation model, a structure including a polarizing film, a tackiness layer, a first optically anisotropic layer, a tackiness layer, a second optically anisotropic layer, and the mirror in this order from a visual recognition side was set. In this evaluation model, an ideal mirror capable of reflecting incident light in a manner of specular reflection at a reflectance of 100% was set. Further, an ideal polarizing film which allows to pass therethrough all linearly polarized light having a vibration direction parallel to a certain direction and does not at all allow to pass therethrough linearly polarized light having a vibration direction perpendicular to the certain direction was set as the polarizing film.

Figure 4:
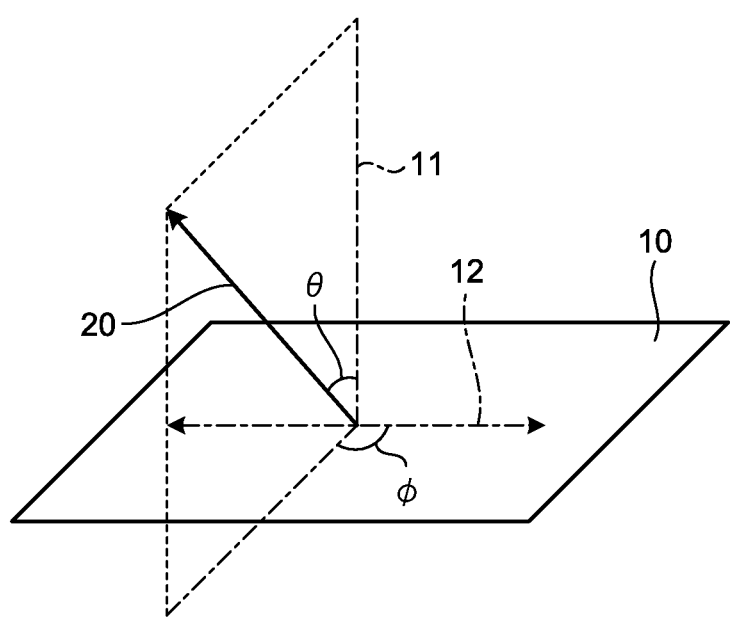
FIG. 4 is a perspective view schematically illustrating a state of evaluation model set for calculation of chromaticity in simulation in Examples and Comparative Examples.

FIG. 4 is a perspective view schematically illustrating a state of the evaluation model set for calculation of chromaticity in simulation in Examples and Comparative Examples.

As illustrated in FIG. 4, the observed chromaticity during viewing a reflective surface 10 of the mirror irradiated by a D65 light source (not illustrated) in an observation direction 20 that was a polar angle θ of 60° relative to the reflective surface 10 was calculated. Herein, the polar angle θ represents an angle formed relative to a normal direction 11 of the reflective surface 10. Separately, the chromaticity observed without irradiation by the light source was calculated. The color difference ΔE*ab was determined by the aforementioned expression (X) from (i) the chromaticity with irradiation by the light source and (ii) the chromaticity without irradiation by the light source.

The calculation of the color difference ΔE*ab was performed by shifting the observation direction 20 at an interval of azimuth angle direction of 5° within a range of azimuth angle φ of 0° or more and less than 360°. Herein, the azimuth angle φ represents an angle of a direction parallel to the reflective surface 10 relative to a reference direction 12 parallel to the reflective surface 10. The average of the calculated color difference ΔE*ab was calculated as an average color difference.

[Method for Evaluating Reflection Luminance and Coloring by Visual Observation]

A commercially available mirror was used as a reflection electrode of an organic EL element. To a surface of the mirror, a surface on a second optically anisotropic layer side of the circularly polarizing plate produced in each of Examples and Comparative Examples described below was bonded using a hand-application roller. The bonding was performed through a tackiness layer (trade name "CS9621" manufactured by Nitto Denko Corporation). As a result, a sample film for evaluation was obtained.

A surface on a circularly polarizing plate side of the sample film was observed as a display surface under natural light in a tilt direction that was a polar angle of 60° relative to the surface. Smaller luminance and coloring by reflection of external light during the observation are indicative of better result.

The evaluation was performed by many observers. The results in all experimental examples (Examples and Comparative Examples) were ranked by each of the observers and a point corresponding to the ranking (first place: 43 points, second place: 42 points, . . . , last place: 1 point) was given to each example. The totals of the points for the experiment examples determined by the respective observers were sorted in the order of the points, and evaluated from the higher order group in the range of the points as A, B, C, D, and E.

Production Example 1. Production of Coating Liquid (Liquid Crystal: 40%)

40 parts by weight of a photopolymerizable liquid crystal compound with reverse wavelength distribution represented by the following formula (B1) (CN point: 96° C.), and 60 parts by weight of poly(9-vinyl carbazole) as a positive C polymer were dissolved in N-methyl-2-pyrrolidone (NMP) so that the solid content concentration was 12%. As a result, a coating liquid (liquid crystal: 40%) was prepared.

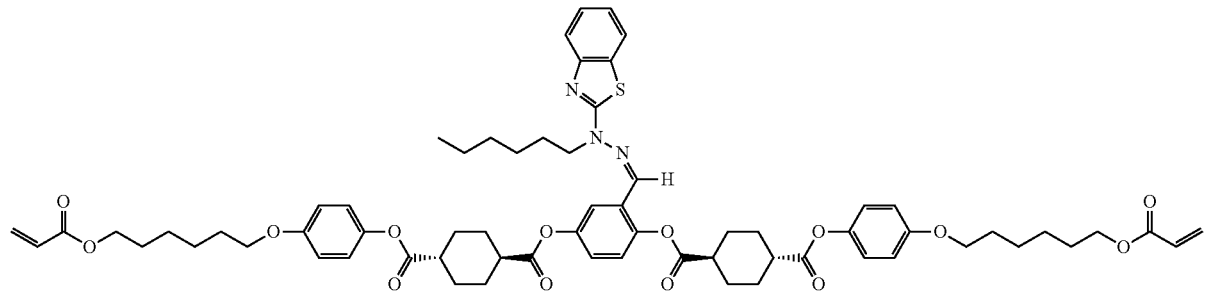

(B1)

Production Example 2. Production of Coating Liquid (Liquid Crystal: 45%)

45 parts by weight of the photopolymerizable liquid crystal compound with reverse wavelength distribution represented by the aforementioned Formula (B1) (CN point: 96° C.), and 55 parts by weight of poly(9-vinyl carbazole) as a positive C polymer were dissolved in N-methyl-2-pyrrolidone (NMP) so that the solid content concentration was 12%. As a result, a coating liquid (liquid crystal: 45%) was prepared.

Production Example 3. Production of Coating Liquid (Liquid Crystal: 50%)

50 parts by weight of the photopolymerizable liquid crystal compound with reverse wavelength distribution represented by the aforementioned Formula (B1) (CN point: 96° C.), and 50 parts by weight of poly(9-vinyl carbazole) as a positive C polymer were dissolved in N-methyl-2-pyrrolidone (NMP) so that the solid content concentration was 12%. As a result, a coating liquid (liquid crystal: 50%) was prepared.

Example I-1

(I-1-1. Production of First Optically Anisotropic Layer)

100 parts by weight of the photopolymerizable liquid crystal compound with reverse wavelength distribution represented by the aforementioned formula (B1) (CN point: 96° C.), 3 parts by weight of a photopolymerization initiator ("Irgacure 379EG" manufactured by BASF), and 0.3 part by weight of a surfactant ("MEGAFACE F-562" manufactured by DIC Corporation) were mixed. To the mixture, a mixed solvent of cyclopentanone and 1,3-dioxolane (weight ratio of cyclopentanone relative:1,3-dioxolane=4:6) was added as a solvent so that the solid content was 22% by weight. The mixture was dissolved in the solvent under warming to 50° C. The resulting mixture was subjected to filtration through a membrane filter with a pore diameter of 0.45 μm to obtain a liquid crystal composition in a liquid state.

As a support film, a long-length obliquely stretched film formed of a resin containing an alicyclic structure-containing polymer ("ZEONOR film" manufactured by ZEON Corporation, glass transition temperature (Tg) of resin: 126° C., thickness: 47 μm, in-plane retardation at a wavelength of 550 nm: 141 nm, stretched direction: direction at 45° relative to widthwise direction) was prepared.

The aforementioned liquid crystal composition in a liquid state was applied onto the support film by a bar coater to form a layer of the liquid crystal composition.

The layer of the liquid crystal composition was then dried in an oven at 110° C. for about 4 minutes to evaporate the solvent in the layer of the liquid crystal composition, and to simultaneously bring about homogeneous orientation of the liquid crystal compound contained in the layer of the liquid crystal composition in the stretched direction of the support film.

Subsequently, the layer of the liquid crystal composition was irradiated with ultraviolet light using an ultraviolet irradiation device. This irradiation with ultraviolet light was performed in a nitrogen atmosphere in a state where the support film was fixed by a tape on a SUS plate heated to 60° C. The layer of the liquid crystal composition was cured by the irradiation with ultraviolet light, to form the first optically anisotropic layer having a thickness of 2.2 μm on the support film. As a result, a multilayer film having the support film and the first optically anisotropic layer formed on the support film was obtained. The retardation of the first optically anisotropic layer was measured by the method described above.

(I-1-2. Production of Second Optically Anisotropic Layer)

As a substrate film, an unstretched film formed of a resin containing an alicyclic structure-containing polymer (manufactured by ZEON Corporation, glass transition temperature (Tg) of resin: 163° C., thickness: 100 μm) was prepared. The coating liquid (liquid crystal: 40%) prepared in Production Example 1 was applied onto a surface of the substrate film by an applicator to form a coating liquid layer.

The coating liquid layer was then dried in an oven at 85° C. for about 10 minutes to evaporate the solvent in the coating liquid layer. Thus, a second optically anisotropic layer was formed on the substrate film. As a result, an optically anisotropic transfer body having the substrate film and the second optically anisotropic layer having a thickness of 10 μm was obtained. The retardation of the second optically anisotropic layer was measured by the method described above.

(I-1-3. Production of Optically Anisotropic Layered Body)

The surface on a first optically anisotropic layer side of the multilayer film was bonded to the surface on a second optically anisotropic layer side of the optically anisotropic transfer body through a tackiness layer ("CS9621T" manufactured by Nitto Denko Corporation). The support film and the substrate film were then peeled off, to obtain an optically anisotropic layered body having a layer structure of the first optically anisotropic layer/tackiness layer/second optically anisotropic layer.

(I-1-4. Production of Circularly Polarizing Plate)

A polarizing film ("HLC2-5618S" manufactured by Sanritz Corporation) as a linear polarizer was bonded to the surface on the first optically anisotropic layer side of the optically anisotropic layered body through a tackiness layer ("CS9621T" manufactured by Nitto Denko Corporation). The bonding was performed so that an angle between the slow axis of the first optically anisotropic layer and the polarized light transmission axis of the polarizing film was 45°. As a result, a circularly polarizing plate having a layer structure of the polarizing film/tackiness layer/first optically anisotropic layer/tackiness layer/second optically anisotropic layer was obtained.

The obtained circularly polarizing plate was evaluated by the aforementioned method.

Examples I-2 to I-3

In the aforementioned step (I-1-2), the coating thickness of the coating liquid (liquid crystal: 40%) was changed so as to obtain a second optically anisotropic layer having a retardation shown in Table 1 below.

An optically anisotropic layered body and a circularly polarizing plate were produced and evaluated in the same manner as that in Example I-1 except for the aforementioned matter.

Examples I-4 to I-6

In the aforementioned step (I-1-1), the coating thickness of the liquid crystal composition was changed so as to obtain a first optically anisotropic layer having a retardation shown in Table 1 below.

Further, in the aforementioned step (I-1-2), the coating thickness of the coating liquid (liquid crystal: 40%) was changed so as to obtain a second optically anisotropic layer having a retardation shown in Table 1 below.

An optically anisotropic layered body and a circularly polarizing plate were produced and evaluated in the same manner as that in Example I-1 except for the aforementioned matters.

Examples II-1 to II-3

In the aforementioned step (I-1-2), the coating thickness of the coating liquid (liquid crystal: 40%) was changed so as to obtain a second optically anisotropic layer having a retardation shown in Table 2 below.

An optically anisotropic layered body and a circularly polarizing plate were produced and evaluated in the same manner as that in Example I-1 except for the aforementioned matter.

Examples II-4 to II-5

In the aforementioned step (I-1-1), the coating thickness of the liquid crystal composition was changed so as to obtain a first optically anisotropic layer having a retardation shown in Table 2 below.

Further, in the aforementioned step (I-1-2), the coating thickness of the coating liquid (liquid crystal: 40%) was changed so as to obtain a second optically anisotropic layer having a retardation shown in Table 2 below.

An optically anisotropic layered body and a circularly polarizing plate were produced and evaluated in the same manner as that in Example I-1 except for the aforementioned matters.

Examples II-6

In the aforementioned step (I-1-1), the coating thickness of the liquid crystal composition was changed so as to obtain a first optically anisotropic layer having a retardation shown in Table 2 below.

An optically anisotropic layered body and a circularly polarizing plate were produced and evaluated in the same manner as that in Example I-1 except for the aforementioned matter.

Examples II-7 to II-11

In the aforementioned step (I-1-2), the coating liquid (liquid crystal: 45%) prepared in Production Example 2 was used instead of the coating liquid (liquid crystal: 40%), and the coating thickness of the coating liquid (liquid crystal: 45%) was changed so as to obtain a second optically anisotropic layer having a retardation shown in Table 3 below.

An optically anisotropic layered body and a circularly polarizing plate were produced and evaluated in the same manner as that in Example I-1 except for the aforementioned matters.

Examples II-12 to II-15

In the aforementioned step (I-1-1), the coating thickness of the liquid crystal composition was changed so as to obtain a first optically anisotropic layer having a retardation shown in Table 3 or Table 4 below.

Further, in the aforementioned step (I-1-2), the coating liquid (liquid crystal: 45%) prepared in Production Example 2 was used instead of the coating liquid (liquid crystal: 40%), and the coating thickness of the coating liquid (liquid crystal: 45%) was changed so as to obtain a second optically anisotropic layer having a retardation shown in Table 3 or Table 4 below.

An optically anisotropic layered body and a circularly polarizing plate were produced and evaluated in the same manner as that in Example I-1 except for the aforementioned matters.

Examples III-1 to III-3

In the aforementioned step (I-1-2), the coating liquid (liquid crystal: 45%) prepared in Production Example 2 was used instead of the coating liquid (liquid crystal: 40%), and the coating thickness of the coating liquid (liquid crystal: 45%) was changed so as to obtain a second optically anisotropic layer having a retardation shown in Table 5 below.

An optically anisotropic layered body and a circularly polarizing plate were produced and evaluated in the same manner as that in Example I-1 except for the aforementioned matters.

Examples III-4 to III-6

In the aforementioned step (I-1-1), the coating thickness of the liquid crystal composition was changed so as to obtain a first optically anisotropic layer having a retardation shown in Table 5 below.

Further, in the aforementioned step (I-1-2), the coating liquid (liquid crystal: 45%) prepared in Production Example 2 was used instead of the coating liquid (liquid crystal: 40%), and the coating thickness of the coating liquid (liquid crystal: 45%) was changed so as to obtain a second optically anisotropic layer having a retardation shown in Table 5 below.

An optically anisotropic layered body and a circularly polarizing plate were produced and evaluated in the same manner as that in Example I-1 except for the aforementioned matters.

Examples III-7 to III-13

In the aforementioned step (I-1-2), the coating liquid (liquid crystal: 50%) prepared in Production Example 3 was used instead of the coating liquid (liquid crystal: 40%), and the coating thickness of the coating liquid (liquid crystal: 50%) was changed so as to obtain a second optically anisotropic layer having a retardation shown in Table 6 or Table 7 below.

An optically anisotropic layered body and a circularly polarizing plate were produced and evaluated in the same manner as that in Example I-1 except for the aforementioned matters.

Examples III-14 to III-21

In the aforementioned step (I-1-1), the coating thickness of the liquid crystal composition was changed so as to obtain a first optically anisotropic layer having a retardation shown in Table 7 or Table 8 below.

Further, in the aforementioned step (I-1-2), the coating liquid (liquid crystal: 50%) prepared in Production Example 3 was used instead of the coating liquid (liquid crystal: 40%), and the coating thickness of the coating liquid (liquid crystal: 50%) was changed so as to obtain a second optically anisotropic layer having a retardation shown in Table 7 or Table 8 below.

An optically anisotropic layered body and a circularly polarizing plate were produced and evaluated in the same manner as that in Example I-1 except for the aforementioned matters.

Comparative Example 1

68 parts of a polymerizable liquid crystal compound ("LC242" manufactured by BASF, the compound represented by the following formula (LC1)), 29 parts of a compound represented by the following formula (C1), 3 parts of a photopolymerization initiator ("Irgacure 184" manufactured by BASF), and 400 parts of methyl ethyl ketone were mixed to prepare a coating liquid (LC1) as a liquid crystal composition.

As a substrate film, an unstretched film formed of a resin containing an alicyclic structure-containing polymer (manufactured by ZEON Corporation, glass transition temperature (Tg) of resin: 163° C., thickness: 100 μm) was prepared. The substrate film was subjected to a corona treatment (output power: 0.2 kW, electrode width: 1,600 mm, treatment speed: 20 m/min). The coating liquid (LC1) was applied onto a surface of the substrate film, which had been subjected to the corona treatment, using a bar coater, to form a coating liquid layer.

The coating liquid layer was heated in an oven at 110° C. for 2.5 minutes to thereby effect a drying treatment and an orientation treatment. As a result, a layer of the liquid crystal composition was obtained. The layer of the liquid crystal composition was then irradiated with ultraviolet light having an integrated illuminance of 100 mJ/cm$^2$ or more (irradiation intensity: 10 mW/cm$^2$, irradiation time: 10 seconds) in a nitrogen atmosphere to polymerize the polymerizable liquid crystal compound in the liquid crystal composition. As a result, an optically anisotropic transfer body having the substrate film and a second optically anisotropic layer having a thickness of 0.5 μm was obtained. The retardation of the second optically anisotropic layer was measured by the method described above. An optically anisotropic layered body and a circularly polarizing plate were produced and evaluated in the same manner as that of Example I except that the optically anisotropic transfer body thus obtained was used in the aforementioned step (I-1-3).

[Results]

The results of Examples and Comparative Examples described above are shown in the following tables.

TABLE 1

| [Results of Examples I-1~I-6] | | | | | | |
|---|---|---|---|---|---|---|
| | Example No. | | | | | |
| | I-1 | I-2 | I-3 | I-4 | I-5 | I-6 |
| First optically anisotropic layer | | | | | | |
| Re1(550) [nm] | 141.7 | 141.7 | 141.7 | 146.6 | 146.6 | 146.6 |
| Rth1(550) [nm] | 70.9 | 70.9 | 70.9 | 73.3 | 73.3 | 73.3 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |

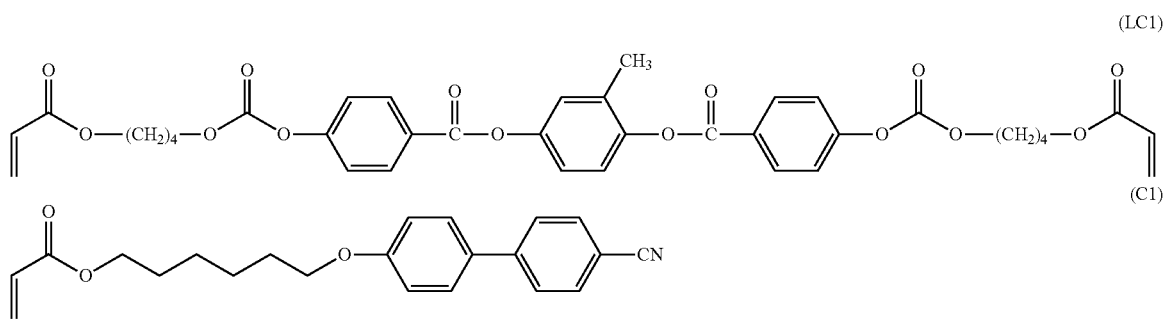

TABLE 1-continued

[Results of Examples I-1~I-6]

| | Example No. | | | | | |
|---|---|---|---|---|---|---|
| | I-1 | I-2 | I-3 | I-4 | I-5 | I-6 |
| Second optically anisotropic layer | | | | | | |
| Coating liquid | Liquid crystal 40% | Liquid crystal 40% | Liquid crystal 40% | Liquid crystal 40% | Liquid crystal 40% | Liquid crystal 40% |
| Re2(550) [nm] | 0 | 0 | 0 | 0 | 0 | 0 |
| Rth2(550) [nm] | −60.1 | −65.1 | −70.1 | −65.1 | −70.1 | −75.1 |
| Rth2(450)/Rt2h(550) | 0.95 | 0.95 | 0.95 | 0.95 | 0.95 | 0.95 |
| Rth2(650)/Rth2(550) | 1.01 | 1.01 | 1.01 | 1.01 | 1.01 | 1.01 |
| Optically anisotropic layered body | | | | | | |
| Re0(450) [nm] | 113.5 | 113.5 | 113.5 | 117.4 | 117.4 | 117.4 |
| Rth0(450) [nm] | 0.1 | −4.6 | −9.4 | −2.7 | −7.4 | −12.1 |
| Nz(450) | 0.50 | 0.46 | 0.42 | 0.48 | 0.44 | 0.40 |
| Re0(550) [nm] | 141.7 | 141.7 | 141.7 | 146.6 | 146.6 | 146.6 |
| Rth0(550) [nm] | 10.8 | 5.8 | 0.8 | 8.2 | 3.2 | −1.8 |
| Nz(550) | 0.58 | 0.54 | 0.51 | 0.56 | 0.52 | 0.49 |
| Re0(650) [nm] | 147.6 | 147.6 | 147.6 | 152.7 | 152.7 | 152.7 |
| Rth0(650) [nm] | 14.0 | 9.1 | 4.1 | 11.6 | 6.6 | 1.6 |
| Nz(650) | 0.60 | 0.56 | 0.53 | 0.58 | 0.54 | 0.51 |
| Nz(450)/Nz(650) | 0.841 | 0.818 | 0.791 | 0.828 | 0.804 | 0.777 |
| ΔE*ab | 13.13 | 13.32 | 13.80 | 12.80 | 13.13 | 13.81 |
| Visual observation | B | C | C | B | B | C |

TABLE 2

[Results of Examples II-1~II-6]

| | Example No. | | | | | |
|---|---|---|---|---|---|---|
| | II-1 | II-2 | II-3 | II-4 | II-5 | II-6 |
| First optically anisotropic layer | | | | | | |
| Re1(550) [nm] | 141.7 | 141.7 | 141.7 | 146.6 | 146.6 | 146.6 |
| Rth1(550) [nm] | 70.9 | 70.9 | 70.9 | 73.3 | 73.3 | 73.3 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |
| Second optically anisotropic layer | | | | | | |
| Coating liquid | Liquid crystal 40% | Liquid crystal 40% | Liquid crystal 40% | Liquid crystal 40% | Liquid crystal 40% | Liquid crystal 40% |
| Re2(550) [nm] | 0 | 0 | 0 | 0 | 0 | 0 |
| Rth2(550) [nm] | −45.1 | −50.1 | −55.1 | −50.1 | −55.1 | −60.1 |
| Rth2(450)/Rt2h(550) | 0.95 | 0.95 | 0.95 | 0.95 | 0.95 | 0.95 |
| Rth2(650)/Rth2(550) | 1.01 | 1.01 | 1.01 | 1.01 | 1.01 | 1.01 |
| Optically anisotropic layered body | | | | | | |
| Re0(450) [nm] | 113.5 | 113.5 | 113.5 | 117.4 | 117.4 | 117.4 |
| Rth0(450) [nm] | 14.3 | 9.5 | 4.8 | 11.5 | 6.8 | 2.0 |
| Nz(450) | 0.63 | 0.58 | 0.54 | 0.60 | 0.56 | 0.52 |
| Re0(550) [nm] | 141.7 | 141.7 | 141.7 | 146.6 | 146.6 | 146.6 |
| Rth0(550) [nm] | 25.8 | 20.8 | 15.8 | 23.3 | 18.2 | 13.2 |
| Nz(550) | 0.68 | 0.65 | 0.61 | 0.66 | 0.62 | 0.59 |
| Re0(650) [nm] | 147.6 | 147.6 | 147.6 | 152.7 | 152.7 | 152.7 |
| Rth0(650) [nm] | 29.0 | 24.0 | 19.0 | 26.5 | 21.6 | 16.6 |
| Nz(650) | 0.70 | 0.66 | 0.63 | 0.67 | 0.64 | 0.61 |
| Nz(450)/Nz(650) | 0.898 | 0.881 | 0.862 | 0.887 | 0.870 | 0.850 |
| ΔE*ab | 14.22 | 13.62 | 13.23 | 13.71 | 13.15 | 12.83 |
| Visual observation | D | C | B | C | B | B |

TABLE 3

[Results of Examples II-7~II-12]

| | Example No. | | | | | |
|---|---|---|---|---|---|---|
| | II-7 | II-8 | II-9 | II-10 | II-11 | II-12 |
| First optically anisotropic layer | | | | | | |
| Re1(550) [nm] | 141.7 | 141.7 | 141.7 | 141.7 | 141.7 | 146.6 |
| Rth1(550) [nm] | 70.9 | 70.9 | 70.9 | 70.9 | 70.9 | 73.3 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |
| Second optically anisotropic layer | | | | | | |
| Coating liquid | Liquid crystal 45% | Liquid crystal 45% | Liquid crystal 45% | Liquid crystal 45% | Liquid crystal 45% | Liquid crystal 45% |
| Re2(550) [nm] | 0 | 0 | 0 | 0 | 0 | 0 |
| Rth2(550 [nm] | −59.3 | −64.3 | −69.2 | −74.2 | −79.1 | −64.3 |
| Rth2(450)/Rt2h(550) | 0.88 | 0.88 | 0.88 | 0.88 | 0.88 | 0.88 |
| Rth2(650)/Rth2(550) | 1.02 | 1.02 | 1.02 | 1.02 | 1.02 | 1.02 |
| Optically anisotropic layered body | | | | | | |
| Re0(450) [nm] | 113.5 | 113.5 | 113.5 | 113.5 | 113.5 | 117.4 |
| Rth0(450) [nm] | 4.4 | 0.0 | −4.3 | −8.7 | −13.0 | 2.0 |
| Nz(450) | 0.54 | 0.50 | 0.46 | 0.42 | 0.39 | 0.52 |
| Re0(550) [nm] | 141.7 | 141.7 | 141.7 | 141.7 | 141.7 | 146.6 |
| Rth0(550) [nm] | 11.5 | 6.6 | 1.6 | −3.3 | −8.3 | 9.0 |
| Nz(550) | 0.58 | 0.55 | 0.51 | 0.48 | 0.44 | 0.56 |
| Re0(650) [nm] | 147.6 | 147.6 | 147.6 | 147.6 | 147.6 | 152.7 |
| Rth0(650) [nm] | 13.2 | 8.1 | 3.1 | −2.0 | −7.0 | 10.7 |
| Nz(650) | 0.59 | 0.56 | 0.52 | 0.49 | 0.45 | 0.57 |

TABLE 3-continued

[Results of Examples II-7~II-12]

| | Example No. | | | | | |
|---|---|---|---|---|---|---|
| | II-7 | II-8 | II-9 | II-10 | II-11 | II-12 |
| Nz(450)/Nz(650) | 0.914 | 0.901 | 0.887 | 0.870 | 0.851 | 0.907 |
| ΔE*ab | 12.80 | 12.77 | 13.03 | 13.55 | 14.32 | 12.58 |
| Visual observation | B | B | B | C | D | A |

TABLE 4

[Results of Examples II-13~II-15]

| | Example No. | | |
|---|---|---|---|
| | II-13 | II-14 | II-15 |
| First optically anisotropic layer | | | |
| Re1(550) [nm] | 146.6 | 146.6 | 146.6 |
| Rth1(550) [nm] | 73.3 | 73.3 | 73.3 |
| Re1(450)/Re1(550) | 0.80 | 0.80 | 0.80 |
| Re1(650)/Re1(550) | 1.04 | 1.04 | 1.04 |
| Second optically anisotropic layer | | | |
| Coating liquid | Liquid crystal 45% | Liquid crystal 45% | Liquid crystal 45% |
| Re2(550) [nm] | 0 | 0 | 0 |
| Rth2(550) [nm] | −69.2 | −74.2 | −79.1 |
| Rth2(450)/Rt2h(550) | 0.88 | 0.88 | 0.88 |
| Rth2(650)/Rth2(550) | 1.02 | 1.02 | 1.02 |
| Optically anisotropic layered body | | | |
| Re0(450) [nm] | 117.4 | 117.4 | 117.4 |
| Rth0(450) [nm] | −2.4 | −6.7 | −11.1 |
| Nz(450) | 0.48 | 0.44 | 0.41 |
| Re0(550) [nm] | 146.6 | 146.6 | 146.6 |
| Rth0(550) [nm] | 4.1 | −0.9 | −5.8 |
| Nz(550) | 0.53 | 0.49 | 0.46 |
| Re0(650) [nm] | 152.7 | 152.7 | 152.7 |
| Rth0(650) [nm] | 5.6 | 0.6 | −4.5 |
| Nz(650) | 0.54 | 0.50 | 0.47 |
| Nz(450)/Nz(650) | 0.894 | 0.879 | 0.862 |
| ΔE*ab | 12.67 | 13.09 | 13.84 |
| Visual observation | A | B | C |

TABLE 5

[Results of Examples III-1~III-6]

| | Example No. | | | | | |
|---|---|---|---|---|---|---|
| | III-1 | III-2 | III-3 | III-4 | III-5 | III-6 |
| First optically anisotropic layer | | | | | | |
| Re1(550) [nm] | 141.7 | 141.7 | 141.7 | 146.6 | 146.6 | 146.6 |
| Rth1(550) [nm] | 70.9 | 70.9 | 70.9 | 73.3 | 73.3 | 73.3 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |
| Second optically anisotropic layer | | | | | | |
| Coating liquid | Liquid crystal 45% | Liquid crystal 45% | Liquid crystal 45% | Liquid crystal 45% | Liquid crystal 45% | Liquid crystal 45% |
| Re2(550) [nm] | 0 | 0 | 0 | 0 | 0 | 0 |
| Rth2(550 [nm] | −44.5 | −49.5 | −54.4 | −49.5 | −54.4 | −59.3 |
| Rth2(450)/Rt2h(550) | 0.88 | 0.88 | 0.88 | 0.88 | 0.88 | 0.88 |
| Rth2(650)/Rth2(550) | 1.02 | 1.02 | 1.02 | 1.02 | 1.02 | 1.02 |
| Optically anisotropic layered body | | | | | | |
| Re0(450) [nm] | 113.5 | 113.5 | 113.5 | 117.4 | 117.4 | 117.4 |
| Rth0(450) [nm] | 17.5 | 13.1 | 8.8 | 15.1 | 10.7 | 6.4 |
| Nz(450) | 0.65 | 0.62 | 0.58 | 0.63 | 0.59 | 0.55 |
| Re0(550) [nm] | 141.7 | 141.7 | 141.7 | 146.6 | 146.6 | 146.6 |
| Rth0(550) [nm] | 26.4 | 21.4 | 16.5 | 23.9 | 18.9 | 14.0 |
| Nz(550) | 0.69 | 0.65 | 0.62 | 0.66 | 0.63 | 0.60 |
| Re0(650) [nm] | 147.6 | 147.6 | 147.6 | 152.7 | 152.7 | 152.7 |
| Rth0(650) [nm] | 28.3 | 23.3 | 18.2 | 25.8 | 20.8 | 15.7 |
| Nz(650) | 0.69 | 0.66 | 0.62 | 0.67 | 0.64 | 0.60 |
| Nz(450)/Nz(650) | 0.945 | 0.936 | 0.926 | 0.939 | 0.930 | 0.919 |
| ΔE*ab | 14.34 | 13.63 | 13.10 | 13.87 | 13.22 | 12.77 |
| Visual observation | D | C | B | D | B | B |

TABLE 6

[Results of Examples III-7~III-12]

| | Example No. | | | | | |
|---|---|---|---|---|---|---|
| | III-7 | III-8 | III-9 | III-10 | III-11 | III-12 |
| First optically anisotropic layer | | | | | | |
| Re1(550) [nm] | 141.7 | 141.7 | 141.7 | 141.7 | 141.7 | 141.7 |
| Rth1(550) [nm] | 70.9 | 70.9 | 70.9 | 70.9 | 70.9 | 70.9 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |
| Second optically anisotropic layer | | | | | | |
| Coating liquid | Liquid crystal 50% | Liquid crystal 50% | Liquid crystal 50% | Liquid crystal 50% | Liquid crystal 50% | Liquid crystal 50% |
| Re2(550) [nm] | 0 | 0 | 0 | 0 | 0 | 0 |
| Rth2(550) [nm] | −49.2 | −54.1 | −59.1 | −64 | −68.9 | −73.8 |
| Rth2(450)/Rt2h(550) | 0.84 | 0.84 | 0.84 | 0.84 | 0.84 | 0.84 |
| Rth2(650)/Rth2(550) | 1.03 | 1.03 | 1.03 | 1.03 | 1.03 | 1.03 |

TABLE 6-continued

[Results of Examples III-7~III-12]

| | Example No. | | | | | |
|---|---|---|---|---|---|---|
| | III-7 | III-8 | III-9 | III-10 | III-11 | III-12 |
| Optically anisotropic layered body | | | | | | |
| Re0(450) [nm] | 113.5 | 113.5 | 113.5 | 113.5 | 113.5 | 113.5 |
| Rth0(450) [nm] | 15.3 | 11.1 | 7.0 | 2.8 | −1.3 | −5.5 |
| Nz(450) | 0.63 | 0.60 | 0.56 | 0.52 | 0.49 | 0.45 |
| Re0(550) [nm] | 141.7 | 141.7 | 141.7 | 141.7 | 141.7 | 141.7 |
| Rth0(550) [nm] | 21.7 | 16.7 | 11.8 | 6.9 | 2.0 | −3.0 |
| Nz(550) | 0.65 | 0.62 | 0.58 | 0.55 | 0.51 | 0.48 |
| Re0(650) [nm] | 147.6 | 147.6 | 147.6 | 147.6 | 147.6 | 147.6 |
| Rth0(650) [nm] | 23.0 | 18.0 | 12.9 | 7.8 | 2.7 | −2.3 |
| Nz(650) | 0.66 | 0.62 | 0.59 | 0.55 | 0.52 | 0.48 |
| Nz(450)/Nz(650) | 0.967 | 0.962 | 0.956 | 0.949 | 0.942 | 0.933 |
| ΔE*ab | 13.71 | 13.12 | 12.73 | 12.61 | 12.76 | 13.18 |
| Visual observation | C | B | A | A | B | B |

TABLE 7

[Results of Examples III-13~III-18]

| | Example No. | | | | | |
|---|---|---|---|---|---|---|
| | III-13 | III-14 | III-15 | III-16 | III-17 | III-18 |
| First optically anisotropic layer | | | | | | |
| Re1(550) [nm] | 141.7 | 146.6 | 146.6 | 146.6 | 146.6 | 146.6 |
| Rth1(550) [nm] | 70.9 | 73.3 | 73.3 | 73.3 | 73.3 | 73.3 |
| Re1(450)/Re1(550) | 0.80 | 0.80 | 0.80 | 0.80 | 0.80 | 0.80 |
| Re1(650)/Re1(550) | 1.04 | 1.04 | 1.04 | 1.04 | 1.04 | 1.04 |
| Second optically anisotropic layer | | | | | | |
| Coating liquid | Liquid crystal 50% | Liquid crystal 50% | Liquid crystal 50% | Liquid crystal 50% | Liquid crystal 50% | Liquid crystal 50% |
| Re2(550) [nm] | 0 | 0 | 0 | 0 | 0 | 0 |
| Rth2(550) [nm] | −78.7 | −49.2 | −54.1 | −59.1 | −64 | −68.9 |
| Rth2(450)/Rt2h(550) | 0.84 | 0.84 | 0.84 | 0.84 | 0.84 | 0.84 |
| Rth2(650)/Rth2(550) | 1.03 | 1.03 | 1.03 | 1.03 | 1.03 | 1.03 |
| Optically anisotropic layered body | | | | | | |
| Re0(450) [nm] | 113.5 | 117.4 | 117.4 | 117.4 | 117.4 | 117.4 |
| Rth0(450) [nm] | −9.6 | 17.2 | 13.1 | 8.9 | 4.8 | 0.6 |
| Nz(450) | 0.42 | 0.65 | 0.61 | 0.58 | 0.54 | 0.51 |
| Re0(550) [nm] | 141.7 | 146.6 | 146.6 | 146.6 | 146.6 | 146.6 |
| Rth0(550) [nm] | −7.9 | 24.1 | 19.2 | 14.3 | 9.3 | 4.4 |
| Nz(550) | 0.44 | 0.66 | 0.63 | 0.60 | 0.56 | 0.53 |
| Re0(650) [nm] | 147.6 | 152.7 | 152.7 | 152.7 | 152.7 | 152.7 |
| Rth0(650) [nm] | −7.4 | 25.6 | 20.5 | 15.4 | 10.4 | 5.3 |
| Nz(650) | 0.45 | 0.67 | 0.63 | 0.60 | 0.57 | 0.53 |
| Nz(450)/Nz(650) | 0.923 | 0.969 | 0.964 | 0.958 | 0.952 | 0.946 |
| ΔE*ab | 13.83 | 13.98 | 13.29 | 12.80 | 12.53 | 12.53 |
| Visual observation | C | D | B | B | A | A |

TABLE 8

[Results of Examples III-19~III-21]

| | Example No. | | |
|---|---|---|---|
| | III-19 | III-20 | III-21 |
| First optically anisotropic layer | | | |
| Re1(550) [nm] | 146.6 | 146.6 | 146.6 |
| Rth1(550) [nm] | 73.3 | 73.3 | 73.3 |
| Re1(450)/Re1(550) | 0.80 | 0.80 | 0.80 |
| Re1(650)/Re1(550) | 1.04 | 1.04 | 1.04 |
| Second optically anisotropic layer | | | |
| Coating liquid | Liquid crystal 50% | Liquid crystal 50% | Liquid crystal 50% |
| Re2(550) [nm] | 0 | 0 | 0 |
| Rth2(550) [nm] | −73.8 | −78.7 | −83.7 |
| Rth2(450)/Rt2h(550) | 0.84 | 0.84 | 0.84 |
| Rth2(650)/Rth2(550) | 1.03 | 1.03 | 1.03 |
| Optically anisotropic layered body | | | |
| Re0(450) [nm] | 117.4 | 117.4 | 117.4 |
| Rth0(450) [nm] | −3.5 | −7.7 | −11.8 |
| Nz(450) | 0.47 | 0.43 | 0.40 |
| Re0(550) [nm] | 146.6 | 146.6 | 146.6 |
| Rth0(550) [nm] | −0.5 | −5.4 | −10.4 |
| Nz(550) | 0.50 | 0.46 | 0.43 |
| Re0(650) [nm] | 152.7 | 152.7 | 152.7 |
| Rth0(650) [nm] | 0.2 | −4.9 | −9.9 |
| Nz(650) | 0.50 | 0.47 | 0.43 |
| Nz(450)/Nz(650) | 0.938 | 0.929 | 0.919 |
| ΔE*ab | 12.84 | 13.47 | 14.39 |
| Visual observation | B | C | D |

TABLE 9

[Results of Comparative Example 1]

| | Comp. Ex. 1 |
|---|---|
| First optically anisotropic layer | |
| Re1(550) [nm] | 141.7 |
| Rth1(550) [nm] | 70.9 |
| Re1(450)/Re1(550) | 0.80 |
| Re1(650)/Re1(550) | 1.04 |
| Second optically anisotropic layer | |
| Coating liquid | LC242 |
| Re2(550) [nm] | 0 |
| Rth2(550) [nm] | −56.1 |
| Rth2(450)/Rt2h(550) | 1.08 |
| Rth2(650)/Rth2(550) | 0.96 |
| Optically anisotropic layered body | |
| Re0(450) [nm] | 113.5 |
| Rth0(450) [nm] | −4.0 |
| Nz(450) | 0.46 |

TABLE 9-continued

[Results of Comparative Example 1]

| | Comp. Ex. 1 |
|---|---|
| Re0(550) [nm] | 141.7 |
| Rth0(550) [nm] | 14.8 |
| Nz(550) | 0.60 |
| Re0(650) [nm] | 147.6 |
| Rth0(650) [nm] | 20.0 |
| Nz(650) | 0.64 |
| Nz(450)/Nz(650) | 0.73 |
| ΔE*ab | 14.44 |
| Visual observation | E |

Reference Example 1: Confirmation of Wavelength Distribution of Liquid Crystal Compound with Reverse Wavelength Distribution Represented by Formula (B1)

100 parts by weight of a photopolymerizable liquid crystal compound with reverse wavelength distribution represented by the aforementioned formula (B1), 3 parts by weight of a photopolymerization initiator ("Irgacure 379EG" manufactured by BASF), and 0.3 part by weight of a surfactant ("MEGAFACE F-562" manufactured by DIC Corporation) were mixed. To the mixture, a mixed solvent of cyclopentanone and 1,3-dioxolane (weight ratio of cyclopentanone:1,3-dioxolane=4:6) was added as a dilution solvent so that the solid content was 22% by weight. The mixture was dissolved in the solvent under warming to 50° C. The resulting mixture was subjected to filtration through a membrane filter with a pore diameter of 0.45 μm to obtain a liquid crystal composition.

An unstretched film formed of a resin containing an alicyclic structure-containing polymer ("ZEONOR film" manufactured by ZEON Corporation) was prepared. The unstretched film was subjected to a rubbing treatment to thereby prepare an orientation substrate.

The liquid crystal composition was applied onto the orientation substrate by a bar coater to form a layer of the liquid crystal composition. The thickness of the liquid crystal composition layer was adjusted so that the thickness of the optically anisotropic layer after cured becomes about 2.3 μm.

The layer of the liquid crystal composition was then dried in an oven at 110° C. for about 4 minutes to evaporate the solvent in the liquid crystal composition, and to simultaneously bring about homogeneous orientation of the liquid crystal compound with reverse wavelength distribution contained in the liquid crystal composition.

Subsequently, the layer of the liquid crystal composition was irradiated with ultraviolet light using an ultraviolet irradiation device. This irradiation with ultraviolet light was performed in a nitrogen atmosphere in a state where the orientation substrate was fixed by a tape on a SUS plate. The layer of the liquid crystal composition was cured by the irradiation with ultraviolet light, to obtain a sample film including an optically anisotropic layer and the orientation substrate.

With regard to this sample film, the wavelength distribution of the in-plane retardation was measured with a phase difference meter (manufactured by Axometrics, Inc.). Since the orientation substrate does not have an in-plane retardation, the in-plane retardation obtained by the aforementioned measurement shows the in-plane retardation of the optically anisotropic layer. As a result of the measurement, the in-plane retardations Re(450), Re(550), and Re(650) at wavelengths of 450 nm, 550 nm and 650 nm satisfied Re(450)<Re(550)<Re(650). Therefore, it was confirmed that when the photopolymerizable liquid crystal compound with reverse wavelength distribution represented by the aforementioned formula (B1) is homogeneously oriented, it shows an in-plane retardation with reverse wavelength distribution.

Reference Example 2: Confirmation that Poly(9-vinylcarbazole) is a Positive C Polymer Poly(9-vinylcarbazole) was added to N-methylpyrrolidone so as to have a solid content concentration of 12% by weight, and dissolved at room temperature to obtain a polymer solution.

An unstretched film formed of a resin containing an alicyclic structure-containing polymer ("ZEONOR film" manufactured by ZEON Corporation) was prepared. The aforementioned polymer solution was applied on the unstretched film using an applicator to form a layer of the polymer solution. The layer was then dried in an oven at 85° C. for about 10 minutes to evaporate the solvent, to obtain a sample film including a polymer film having a thickness of about 10 μm and the unstretched film.

The sample film was set on a stage of a phase difference meter (manufactured by Axometrics, Inc.), and the in-plane retardation Re of the sample film was measured at a measurement wavelength of 550 nm. Since the support film is an optically isotropic film, the measured in-plane retardation Re represents the in-plane retardation Re of the polymer film. As a result of the measurement, since the in-plane retardation Re was Re≤1 nm, it was confirmed that nx(P)≥ny(P) was satisfied.

After that, the retardation Re40 in a tilt direction forming an angle of 40° with respect to the thickness direction of the sample film was measured by tilting the stage by 40° with the slow axis of the polymer film as the rotation axis of the stage. Then, by this measurement, the slow axis direction of the polymer film was measured. If the "slow axis direction" is perpendicular to the "rotation axis of the stage", it can be determined that nz(P)>nx(P). Conversely, if the "slow axis direction" is parallel to "the rotation axis of the stage", it can be determined that ny(P)>nz(P). As a result of the measurement, since the slow axis direction was perpendicular to the rotation axis of the stage, it can be determined that refractive indices nx(P) and nz(P) of the polymer film satisfy nz(P)>nx(P).

Therefore, when a polymer film is formed by a coating method using a solution of poly(9-vinylcarbazole), the refractive indices of the polymer film of this poly(9-vinylcarbazole) were confirmed to satisfy nz(P)>nx(P)≥ny(P). Therefore, it was confirmed that poly(9-vinylcarbazole) corresponds to a positive C polymer.

REFERENCE SIGN LIST 100 optically anisotropic layered body
110 first optically anisotropic layer
120 second optically anisotropic layer
200 polarizing plate
210 linear polarizer
300 image display device
310 organic EL element

The invention claimed is:

1. An optically anisotropic layered body comprising a first optically anisotropic layer and a second optically anisotropic layer, wherein
a refractive index nx2 in a direction which gives a maximum refractive index among in-plane directions of the second optically anisotropic layer, a refractive index ny2 in a direction, among the in-plane directions of the second optically anisotropic layer, perpendicular to the direction giving the nx2, and a thickness direction refractive index nz2 of the second optically anisotropic layer satisfy the formula (13),
an in-plane retardation Re1(450) of the first optically anisotropic layer at a wavelength of 450 nm, an in-plane retardation Re1(550) of the first optically anisotropic layer at a wavelength of 550 nm, and an in-plane retardation Re1 (650) of the first optically anisotropic layer at a wavelength of 650 nm satisfy the formula (14),
a thickness direction retardation Rth2(450) of the second optically anisotropic layer at the wavelength of 450 nm, a thickness direction retardation Rth2(550) of the second optically anisotropic layer at the wavelength of 550 nm, and a thickness direction retardation Rth2(650) of the second optically anisotropic layer at the wavelength of 650 nm satisfy the formula (15),
an in-plane retardation Re0(550) of the optically anisotropic layered body at the wavelength of 550 nm satisfies the formula (16),
a ratio Nz(450)/Nz(650) of an NZ factor Nz(450) of the optically anisotropic layered body at the wavelength of 450 nm relative to an NZ factor Nz(650) of the optically anisotropic layered body at the wavelength of 650 nm satisfies the formula (21), and
a thickness direction retardation Rth0(550) of the optically anisotropic layered body at the wavelength of 550 nm satisfies the formula (22):

$nz2>nx2 \geq ny2$      Formula (13), $Re1(450)<Re1(550)<Re1(650)$      Formula (14), $Rth2(450)<Rth2(550)<Rth2(650)$      Formula (15), $137 \text{ nm}<Re0(550)<152 \text{ nm}$      Formula (16), $0.94<Nz(450)/Nz(650)\leq0.96$      Formula (21), and $4 \text{ nm}<Rth0(550)<12 \text{ nm}$      Formula (22).

2. The optically anisotropic layered body according to claim 1, wherein
the second optically anisotropic layer includes a polymer and a compound having a mesogen skeleton that may have a fixed orientation state,
when a film of the polymer is formed by a coating method using a solution of the polymer, a refractive index nx(P) in a direction which gives a maximum refractive index among in-plane directions of the film, a refractive index ny(P) in a direction, among the in-plane directions of the film, perpendicular to the direction giving the nx(P), and a thickness direction refractive index nz(P) of the film satisfy nz(P)>nx(P)≥ny(P),
the compound having the mesogen skeleton is a compound of at least one type selected from the group consisting of a first compound that exhibits liquid crystal properties, and exhibits an in-plane retardation with reverse wavelength distribution when the compound is homogeneously oriented; and a second compound that does not solely exhibit liquid crystal properties,
a mixture exhibits liquid crystal properties, and the second compound exhibits an in-plane retardation with reverse wavelength distribution when the mixture is homogeneously oriented, the mixture being obtained by mixing, in an evaluator liquid crystal compound that exhibits an in-plane retardation with forward wavelength distribution when it is homogeneously oriented, the second compound at at least one of ratios in a range of 30 parts by weight to 70 parts by weight relative to 100 parts by weight of the total of the evaluator liquid crystal compound and the second compound, and
the thickness direction retardation Rth2(450) of the second optically anisotropic layer at the wavelength of 450 nm, the thickness direction retardation Rth2(550) of the second optically anisotropic layer at the wavelength of 550 nm, and the thickness direction retardation Rth2 (650) of the second optically anisotropic layer at the wavelength of 650 nm satisfy the formulas (23) and (24):

$0.50<Rth2(450)/Rth2(550)<1.00$      Formula (23), and $1.00\leq Rth2(650)/Rth2(550)<1.25$      Formula (24).

3. The optically anisotropic layered body according to claim 2, wherein
the compound having the mesogen skeleton contains a main chain mesogen skeleton and a side chain mesogen skeleton bonded to the main chain mesogen skeleton in a molecule of the compound having the mesogen skeleton.

4. The optically anisotropic layered body according to claim 2, wherein
the compound having the mesogen skeleton is represented by the following formula (I):

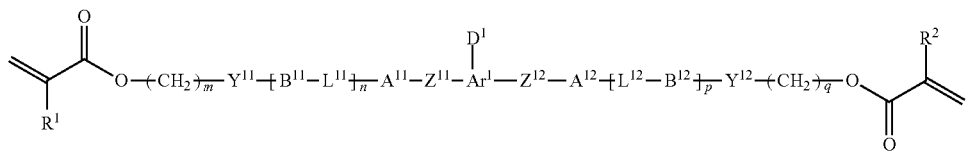

(I)

[In the formula (I),
Ar$^1$ represents a divalent aromatic hydrocarbon ring group having D$^1$ as a substituent, or a divalent aromatic heterocyclic ring group having D$^1$ as a substituent,
D$^1$ represents an organic group of 1 to 20 carbon atoms having at least one aromatic ring selected from the group consisting of an aromatic hydrocarbon ring and an aromatic heterocyclic ring, $Z^{11}$ and $Z^{12}$ each independently represent —CO—O—, —O—CO—, —NR$^{31}$—CO—, or —CO—NR$^{32}$—, $R^{31}$ and $R^{32}$ each independently represent a hydrogen atom or an alkyl group of 1 to 6 carbon atoms, $A^{11}$, $A^{12}$, $B^{11}$, and $B^{12}$ each independently represent a cyclic aliphatic group optionally having a substituent, or an aromatic group optionally having a substituent, $Y^{11}$, $Y^{12}$, $L^{11}$, and $L^{12}$ each independently represent a single bond, —O—, —CO—, —CO—O—, —O—CO—, —NR$^{21}$—CO—, —CO—NR$^{22}$—, —O—CO—O—, —NR$^{23}$—CO—O—, —O—CO—NR$^{24}$—, or —NR$^{25}$—CO—NR$^{26}$—, and $R^{21}$ to $R^{26}$ each independently represent a hydrogen atom or an alkyl group of 1 to 6 carbon atoms, $R^1$ and $R^2$ each independently represent a hydrogen atom, a methyl group or a chlorine atom, m and q each independently represent an integer of 1 to 20, and n and p each independently represent 0 or 1].

5. The optically anisotropic layered body according to claim 4, wherein the $Ar^1$-$D^1$ is a group represented by the following formula (II):

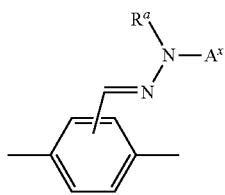

(II)

[In the formula (II), $A^x$ represents an organic group of 2 to 20 carbon atoms having at least one aromatic ring selected from the group consisting of an aromatic hydrocarbon ring and an aromatic heterocyclic ring, and $R^a$ represents a hydrogen atom or an organic group of 1 to 20 carbon atoms optionally having a substituent].

6. The optically anisotropic layered body according to claim 5, wherein the $A^x$ is a group represented by the following formula (III):

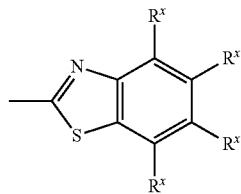

(III)

[In the formula (III), $R^x$ represents a hydrogen atom, a halogen atom, an alkyl group of 1 to 6 carbon atoms, a cyano group, a nitro group, a fluoroalkyl group of 1 to 6 carbon atoms, an alkoxy group of 1 to 6 carbon atoms, or —C(=O)—O—$R^b$, and $R^b$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms optionally having a substituent, a plurality of $R^x$'s may all be the same as or different from each other, and at least one C—$R^x$ constituting the ring may be replaced with a nitrogen atom].

7. The optically anisotropic layered body according to claim 5, wherein the $R^a$ is an alkyl group of 1 to 20 carbon atoms optionally having a substituent, an alkenyl group of 2 to 20 carbon atoms optionally having a substituent, an alkynyl group of 2 to 20 carbon atoms optionally having a substituent, or an aromatic group of 6 to 18 carbon atoms optionally having a substituent.

8. The optically anisotropic layered body according to claim 2, wherein the polymer is at least one polymer selected from the group consisting of polyvinyl carbazole and esters of polyfumaric acid.

9. The optically anisotropic layered body according to claim 2, wherein a ratio of the compound having the mesogen skeleton in a total solid content of the second optically anisotropic layer is 20% by weight to 60% by weight.

10. A polarizing plate comprising a linear polarizer, and the optically anisotropic layered body according to claim 1.

11. An image display device comprising the polarizing plate according to claim 10, and an organic electroluminescent element, wherein the image display device includes the linear polarizer, the optically anisotropic layered body, and the organic electroluminescent element in this order.

\* \* \* \* \*